(12) United States Patent
Okazaki et al.

(10) Patent No.: US 9,281,410 B2
(45) Date of Patent: Mar. 8, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Kenichi Okazaki, Tochigi (JP); Seiji Yasumoto, Tochigi (JP); Shun Mashiro, Tochigi (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/794,085

(22) Filed: Mar. 11, 2013

(65) Prior Publication Data
US 2013/0244374 A1    Sep. 19, 2013

(30) Foreign Application Priority Data

Mar. 14, 2012 (JP) ................................ 2012-057969
Mar. 14, 2012 (JP) ................................ 2012-057970

(51) Int. Cl.
*H01L 29/786* (2006.01)
*H01L 29/49* (2006.01)
*H01L 21/00* (2006.01)
*H01L 29/66* (2006.01)

(52) U.S. Cl.
CPC ...... *H01L 29/78696* (2013.01); *H01L 29/4908* (2013.01); *H01L 29/7869* (2013.01); *H01L 29/66969* (2013.01)

(58) Field of Classification Search
None
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 5,771,110 A * | 6/1998 | Hirano et al. ................ 257/72 |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Evren Seven
(74) *Attorney, Agent, or Firm* — Fish & Richardson P.C.

(57) ABSTRACT

A method for manufacturing a semiconductor device including an oxide semiconductor includes the steps of forming an oxide semiconductor film, forming a gate insulating film provided over the oxide semiconductor film, forming a gate electrode in contact with the gate insulating film, a sidewall insulating film in contact with the gate electrode, and forming a source electrode and a drain electrode in contact with the oxide semiconductor film. In the method, the gate insulating film and the sidewall insulating film are formed at a temperature at which oxygen contained in the oxide semiconductor film is inhibited from being eliminated, preferably at a temperature lower than a temperature at which oxygen contained in the oxide semiconductor film is eliminated.

15 Claims, 31 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,617,648 B1* | 9/2003 | Yamazaki et al. | 257/350 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,821,002 B2 | 10/2010 | Yamazaki et al. | |
| 8,785,266 B2 | 7/2014 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0244020 A1* | 9/2010 | Sakata et al. | 257/43 |
| 2011/0027980 A1 | 2/2011 | Yamazaki et al. | |
| 2011/0111557 A1 | 5/2011 | Ichijo et al. | |
| 2012/0040495 A1* | 2/2012 | Noda | H01L 29/4908 438/104 |
| 2012/0049189 A1* | 3/2012 | Sasaki et al. | 257/52 |
| 2012/0161121 A1 | 6/2012 | Yamazaki | |
| 2012/0161124 A1 | 6/2012 | Yamazaki | |
| 2014/0284599 A1 | 9/2014 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-119719 A | 6/2011 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

(56) References Cited

OTHER PUBLICATIONS

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo

(56) References Cited

OTHER PUBLICATIONS

Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O4—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

\* cited by examiner

FIG. 1A
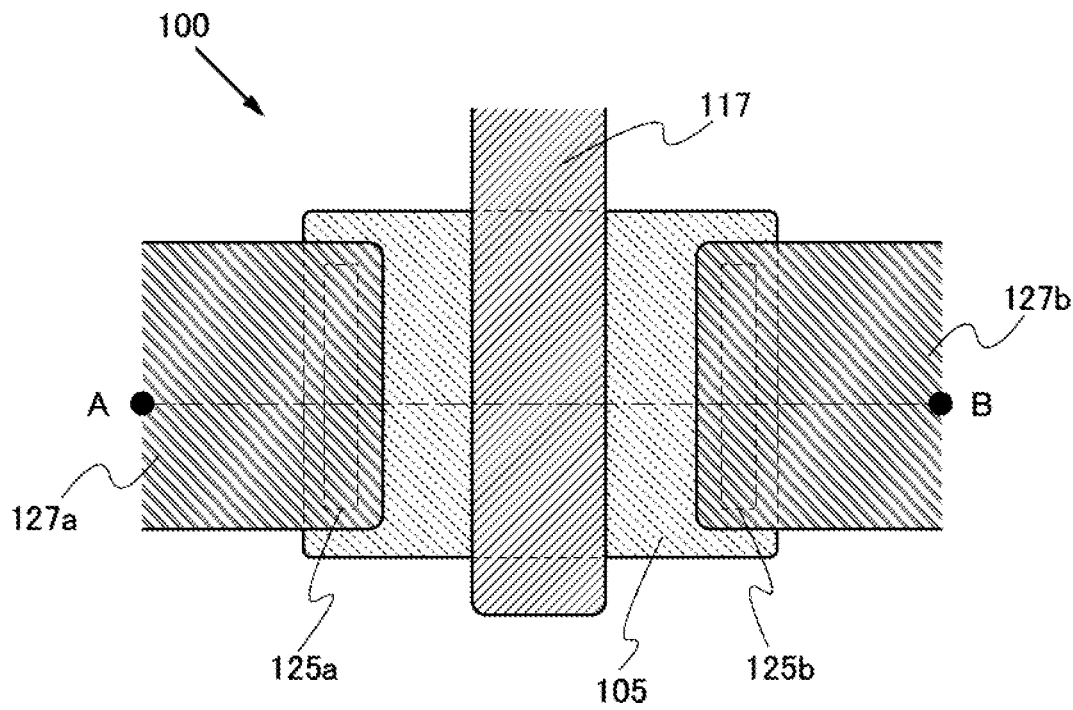
FIG. 1B
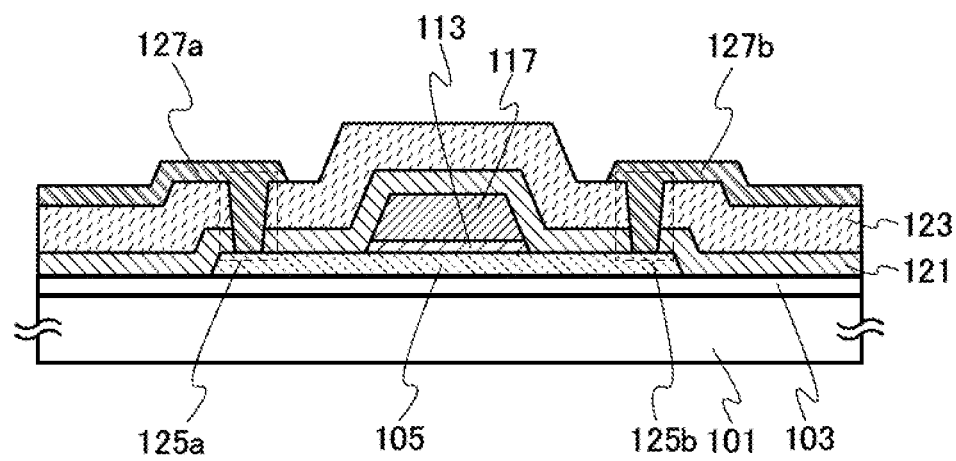
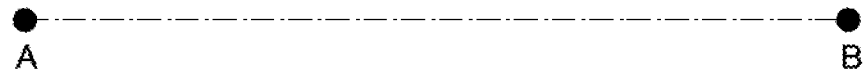

METHOD FOR MANUFACTURING SEMICONDUCTOR DEVICE

BACKGROUND OF THE INVENTION

1. Field of the Invention

The present invention relates to a semiconductor device such as an insulated-gate field-effect transistor.

Note that a semiconductor device in this specification refers to general devices which can function by utilizing semiconductor characteristics; for example, a semiconductor element such as a transistor, a semiconductor circuit including a semiconductor element, an electro-optical device such as a display device, and an electronic device are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

Patent Documents

[Patent Document 1] Japanese Published Patent Application No. 2007-123861
[Patent Document 2] Japanese Published Patent Application No. 2007-096055

SUMMARY OF THE INVENTION

In a transistor including an oxide semiconductor, hydrogen or hydride (including water, a hydrogen ion, a hydroxide ion, and the like) and oxygen vacancies in the oxide semiconductor film causes the transistor to have poor electrical characteristics. For example, the threshold voltage of a transistor which includes an oxide semiconductor including hydrogen and oxygen vacancies tends to shift in the negative direction, and thus the transistor tends to be normally on. This is because charge is generated owing to the hydrogen and oxygen vacancies in the oxide semiconductor film to reduce the resistance of the oxide semiconductor film.

Hydrogen contained in the oxide semiconductor film can be removed by application of high-temperature heat (temperature higher than approximately 400° C.) to the oxide semiconductor film in a process of manufacturing the transistor; however, oxygen might also be eliminated and oxygen vacancies might be generated. The threshold voltage of the transistor including the oxide semiconductor film to which high-temperature heat is thus applied in the manufacturing process tends to shift in the negative direction as described above, and such a transistor is likely to have normally-on characteristics and might have poor electrical characteristics.

Further, there is a case where oxygen vacancies are generated in the oxide semiconductor film by causing damage to the oxide semiconductor film and eliminating oxygen contained in the oxide semiconductor film in a step of forming another film as a component of the transistor over the oxide semiconductor film.

Further, it is desired that a transistor for a semiconductor integrated circuit or the like be miniaturized. However, as s transistor is miniaturized, it becomes difficult to manufacture a transistor having favorable electrical characteristics.

For example, in order to miniaturize a transistor, an insulating film (e.g., a gate insulating film and a sidewall insulating film) in the transistor is formed using a thin and quality insulating film. This can be implemented by forming the insulating film while an object on which the insulating film is formed is kept at a high temperature (temperature higher than approximately 400° C.) by heating. However, in the case where the insulating film is formed while the object on which the insulating film is formed is kept at a high temperature (temperature higher than approximately 400° C.) by heating in order that a thin and quality insulating film be formed as the insulating film included in the transistor, oxygen might be eliminated from the oxide semiconductor film included in the transistor, and eventually, a transistor having poor electrical characteristics might be manufactured.

It is an object of one embodiment of the present invention to inhibit generation of oxygen vacancies in an oxide semiconductor film in a semiconductor device including an oxide semiconductor. It is another object of one embodiment of the present invention to improve electrical characteristics in a semiconductor device including an oxide semiconductor.

In view of any of the above objects, one embodiment of the present invention is to form an insulating film (e.g., one or both of a gate insulating film and a sidewall insulating film) which is formed after a step of forming an oxide semiconductor film, at a temperature at which oxygen contained in the oxide semiconductor film is inhibited from being eliminated, preferably at a temperature lower than a temperature at which oxygen contained in the oxide semiconductor film is eliminated, in a method for manufacturing a semiconductor device including an oxide semiconductor.

Specifically, a method for manufacturing a semiconductor device including an oxide semiconductor includes the steps of forming an oxide semiconductor film, forming a gate insulating film provided over the oxide semiconductor film, forming a gate electrode in contact with the gate insulating film, and forming a source electrode and a drain electrode in contact with the oxide semiconductor film. In the method, the gate insulating film is formed at a temperature at which oxygen contained in the oxide semiconductor film is inhibited from being eliminated, preferably at a temperature lower than a temperature at which oxygen contained in the oxide semiconductor film is eliminated.

Further, a method for manufacturing a semiconductor device including an oxide semiconductor includes the steps of forming an oxide semiconductor film, forming a gate insulating film provided over the oxide semiconductor film, forming a gate electrode in contact with the gate insulating film, forming a sidewall insulating film in contact with a side surface of the gate electrode, and forming a source electrode and a drain electrode in contact with the oxide semiconductor film. In the method, after the gate electrode is formed, an insulating film covering the gate electrode is formed at a temperature at which oxygen contained in the oxide semiconductor film is inhibited from being eliminated, preferably at a temperature lower than a temperature at which oxygen contained in the oxide semiconductor film is eliminated, and the insulating film is anisotropically etched to form the sidewall insulating film.

In any of the above methods, an object on which the oxide semiconductor film is formed (e.g., a substrate having an insulating surface) is kept at 200° C. to 400° C. inclusive, preferably 300° C. to 350° C. inclusive by heating, to form an insulating film to be processed into the gate insulating film or the sidewall insulating film. Thus, the gate insulating film (specifically, the insulating film to be processed into the gate insulating film) or the sidewall insulating film (specifically, the insulating film to be processed into the sidewall insulating film) can be formed so that oxygen contained in the oxide semiconductor film can be inhibited from being eliminated, preferably formed without elimination of oxygen contained in the oxide semiconductor film, in forming the gate insulating film or the sidewall insulating film.

The gate insulating film or the sidewall insulating film can be formed by a plasma CVD (chemical vapor deposition) method using high frequency. In particular, the gate insulating film is preferably formed by a plasma CVD method in which plasma is generated by use of energy in an electric field of a microwave, a source gas for the gate insulating film or the sidewall insulating film is excited by the plasma, and the excited source gas is made to react over the object to deposit a reactant (such a method is also called a microwave plasma CVD method).

Plasma treatment is preferably performed under an atmosphere containing one or both of oxygen and nitrogen before the gate insulating film is formed or after the gate insulating film is formed.

Plasma treatment is preferably performed under an atmosphere containing one of or both oxygen and nitrogen before the insulating film to be processed into the gate insulating film is formed or after the insulating film to be processed into the gate insulating film is formed.

The insulating film to be processed into the gate insulating film or the insulating film to be processed into the sidewall insulating film may be an insulating film which can be formed at a temperature at which oxygen is not eliminated from the oxide semiconductor film; the insulating film can be formed with a single layer of an oxide insulating film or a nitride insulating film or stacked layers including an oxide insulating film and a nitride insulating film. Since the gate insulating film may contact the oxide semiconductor film, the gate insulating film is preferably formed using an oxide insulating film including oxygen which is a main component of the oxide semiconductor film.

Further, when a dopant is injected into the oxide semiconductor film with the gate electrode used as a mask, a first region and a pair of second regions which serve as a channel formation region and low-resistant regions can be formed in a self-aligned manner in the oxide semiconductor film. Thus, in the oxide semiconductor film included in the semiconductor device, the resistances of the regions in contact with the source electrode and the drain electrode are reduced. Therefore, contact resistance with the source electrode and the drain electrode can be reduced, leading to improvement in the on-state current and the field-effect mobility of the semiconductor device. Note that the first region is a region in the oxide semiconductor film which overlaps with the gate electrode, and serves as the channel formation region. The pair of second regions is formed so that the first region is interposed therebetween and in contact with the source electrode and the drain electrode, and serves as a source region and a drain region.

In the semiconductor device, after the dopant is injected into the oxide semiconductor film with the gate electrode used as a mask, the sidewall insulating film in contact with the side surface of the gate electrode is formed, and a dopant is injected into the oxide semiconductor film with the gate electrode and the sidewall insulating film used as masks, whereby a channel formation region and two low-resistant regions having a difference in dopant concentration can be formed in a self-aligned manner in the oxide semiconductor film. In this case, a pair of third regions overlapping with the sidewall insulating film is formed. One of the third regions is located between the first region and one of the second regions, and the other of the third regions is located between the first region and the other of the second regions. The pair of second regions has higher dopant concentrations and lower resistances than the third regions. Thus, in the oxide semiconductor film included in the semiconductor device, the resistances of the regions in contact with the source electrode and the drain electrode are reduced. Therefore, contact resistance with the source electrode and the drain electrode can be reduced, leading to improvement in the on-state current and the field-effect mobility of the semiconductor device.

When the oxide semiconductor film includes the channel formation region and the low-resistant regions having a difference in dopant concentration, such as the first region, the pair of second regions, and the pair of third regions, an electric field can be gradually applied to the oxide semiconductor film included in the semiconductor device. Thus, the electric field concentration in the vicinity of the drain region in particular can be reduced, and the semiconductor device can be inhibited from being damaged by the electric field concentration.

From the above description, one embodiment of the present invention is a method for manufacturing a semiconductor device including an oxide semiconductor and includes the following: forming an oxide semiconductor film over a substrate having an insulating surface; forming a first insulating film over the oxide semiconductor film; over the first insulating film, forming a gate electrode overlapping with the oxide semiconductor film; injecting a dopant into the oxide semiconductor film with the gate electrode used as a mask; forming a second insulating film over the first insulating film and the gate electrode; removing a part of the second insulating film to form a sidewall insulating film in contact with the first insulating film and the gate electrode; removing a part of the first insulating film to expose a part of the oxide semiconductor film into which the dopant is injected and to form a gate insulating film; and forming a source electrode and a drain electrode in contact with the exposed part of the oxide semiconductor film.

Further, one embodiment of the present invention is a method for manufacturing a semiconductor device including an oxide semiconductor and includes the following: forming an oxide semiconductor film over a substrate having an insulating surface; forming a first insulating film over the oxide semiconductor film; over the first insulating film, forming a gate electrode overlapping with the oxide semiconductor film; forming a second insulating film over the first insulating film and the gate electrode; injecting a dopant into the oxide semiconductor film with the gate electrode used as a mask; removing a part of the second insulating film to form a sidewall insulating film in contact with the first insulating film and the gate electrode; removing a part of the first insulating film to expose a part of the oxide semiconductor film into which the dopant is injected and to form a gate insulating film; forming a conductive film covering at least the exposed part of the oxide semiconductor film; forming an interlayer insulating film over the conductive film; forming a source electrode and a drain electrode by removing a part of the conductive film and a part of the interlayer insulating film to expose a top surface of the gate electrode; in the interlayer insulating film, forming openings reaching the source electrode and the drain electrode; and in the openings, forming wirings in contact with the source electrode and the drain electrode.

In any of the above methods, one or both of the first insulating film and the second insulating film can be formed at a temperature lower than a temperature at which oxygen contained in the oxide semiconductor film is eliminated.

In any of the above methods, after the sidewall insulating film is formed, the dopant may be injected with the gate electrode and the sidewall insulating film used as masks.

In any of the above methods, the dopant can be one or more elements selected from the group consisting of boron, nitrogen, fluorine, aluminum, phosphorus, arsenic, indium, tin, antimony, and a rare gas element.

In the semiconductor device including an oxide semiconductor, the gate insulating film or the sidewall insulating film is formed at a temperature at which oxygen contained in the oxide semiconductor film is inhibited from being eliminated, preferably at a temperature lower than a temperature at which oxygen contained in the oxide semiconductor film is eliminated. Thus, it is possible to inhibit generation of oxygen vacancies due to elimination of oxygen contained in the oxide semiconductor film in a step of forming the gate insulating film or a step of forming the sidewall insulating film. Therefore, one embodiment of the present invention can manufacture a semiconductor device having favorable electrical characteristics.

BRIEF DESCRIPTION OF THE DRAWINGS

FIGS. 1A and 1B are a top view and a cross-sectional view which illustrate an example of a transistor.

DETAILED DESCRIPTION OF THE INVENTION

Figure 2:
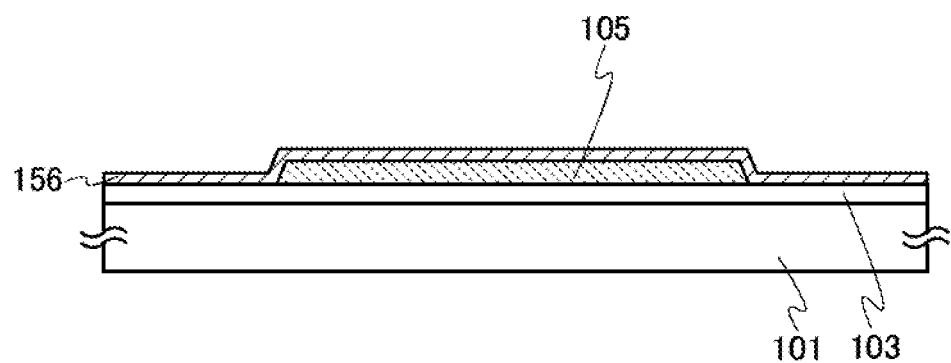
FIG. 2 is a cross-sectional view illustrating a method for manufacturing a transistor.

Embodiments of the present invention will be described in detail below with reference to drawings. However, the present invention is not limited to the following description and it is easily understood by those skilled in the art that the mode and details can be variously changed without departing from the scope and spirit of the present invention. Therefore, the present invention should not be interpreted as being limited to the description of the embodiments. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, description can be made even when "first" is replaced with "second" or "third", as appropriate.

Note that, functions of "source" and "drain" may become switched in the case that a direction of a current flow is changed during circuit operation, for example. Therefore, the terms "source" and "drain" can be used to denote the drain and the source, respectively, in this specification.

In this specification, in the case where an etching step is performed after a photolithography step, a mask formed in the photolithography step is removed after the etching step.

(Embodiment 1)

In this embodiment, a method for manufacturing a semiconductor device which is one embodiment of the present invention, and a semiconductor device manufactured by the method are described with reference to drawings. Here, a transistor is given as the semiconductor device.

FIGS. 1A and 1B are a top view and a cross-sectional view of a transistor 100. FIG. 1A is a top view of the transistor 100, and FIG. 1B is a cross-sectional view taken along dashed-dotted line A-B in FIG. 1A. Note that in FIG. 1A, some of components of the transistor 100 (e.g., a substrate 101, a base insulating film 103, a gate insulating film 113, and the like) are omitted for simplicity.

As shown in FIGS. 1A and 1B, in the transistor 100, the base insulating film 103 is provided over the substrate 101; an oxide semiconductor film 105 is provided over the base insulating film 103; the gate insulating film 113 is provided over the oxide semiconductor film 105; a gate electrode 117 is provided in a region over the gate insulating film 113 which overlaps with the oxide semiconductor film 105; a protective insulating film 121 which is in contact with the base insulating film 103, a part of the oxide semiconductor film 105, the gate insulating film 113, and the gate electrode 117 is provided; an interlayer insulating film 123 is provided over the protective insulating film 121; and a source electrode 127a and a drain electrode 127b which are in contact with the oxide semiconductor film 105 are provided in openings 125a and 125b formed in the protective insulating film 121 and the interlayer insulating film 123. Note that the base insulating film 103 and the interlayer insulating film 123 are not necessarily provided.

The transistor 100 is a top-gate transistor in which the gate electrode 117 is provided over the oxide semiconductor film 105.

The oxide semiconductor film 105 includes a channel formation region, a source region, and a drain region.

One embodiment of the present invention is to form the gate insulating film 113 (specifically, an insulating film to be processed into the gate insulating film 113) in such a manner that oxygen contained in the oxide semiconductor film is inhibited from being eliminated and preferably in such a manner that oxygen contained in the oxide semiconductor film is not eliminated. Another embodiment of the present invention is to form the gate insulating film 113 by forming the insulating film by a plasma CVD method using a microwave and processing the insulating film. Since the insulating film formed by a plasma CVD method using a microwave is a dense film, the gate insulating film 113 is a dense film. Owing to this, oxygen contained in the oxide semiconductor film 105 (in particular, a channel formation region) can be inhibited from being released to the outside through the gate insulating film 113 after the gate insulating film 113 is formed in the process of manufacturing the transistor 100. Thus, generation of oxygen vacancies in a step of forming the gate insulating film 113 can be inhibited, and the transistor 100 having favorable electrical characteristics can be manufactured.

The thickness of the gate insulating film 113 is greater than or equal to 5 nm and less than or equal to 300 nm. In order that the transistor is miniaturized or the on-state current and the field-effect mobility of the transistor be improved, the gate insulating film 113 is preferably formed thin. For example, the thickness of the gate insulating film 113 is preferably greater than or equal to 5 nm and less than or equal to 50 nm, more preferably greater than or equal to 10 nm and less than or equal to 30 nm.

Even when the gate insulating film 113 is formed thin (e.g., 20 nm or less) for example, the gate insulating film 113 can inhibit oxygen contained in the oxide semiconductor film 105 from being eliminated and released to the outside through the gate insulating film 113 after the gate insulating film 113 is formed in the process of manufacturing the transistor 100. Thus, the transistor 100 has favorable electrical characteristics.

Here, a method for forming the insulating film to be processed into the gate insulating film 113 in such a manner that oxygen contained in the oxide semiconductor film is not eliminated is described with reference to FIG. 2, FIG. 3, and FIG. 4.

The structure shown in FIG. 2 illustrates a step of forming an insulating film 156 after the base insulating film 103 is formed over the substrate 101 and the oxide semiconductor film 105 is formed, in the process of manufacturing the transistor 100.

The insulating film 156 can be formed using an insulating film including oxygen. For example, the insulating film 156 can be formed using one or more insulating films selected from the following: an oxide insulating film of silicon oxide, gallium oxide, hafnium oxide, yttrium oxide, aluminum oxide, or the like; a nitride insulating film of silicon nitride, aluminum nitride, or the like; an oxynitride insulating film of silicon oxynitride, aluminum oxynitride, or the like; or a nitride oxide insulating film of silicon nitride oxide or the like. Note that "silicon nitride oxide" contains more nitrogen than oxygen and "silicon oxynitride" contains more oxygen than nitrogen.

The insulating film 156 is formed so that oxygen contained in the oxide semiconductor film 105 can be inhibited from being eliminated and preferably so that oxygen contained in the oxide semiconductor film is not eliminated. In order to achieve this, the insulating film 156 is formed at a temperature at which oxygen is inhibited from being eliminated from the oxide semiconductor film 105, preferably at a temperature lower than a temperature at which oxygen contained in the oxide semiconductor film is eliminated.

Specifically, the insulating film is formed while an object (the substrate 101) on which the oxide semiconductor film 105 is formed is kept at 200° C. to 400° C. inclusive, preferably 300° C. to 350° C. inclusive by heating. Note that in the specification described below, the terms "temperature at which oxygen is inhibited from being eliminated" mean "temperature lower than a temperature at which oxygen contained in an oxide semiconductor film is eliminated".

Further, in order to form the insulating film 156 in such a manner that oxygen is inhibited from being eliminated from the oxide semiconductor film 105, the insulating film 156 can be formed by a plasma CVD method, preferably a plasma CVD method using a microwave in particular.

It is preferable that formation of the insulating film 156 be followed by exposure of the insulating film 156 to plasma generated under an oxygen atmosphere, a nitrogen atmosphere, or an atmosphere containing oxygen and nitrogen. For example, it is preferable that, after the oxide insulating film or the oxynitride insulating film is formed as the insulating film 156, oxygen or dinitrogen monoxide be introduced into the same treatment chamber to generate plasma. Alternatively, it is preferable that, after the nitride insulating film or the nitride oxide insulating film is formed as the insulating film 156, nitrogen or dinitrogen monoxide be introduced to generate plasma. Thus, a defect contained in the insulating film 156 formed can be terminated by oxygen or nitrogen, whereby the insulating film 156 which is denser and has few defects can be formed.

Further, the generation of the plasma under the oxygen atmosphere makes it possible to supply oxygen from the insulating film 156 to the oxide semiconductor film 105, and thus, oxygen vacancies in the oxide semiconductor film 105 can be filled.

Thus, the gate insulating film which is denser and has few defects can be formed, and the transistor 100 having favorable electrical characteristics can be manufactured.

Note that before the insulating film 156 is formed, an object on which the insulating film 156 is to be formed may be exposed to the plasma, which may be followed by formation of the insulating film 156. In particular, the generation of plasma under the oxygen atmosphere leads to exposure of the oxide semiconductor film 105 to the plasma, whereby oxygen can be supplied to the oxide semiconductor film 105. Thus, oxygen vacancies in the oxide semiconductor film 105 can be filled.

Here, a plasma CVD method using a microwave and a treatment apparatus which can perform the method are described with reference to drawings.

In this specification, a microwave refers to a wave in the frequency range of 300 MHz to 300 GHz. Hence, as for a microwave, an electric wave has a very high frequency and the electric field direction is reversed at high speed as compared to electric waves in the HF band, i.e., the frequency range of 3 MHz to 30 MHz, typically 13.56 MHz, and the VHF band, i.e., the frequency range of 30 MHz to 300 MHz, typically 60 MHz. Therefore, electrons are not continuously accelerated in one direction, the electron temperature is low, and the electron energy is low. Further, in supplied power, the proportion of power used for acceleration of electrons is low, and therefore, much more power can be used for dissociation and ionization of molecules. Thus, plasma with high density (high-density plasma) can be excited.

As the high-density plasma, plasma having an electron density of not less than $10^{11}$ cm$^{-3}$ and an electron temperature of 0.2 eV to 2.0 eV, inclusive, is preferably used. The electron temperature in plasma generated with the use of a frequency in the RF band, e.g., 13.56 MHz, is as high as more than 3 eV. Thus, a deposition surface is much damaged by plasma, leading to generation of defects. However, in plasma generated using a microwave, the electron temperature is low as described above; therefore, the deposition surface and the deposit are less damaged by plasma. Consequently, a film with few defects can be formed.

Here, a structure of a treatment chamber of a microwave plasma CVD apparatus is described in detail with reference to FIG. 3 and FIG. 4. FIG. 3 and FIG. 4 are cross-sectional views each showing a treatment chamber of a microwave plasma CVD apparatus which uses a surface wave propagated on a dielectric.

A treatment chamber 501 of the microwave plasma CVD apparatus is provided with a mounting stage 505 on which a substrate 503 is to be placed, an exhaust unit 507 for exhausting gas in the treatment chamber 501, a microwave generation unit 509 for supplying microwaves for generating plasma, a waveguide 511 for introducing the microwaves from the microwave generation unit 509 into the treatment chamber 501, a top plate 513 which is in contact with the waveguide 511 and includes openings 513a, and a plurality of dielectric plates 515 fixed to the top plate 513 with a fixing member. A plurality of members 520 (also referred to as beams) is provided between the plurality of dielectric plates 515. The substrate 503 is provided to face the dielectric plates 515. As the exhaust unit 507, a dry pump for low vacuum evacuation and a turbo molecular pump for high vacuum evacuation can be used.

A gas pipe 517 through which a non-source gas flows and a gas pipe 519 through which a source gas flows are provided between the substrate 503 and the dielectric plates 515. The gas pipe 517 through which a non-source gas flows is connected to a non-source gas supply source 523 via a refiner 521. The gas pipe 519 through which a source gas flows is connected to a source gas supply source 527 via a refiner 525. With the refiners 521 and 525, impurities contained in the non-source gas and the source gas can be removed, so that the non-source gas and the source gas can be highly purified. Note that a valve and a mass flow controller are each provided between the refiner 521 and the non-source gas supply source 523 and between the refiner 525 and the source gas supply source 527.

The mounting stage 505 is provided with a substrate heater 531, the temperature of which is controlled by a heater controller 529, whereby the temperature of the substrate 503 can be controlled. A high-frequency power source may be connected to the mounting stage 505, so that predetermined bias voltage may be applied to the mounting stage 505 by AC electric power output from the high-frequency power source.

The microwave generation unit 509 supplies microwaves to the treatment chamber 501. By provision of a plurality of microwave generation units 509, large-area plasma can be generated stably. Note that the microwave generation unit 509 is preferably provided outside the treatment chamber 501.

The treatment chamber 501 and the top plate 513 are formed using a conductor whose surface is covered with an insulating film of alumina, silicon oxide, or a fluorine resin, for example, a copper plate, a nickel plate, a stainless steel plate, an aluminum plate, or the like. The fixing member is formed using a metal, for example an alloy including aluminum.

The dielectric plates 515 are provided so as to be in close contact with the openings 513a of the top plate 513. The microwaves generated in the microwave generation unit 509 are propagated to the dielectric plates 515 by passing through the waveguide 511 and the openings 513a of the top plate 513 and transmitted through the dielectric plates 515 to be released into the treatment chamber.

By provision of the plurality of dielectric plates 515, uniform large-area plasma can be generated and kept. The dielectric plate 515 is formed using ceramics such as sapphire, quartz glass, alumina, silicon oxide, or silicon nitride. The dielectric plate 515 may have a recessed portion 515a on the side where the plasma is generated. By the recessed portion 515a, stable plasma can be generated.

The non-source gas flows through the plurality of gas pipes 517 on the upper side, and the source gas flows through the plurality of gas pipes 519 on the lower side. The gas pipes 517 and 519 are provided to intersect with each other. Outlets of the gas pipes 517 through which the non-source gas flows are provided on the dielectric plates 515 side, and outlets of the gas pipes 519 through which the source gas flows are provided on the substrate 503 side. When the plurality of gas pipes 517 and the plurality of gas pipes 519 are provided to intersect with each other, the distance between the gas pipes can be shortened and thus the distance between the outlets can be shortened.

Here, the non-source gas is ejected toward the dielectric plates 515. By energy in the electric field of the microwave released into the treatment chamber 501, the non-source gas is excited to generate plasma (or plasma-excited) over a surface of the dielectric plate 515. When moving to the substrate 503 side, the plasma-excited non-source gas reacts with the source gas ejected from the gas pipes 519 to excite the source gas. The excited source gas reacts over the substrate 503, and a deposit is formed. The plasma is generated over the surface of the dielectric plate 515 but does not reach the substrate 503; thus, damage to the substrate 503 is reduced and a dense deposit is formed. The source gas is ejected toward the substrate 503 from the gas pipes 519 provided in a position closer to the substrate 503. Thus, the deposition rate can be increased. Note that part of the source gas can flow through the gas pipes 517 on the upper side. Further, the source gas is not supplied to the vicinity of the gas pipes 517, and thus, generation of particles and adhesion of a deposit onto an inner wall of the treatment chamber 501 can be inhibited.

Figure 3:
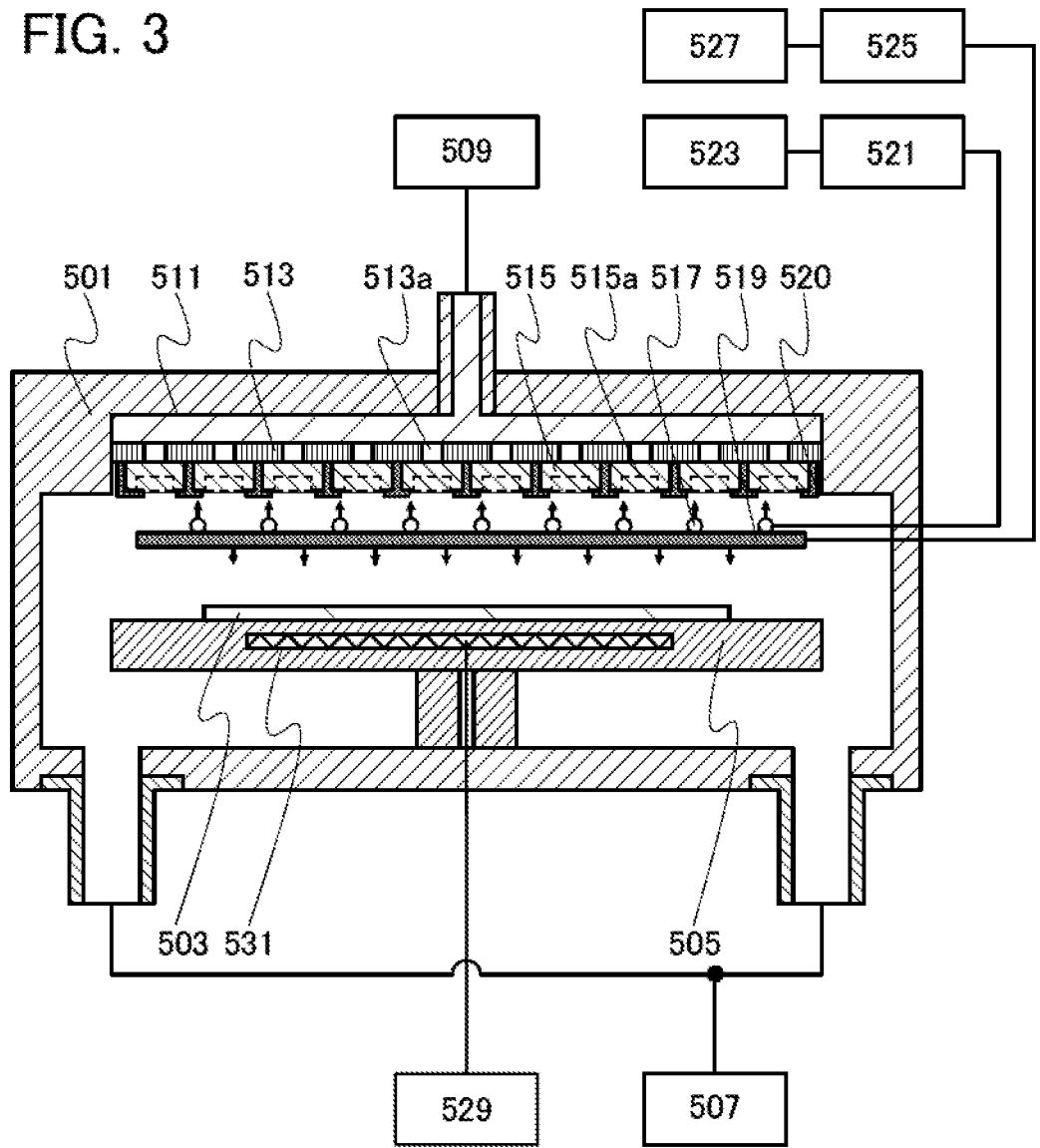
FIG. 3 is a cross-sectional view illustrating a microwave plasma CVD apparatus.

Note that, instead of the plurality of gas pipes 517 shown in FIG. 3 through which the non-source gas flows, a plurality of gas pipes through which the non-source gas flows toward a surface of the member 520 (also referred to as beam) between the dielectric plates 515 may be provided. In this case, a gas outlet thereof is directed to the substrate 503. With such a structure, the source gas ejected from the gas pipes 519 is not blown up toward the dielectric plates 515 side by the non-source gas ejected from the gas pipes 517; thus, generation of particles can be inhibited.

The gas pipes 517 and 519 are formed using ceramics such as alumina or aluminum nitride. Transmissivity of the microwaves is high in the ceramics; therefore, distribution of the plasma can be uniform without an electric field being disturbed, even when the gas pipe is provided right under the dielectric plate 515.

Next, a treatment chamber of a microwave plasma CVD apparatus which is different from that in FIG. 3 is described with reference to FIG. 4. Note that the same components as in FIG. 3 are denoted by the same reference numerals and detailed description thereof is omitted.

A treatment chamber 532 of the microwave plasma CVD apparatus is provided with the mounting stage 505 on which the substrate 503 is to be placed, the exhaust unit 507 for exhausting gas in the treatment chamber 532, a dielectric plate 533, a planar antenna 535, and a shower plate 537.

The dielectric plate 533 is provided to control the wavelength of a microwave in vacuum. The dielectric plate 533 is formed using ceramics such as sapphire, quartz glass, alumina, silicon oxide, or silicon nitride.

The microwave generation unit 509 for supplying microwaves for generation plasma, and a coaxial waveguide 541 for introducing microwaves from the microwave generation unit 509 into the treatment chamber 532 are included. The coaxial waveguide 541 is provided with an axis portion 543 connected to the microwave generation unit 509. The axis portion 543 is connected to the center of the planar antenna 535. With such a structure, microwaves can be propagated radially and uniformly to the planar antenna 535 through the axis portion 543 in the coaxial waveguide 541. Further, stable large-area plasma can be generated by provision of the planar antenna 535.

The planar antenna 535 is provided to face the substrate 503. In the planar antenna 535, a plurality of grooves (slots) for radiating microwaves is formed in a concentric pattern. Such a planar antenna is referred to as a radial line slot antenna. The positions and the lengths of the plurality of grooves (slots) are selected as appropriate depending on the wavelength of the microwave transmitted from the microwave generation unit 509. The planar antenna 535 is formed using a copper plate, a nickel plate, a stainless steel plate, or an aluminum plate, each of which has a gold- or silver-plated surface.

Further, the shower plate 537 through which the non-source gas flows is provided to be in contact with the planar antenna 535. A gas pipe 539 through which the source gas flows is provided between the substrate 503 and the shower plate 537. The shower plate 537 through which the non-source gas flows is connected to the non-source gas supply source 523 via the refiner 521. The gas pipe 539 through which the source gas flows is connected to the source-gas supply source 527 via the refiner 525. The shower plate 537 includes a plurality of holes through which the gas flows. When the diameter of the hole in the shower plate 537 is 50 μm or less and the length thereof is 5 mm or more, the pressure of a gas flow path in the shower plate 537 can be increased and overdischarge can be inhibited.

In a manner similar to that of the treatment chamber 501 shown in FIG. 3, by the energy in the electric field of the microwave released into the treatment chamber 501, the non-source gas is plasma-excited in the vicinity of the planar antenna 535 and the shower plate 537 through which the non-source gas flows and which is provided in the vicinity of the planar antenna 535 where the plasma is generated. In moving to the substrate 503 side, the plasma-excited non-source gas reacts with the source gas ejected from the gas pipe 539 to excite the source gas. The excited source gas reacts over the substrate 503; thus, a deposit is formed. The plasma does not reach the substrate 503; thus, damage to the substrate 503 is reduced and a dense deposit is formed. The source gas is ejected toward the substrate 503 from the gas pipes 519 provided in a position closer to the substrate 503. Thus, the deposition rate can be increased. Note that part of the source gas can flow through the shower plate 537 on the upper side. Further, the source gas is not supplied to the vicinity of the planar antenna 535, and thus, generation of particles and adhesion of a deposit onto an inner wall of the treatment chamber 532 can be inhibited.

The shower plate 537 and the gas pipe 539 are formed using ceramics such as alumina or aluminum nitride. Note that a shower plate may be used instead of the gas pipe 539.

Figure 4:
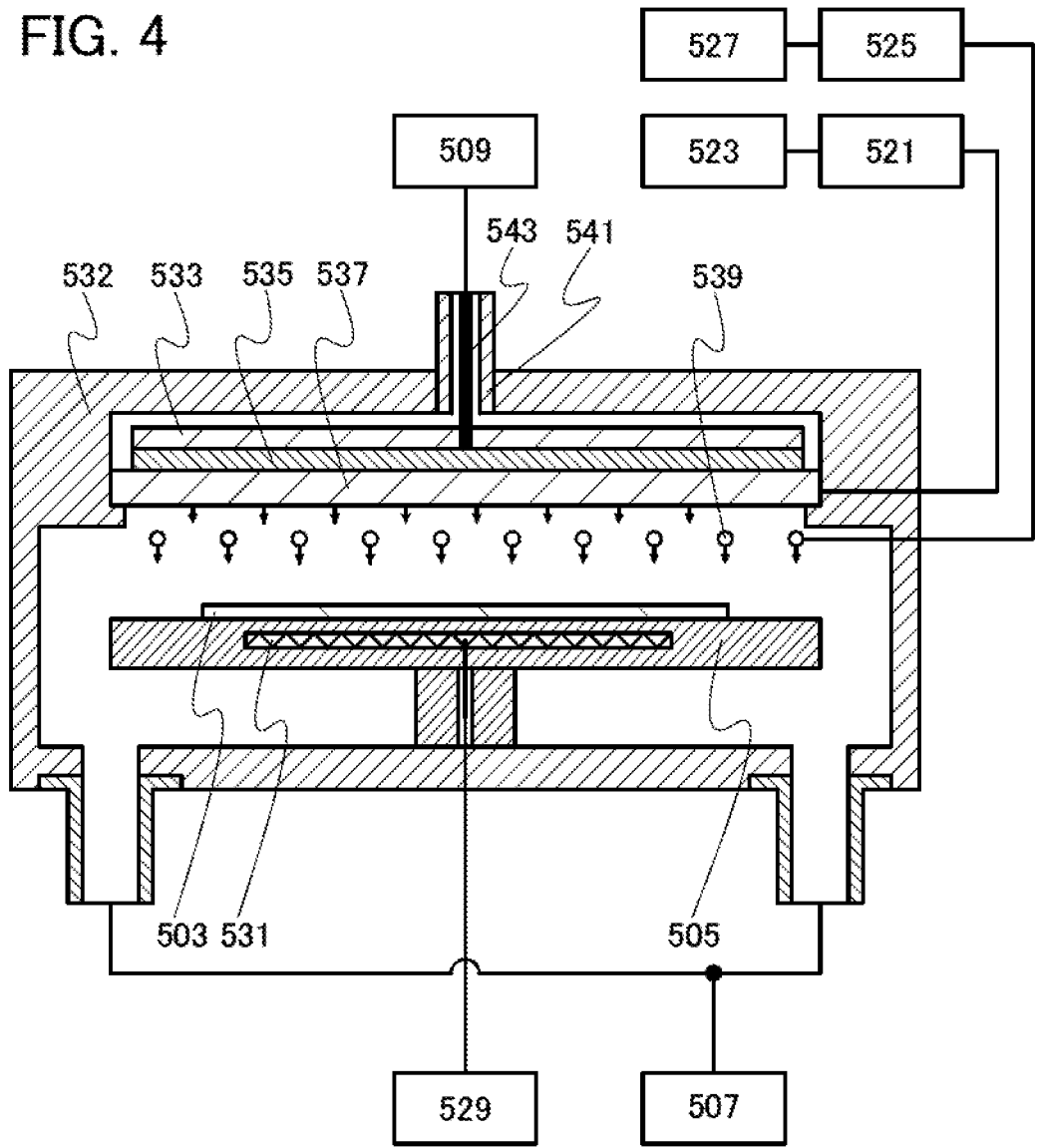
FIG. 4 is a cross-sectional view illustrating a microwave plasma CVD apparatus.

Note that when a dielectric plate for propagating a microwave is provided on the substrate side of the planar antenna 535 and a metal plate is provided on the substrate side of the dielectric plate in the treatment chamber of the microwave plasma CVD apparatus shown in FIG. 4, the treatment chamber becomes a treatment chamber of a microwave plasma CVD apparatus which uses a surface wave propagated on the metal plate.

The dielectric plate for propagating a microwave can be formed using a material similar to that for the dielectric plate 533 as appropriate.

The metal plate provided on the substrate side of the dielectric plate can be formed using a material similar to that of the planar antenna 535 as appropriate.

When a groove is provided in the dielectric plate and the metal plate to serve as a gas flow path and the non-source gas and the source gas are introduced to the groove, plasma excitation can be performed over a surface of the metal plate. Further, the non-source gas is introduced to the groove in the dielectric plate and the metal plate and the gas pipe for introducing the source gas is provided on the substrate 503 side as shown in FIG. 4, whereby plasma excitation can be performed over the surface of the metal plate, and in addition, generation of particles can be inhibited. The surface of the metal plate may be provided with a passive state film with a thickness of greater than or equal to 300 nm and less than or equal to 500 nm in order to prevent corrosion by plasma.

By supply of a microwave of 896 MHz, 915 MHz, 922 MHz, or the like from the microwave generation unit 509 to the treatment chamber, a metal surface wave is propagated along the surface of the metal plate. Consequently, stable plasma with uniform energy can be generated.

The foregoing is the description on a plasma CVD method using a microwave and a treatment apparatus with which the plasma CVD method can be performed.

The method for manufacturing the transistor 100 is described below with reference to drawings.

Figure 5A:
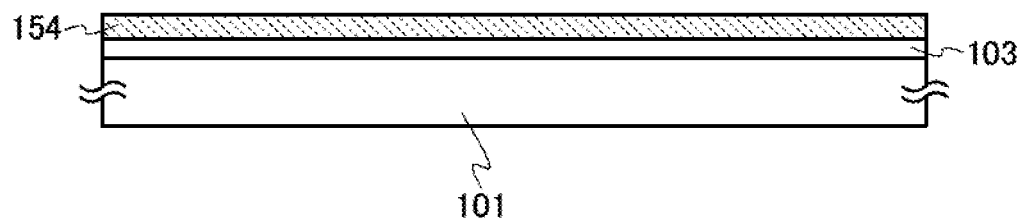
FIGS. 5A to 5C are cross-sectional views illustrating a method for manufacturing a transistor.

The base insulating film 103 is formed over the substrate 101, and an oxide semiconductor film 154 is formed over the base insulating film 103 (see FIG. 5A).

Although there is no particular limitation on the substrate 101, it is preferable that the substrate 101 have an insulating surface and at least heat resistance high enough to withstand heat treatment performed later. Since minute processing might become difficult owing to shrinkage of the substrate 101 caused by heat treatment or the like in the process of manufacturing the transistor, it is preferable to use a substrate which does not shrink much (i.e., a substrate with little shrinkage) for the substrate 101.

The base insulating film 103 can be formed using a material which can be used for the insulating film 156.

The base insulating film 103 can be formed by a physical vapor deposition (PVD) method such as a CVD method or a sputtering method. The base insulating film 103 can be formed to a thickness of greater than or equal to 5 nm and less than or equal to 3000 nm.

In the manufacture of the transistor 100, alkali metal such as Li or Na is an impurity, which might lead to poor electrical characteristics when the impurity is diffused into the oxide semiconductor film 105 formed later. Therefore, the base insulating film 103 is preferably provided over a nitride insulating film provided in contact with the substrate 101. The nitride insulating film can be formed using silicon nitride, aluminum nitride, or the like by a CVD method, a PVD method, or the like.

The oxide semiconductor film 154 can be formed by a PVD method such as a sputtering method.

Figure 5B:
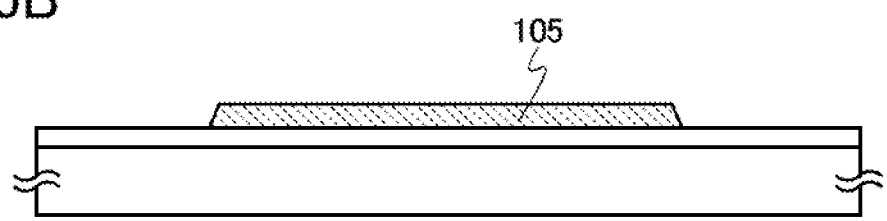

Next, the oxide semiconductor film 154 is subjected to a photolithography step and an etching step, whereby the oxide semiconductor film 105 is formed (see FIG. 5B).

Figure 5C:
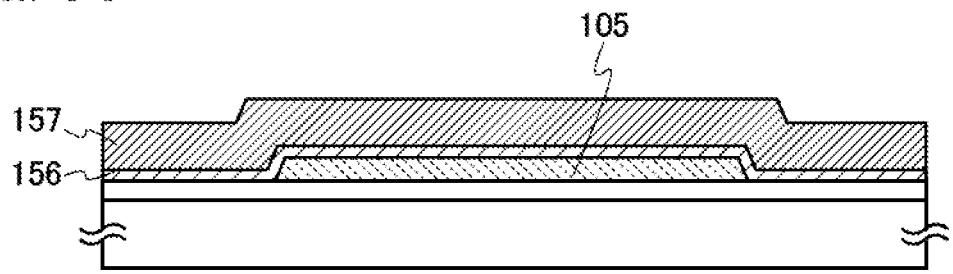

Next, the insulating film 156 is formed over the oxide semiconductor film 105 (see FIG. 2), and a conductive film 157 is formed over the insulating film 156 (see FIG. 5C).

As described above, the insulating film 156 is formed in such a manner that oxygen contained in the oxide semiconductor film 105 is not eliminated. Since the insulating film 156 is processed into the gate insulating film 113 in a later step, the insulating film 156 is formed to such a thickness as to be applicable to the gate insulating film 113. There is no particular limitation on the conductive film 157; the conductive film 157 can be formed by a CVD method or a PVD method using a material having conductivity.

Figure 6A:
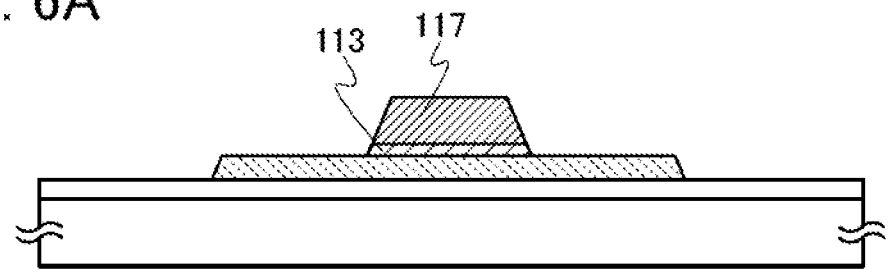
FIGS. 6A to 6C are cross-sectional views illustrating a method for manufacturing a transistor.

Next, the conductive film 157 is subjected to a photolithography step and an etching step to form the gate electrode 117, and the insulating film 156 is partly removed to form the gate insulating film 113 (see FIG. 6A).

Note that the gate electrode 117 is formed so that the edge portion thereof has a tapered shape, in which case a break in a film to be formed after this step can be inhibited. Note that the tapered shape can be formed by etching while the resist mask is made to recede.

Figure 6B:
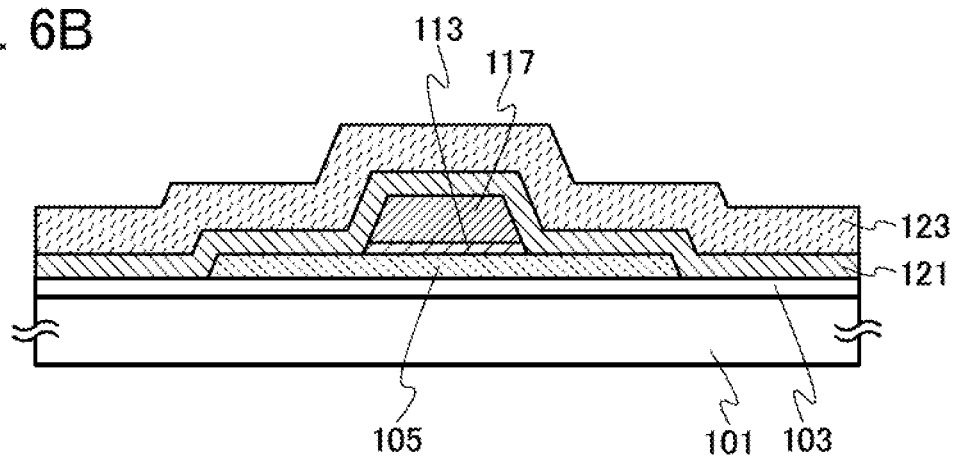

Next, the protective insulating film 121 is formed over the gate insulating film 113 and the gate electrode 117, and the interlayer insulating film 123 is formed over the protective insulating film 121 (see FIG. 6B).

The protective insulating film 121 and the interlayer insulating film 123 can be formed by a CVD method or a PVD method using an insulating film which can be used for the base insulating film 103.

Note that in the process of manufacturing the transistor 100, heat treatment is preferably performed at least after the protective insulating film 121 is formed. For example, the temperature of the heat treatment is higher than or equal to 300° C. and lower than or equal to 700° C., or lower than the strain point of the substrate 101. The heat treatment can be performed under reduced pressure, under a nitrogen atmosphere, under an oxygen atmosphere, under a rare gate atmosphere, or the like. For example, the substrate 101 is put in an electric furnace which is a kind of heat treatment apparatus, and the heat treatment is preferably performed on the oxide semiconductor film 105 at 450° C. under a nitrogen atmosphere for 1 hour.

Figure 6C:
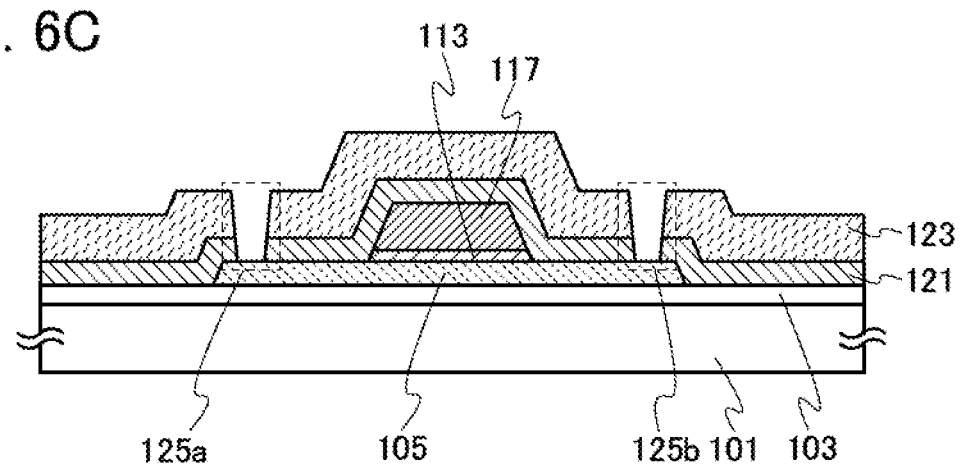

Next, the openings 125a and 125b reaching the oxide semiconductor film 105 are formed in the protective insulating film 121 and the interlayer insulating film 123 by a photolithography step and an etching step (see FIG. 6C). Then, a conductive film is formed in the openings 125a and 125b, and a photolithography step and an etching step are performed, whereby the source electrode 127a and the drain electrode 127b are formed (see FIG. 1B). The source electrode 127a and the drain electrode 127b also serve as a source wiring and a drain wiring, respectively. The conductive film may be formed in a manner similar to that of the conductive film 157 which is processed into the gate electrode 117.

Figure 7A:
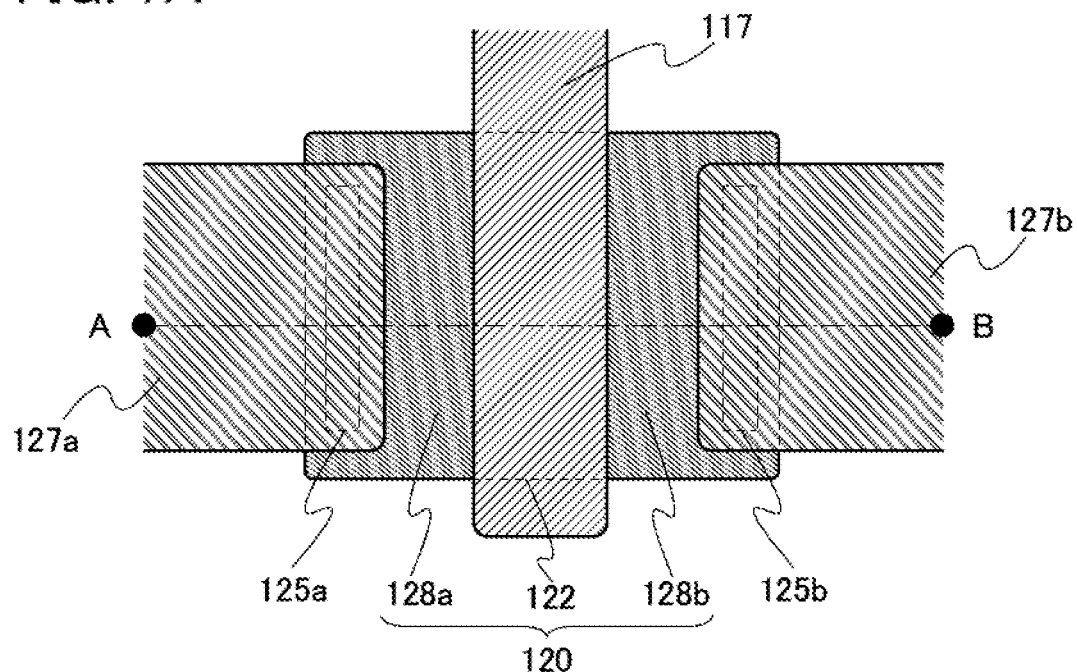
FIGS. 7A and 7B are a top view and a cross-sectional view which illustrate an example of a transistor.

In the method for manufacturing the transistor 100, the gate electrode 117 is formed, and before the gate insulating film 113 is formed, a dopant can be injected into the oxide semiconductor film 105 with the gate electrode 117 used as a mask; thus, a low-resistant region can be formed in the oxide semiconductor film 105. By injecting the dopant in this manner, the oxide semiconductor film 105 can be changed into an oxide semiconductor film 120 including a first region 122 overlapping with the gate electrode 117 and a pair of second regions 128a and 128b facing each other with the first region 122 interposed therebetween. FIG. 7A is a plan view of a transistor including the oxide semiconductor film 120, and FIG. 7B is a cross-sectional view taken along dashed-dotted line A-B in FIG. 7A.

Figure 7B:
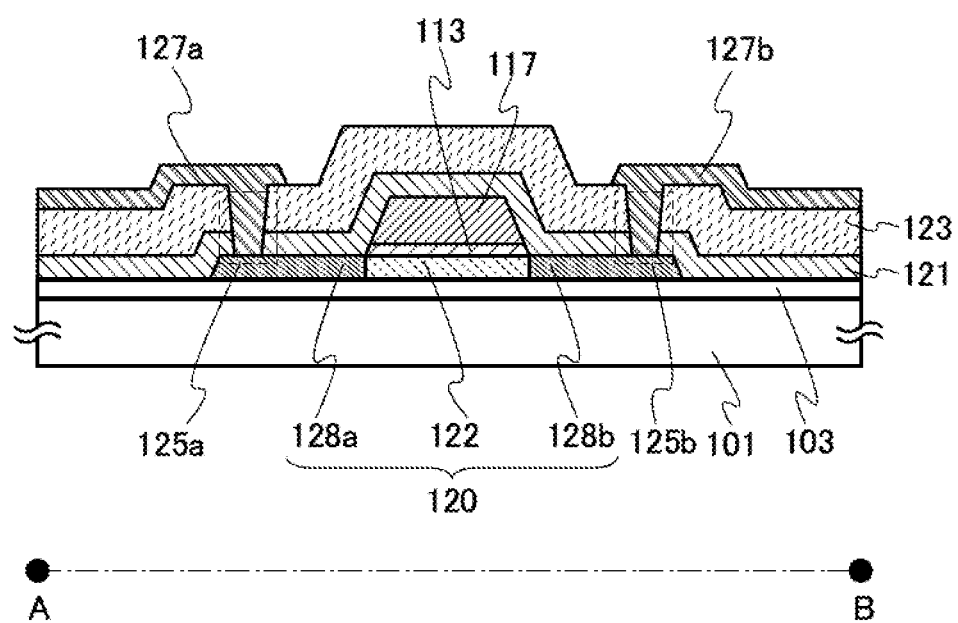

In the transistor shown in FIGS. 7A and 7B, the first region 122 is a region including no dopant and serves as a channel formation region, and the pair of second regions 128a and 128b are regions including a dopant and serve as a source region and a drain region. As in the pair of second regions 128a and 128b, the resistances of the regions in the oxide semiconductor film which are in contact with the source electrode and the drain electrode are reduced, whereby contact resistance with the source electrode 127a and the drain electrode 127b can be reduced, leading to improvement in the on-state current and the field-effect mobility of the transistor.

As the dopant which can be injected into the oxide semiconductor film 105, one or more elements selected from boron, nitrogen, fluorine, aluminum, phosphorus, arsenic, indium, tin, antimony, and a rare gas element can be used. The dopant can be injected into the oxide semiconductor film 105 by an ion implantation method or an ion doping method.

As described above, by formation of the gate insulating film (specifically the insulating film to be processed into the gate insulating film) in the transistor including an oxide semiconductor by a plasma CVD method using a microwave at a temperature lower than a temperature at which oxygen contained in the oxide semiconductor film is eliminated, generation of oxygen vacancies due to elimination of oxygen contained in the oxide semiconductor film in the step of forming the gate insulating film can be inhibited. Thus, a transistor in which at least the shift of a threshold voltage in the negative direction is inhibited and normally-on characteristics are thus improved can be manufactured. Further, by formation of the gate insulating film (specifically the insulating film to be processed into the gate insulating film) by a plasma CVD method using a microwave at a temperature lower than a temperature at which oxygen contained in the oxide semiconductor film is eliminated, the gate insulating film can be dense. Owing to this, the channel length of the transistor can be decreased to 100 nm or less, for example to 30 nm, and the thickness of the gate insulating film can be reduced to several tens of nanometers. Even in such cases, the off-state current can be several tens of zeptoamperes per micrometer, and even several hundreds of yoctoamperes per micrometer.

Note that the structures, methods, and the like described in this embodiment can be used as appropriate in combination with any of the structures, methods, and the like described in the other embodiments and examples.

(Embodiment 2)

In this embodiment, a semiconductor device having a structure which is partly different from the structure of the semiconductor device described in Embodiment 1, and a method for manufacturing the semiconductor device are described. Also in this embodiment, a transistor is employed as the semiconductor device.

Figure 8A:
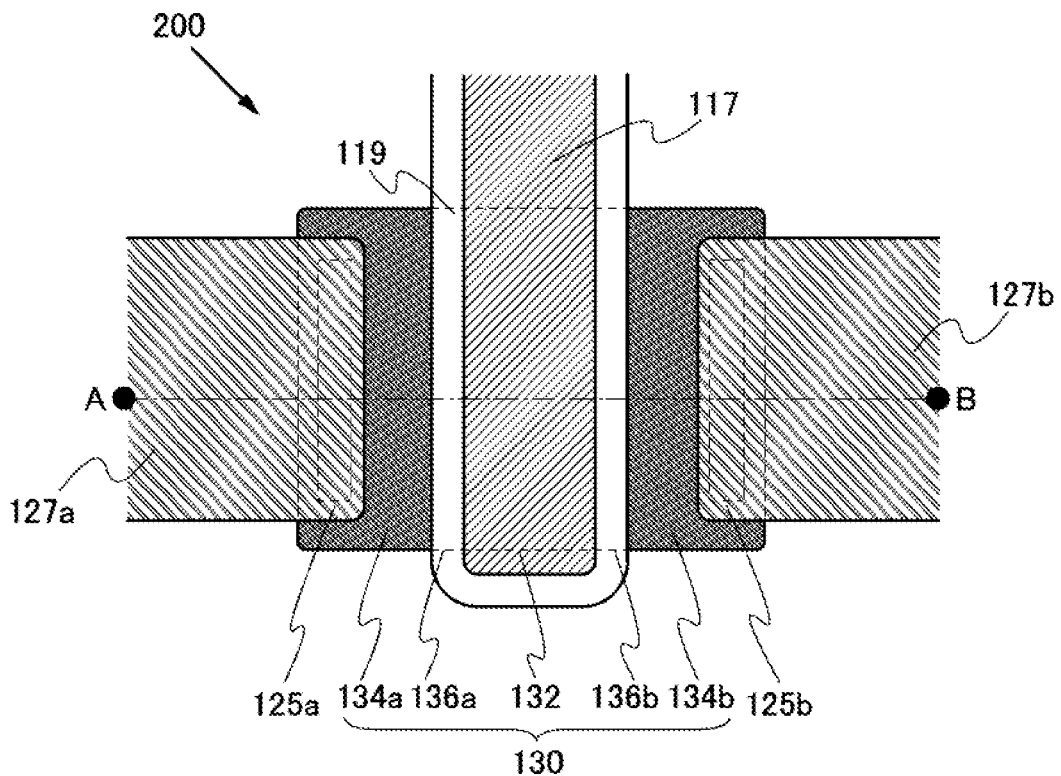
FIGS. 8A and 8B are a top view and a cross-sectional view which illustrate an example of a transistor.
Figure 8B:
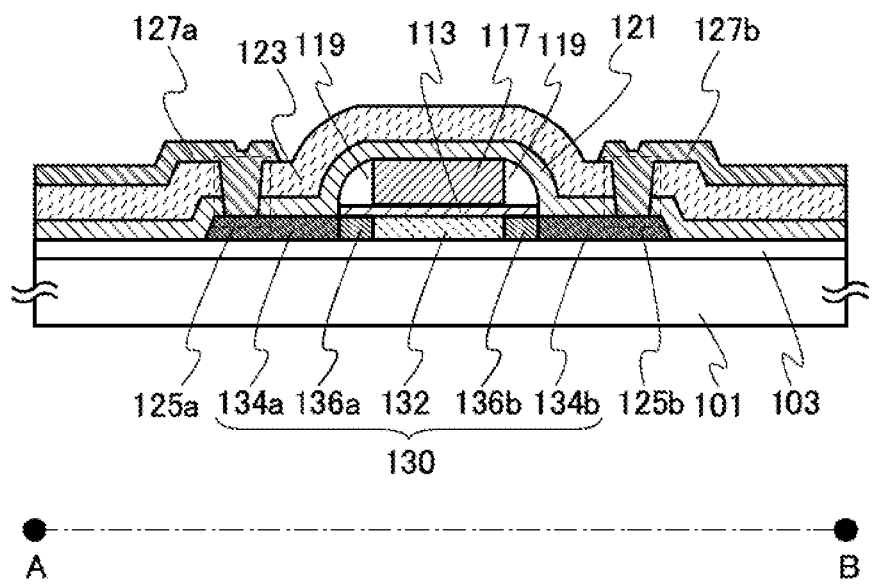

FIGS. 8A and 8B are a top view and a cross-sectional view of a transistor 200. FIG. 8A is a top view of the transistor 200, and FIG. 8B is a cross-sectional view taken along dashed-dotted line A-B in FIG. 8A. Note that in FIG. 8A, some of components of the transistor 200 (e.g., the substrate 101, the base insulating film 103, the gate insulating film 113, and the like) are omitted for simplicity.

As shown in FIGS. 8A and 8B, in the transistor 200, the base insulating film 103 is provided over the substrate 101; an oxide semiconductor film 130 is provided over the base insulating film 103; the gate insulating film 113 is provided over the oxide semiconductor film 130; the gate electrode 117 is provided in a region over the gate insulating film 113 which overlaps with the oxide semiconductor film 130; a sidewall insulating film 119 which is in contact with the gate insulating film 113 and the gate electrode 117 is provided; the protective insulating film 121 which is in contact with the base insulating film 103, a part of the oxide semiconductor film 130, the gate insulating film 113, and the sidewall insulating film 119 is provided; the interlayer insulating film 123 is provided over the protective insulating film 121; and the source electrode 127a and the drain electrode 127b which are in contact with the oxide semiconductor film 130 are provided in the openings 125a and 125b formed in the protective insulating film 121 and the interlayer insulating film 123. Note that the base insulating film 103 and the interlayer insulating film 123 are not necessarily provided.

The transistor 200 is a top-gate transistor in which the gate electrode 117 is provided over the oxide semiconductor film 130.

The oxide semiconductor film 130 includes a first region 132, a pair of second regions 134a and 134b, and a pair of third regions 136a and 136b. The pair of second regions 134a and 134b face each other with the first region 132 interposed therebetween. The pair of third regions 136a and 136b faces each other. The third region 136a is interposed between the first region 132 and the second region 134a, and the third region 136b is interposed between the first region 132 and the second region 134b.

In the oxide semiconductor film 130, the first region 132 is a region including no dopant, and the pair of second regions 134a and 134b and the pair of third regions 136a and 136b are regions including a dopant. Further, the resistance of each of the pair of second regions 134a and 134b and the pair of third regions 136a and 136b is lower than the resistance of the first region 132, and the resistance of each of the pair of second regions 134a and 134b is lower than the resistance of each of the pair of third regions 136a and 136b. Therefore, the first region 132 overlapping with the gate electrode 117 serves as a channel formation region, and the pair of second regions 134a and 134b serves as a source region and a drain region.

As in the transistor 200, when the pair of second regions 134a and 134b and the pair of third regions 136a and 136b which are different from the pair of second regions 134a and 134b in resistance are provided in both ends of the first region 132 that is the channel formation region, an electric field can be gradually applied between the source region and the drain region of the oxide semiconductor film 130. In particular, electric field concentration in the vicinity of the drain region of the oxide semiconductor film 130 can be relieved, and therefore, the shift of threshold voltage or the like can be inhibited. Further, since the electric field concentration can be relieved, the transistor 200 can be inhibited from being damaged by the electric field concentration. Thus, the transistor 200 is a transistor which is improved in resistance to voltage and whose electrical characteristics are inhibited from deteriorating.

The oxide semiconductor film 130 includes the pair of second regions 134a and 134b and the pair of third regions 136a and 136b. That is, the resistances of regions in the oxide semiconductor film which are in contact with the source electrode and the drain electrode are reduced. Therefore, the contact resistance with the source electrode 127a and the drain electrode 127b is reduced, leading to improvement in field-effect mobility and on-state current of the transistor 200. Hence, the transistor 200 is a transistor having high on-state current characteristics and high field-effect mobility.

In a manner similar to that of Embodiment 1, also in the transistor 200, the insulating film to be processed into the gate insulating film 113 is formed in such a manner that oxygen contained in the oxide semiconductor film is not eliminated. Further, the insulating film is formed at a temperature lower than a temperature at which oxygen contained in the oxide semiconductor film is eliminated. For example, also in the transistor 200, the insulating film can be formed by a plasma CVD method using a microwave, and the insulating film can be processed to form the gate insulating film 113. Thus, generation of oxygen vacancies in the step of forming the gate insulating film 113 can be inhibited. Further, the insulating film formed by a plasma CVD method using a microwave is a dense film, and therefore, the gate insulating film 113 is also a dense film. Owing to this, oxygen contained in the oxide semiconductor film (the first region 132 in particular) can be inhibited from being released to the outside through the gate insulating film 113 (generation of oxygen vacancies can be inhibited) after the gate insulating film 113 is formed in a process of manufacturing the transistor 200. Thus, the transistor 200 has favorable electrical characteristics.

The thickness of the gate insulating film 113 is similar to that of the transistor 100 described in Embodiment 1.

Further, even when the gate insulating film 113 is formed thin (e.g., to a thickness of 20 nm or less) in order to miniaturize the transistor or to improve on-state current characteristics of the transistor, since the gate insulating film 113 is dense, oxygen contained in the oxide semiconductor film 120 can be inhibited from being eliminated and released to the outside through the gate insulating film 113 (generation of oxygen vacancies can be inhibited). Thus, the transistor 200 has favorable electrical characteristics.

The sidewall insulating film 119 may be formed by a formation method which can be used for the gate insulating film 113. That is, an insulating film to be processed into the sidewall insulating film 119 can also be formed so that oxygen contained in the oxide semiconductor film is not eliminated. Further, the insulating film can be formed at a temperature lower than a temperature at which oxygen contained in the oxide semiconductor film is eliminated. Therefore, also in the transistor 200, the insulating film can be formed by a plasma CVD method using a microwave, and the insulating film can be processed to form the sidewall insulating film 119. Thus, it is possible to inhibit the generation of oxygen vacancies in a step of forming the sidewall insulating film 119. Further, since the insulating film formed by a plasma CVD method using a microwave is a dense film, the sidewall insulating film 119 is also a dense film. Therefore, it is possible to inhibit oxygen contained in the oxide semiconductor film (the first region 132 in particular) from being released to the outside through the sidewall insulating film 119 after the sidewall insulating film 119 is formed in the process of manufacturing the transistor 200. Therefore, the transistor 200 has favorable electrical characteristics.

A method for manufacturing the transistor 200 is described with reference to drawings.

Figure 9A:
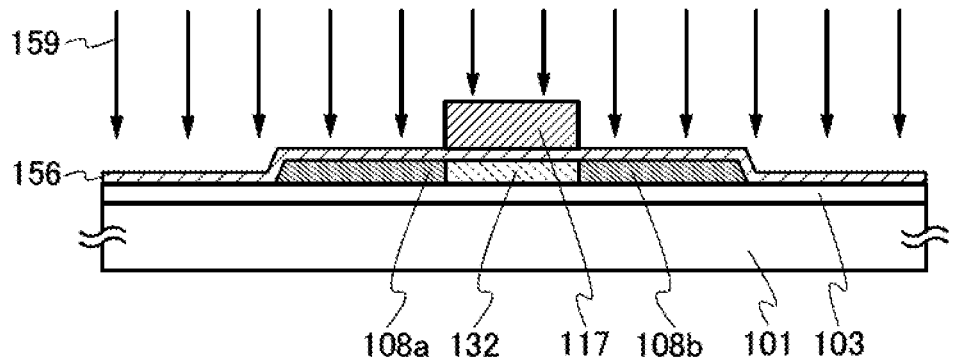
FIGS. 9A to 9D are cross-sectional views illustrating a method for manufacturing a transistor.

The base insulating film 103, the oxide semiconductor film 105, the insulating film 156, and the gate electrode 117 are formed over the substrate 101, and a dopant 159 is injected into the oxide semiconductor film 105 with the gate electrode 117 used as a mask to form the first region 132 and a pair of regions 108a and 108b (see FIG. 9A).

Steps of forming the base insulating film 103, the oxide semiconductor film 105, the insulating film 156, and the conductive film 157 to be processed into the gate electrode 117 are similar to those in Embodiment 1 (see FIG. 2 and FIGS. 5A to 5C). In particular, the detail of the step of forming the insulating film 156 is similar to that in Embodiment 1. For example, in forming the insulating film 156, it is preferable to employ a plasma CVD method using a microwave while the substrate 101 is kept at 200° C. to 400° C. inclusive, more preferably 300° C. to 350° C. inclusive by heating. The insulating film 156 is formed in this manner in order that oxygen is not eliminated from the oxide semiconductor film 105.

Further, in a manner similar to that in Embodiment 1, the conductive film 157 can be subjected to a photolithography step and an etching step to form the gate electrode 117.

As the dopant 159, one or more elements selected from boron, nitrogen, fluorine, aluminum, phosphorus, arsenic, indium, tin, antimony, and a rare gas element can be used. The dopant can be injected into the oxide semiconductor film 105 by an ion implantation method or an ion doping method.

Figure 9B:
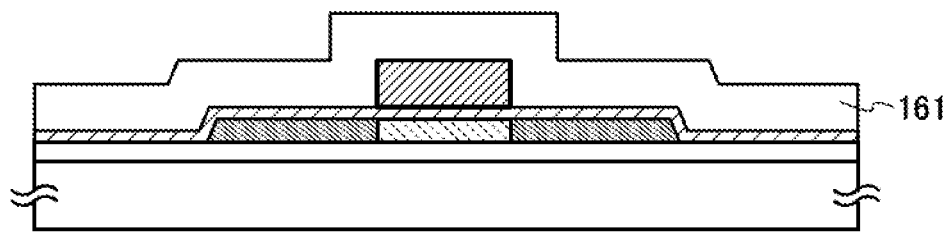

Next, an insulating film 161 to be processed into the sidewall insulating film 119 is formed over the insulating film 156 and the gate electrode 117 (see FIG. 9B).

As the insulating film 161, a nitride insulating film which can be used for the insulating film 156 or the base insulating film 103 can be used.

The insulating film 161 can be formed so that oxygen contained in the oxide semiconductor film including the first region 132 and the pair of regions 108a and 108b is not eliminated, preferably so that oxygen contained in the oxide semiconductor film is not eliminated. This can be implemented by forming the insulating film 161 at a temperature at which oxygen is inhibited from being eliminated from the oxide semiconductor film (in particular, the first region 132 serving as the channel formation region), preferably at a temperature lower than a temperature at which oxygen contained in the oxide semiconductor film is eliminated.

Specifically, a plasma CVD method using high frequency can be used for the formation; in particular, a plasma CVD method using a microwave may be used for the formation. For example, in forming the insulating film 161, it is preferable to employ a plasma CVD method using a microwave while the substrate 101 is kept at 200° C. to 400° C. inclusive, more preferably 300° C. to 350° C. inclusive, by heating. The insulating film 161 is formed in this manner in order that oxygen is not eliminated from the oxide semiconductor film including the first region 132 and the pair of regions 108a and 108b.

Figure 9C:
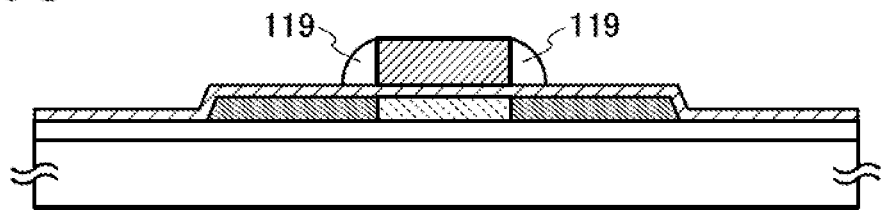

Next, the insulating film 161 is processed by anisotropic etching (etched anisotropically) such as an RIE method to form the sidewall insulating film 119 in contact with a side surface of the gate electrode 117 (see FIG. 9C).

Figure 9D:
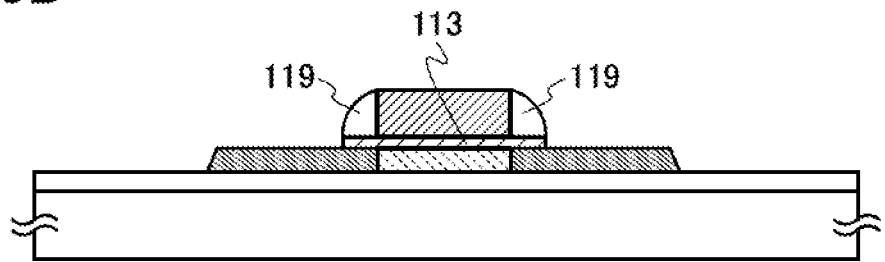

Next, the insulating film 156 is processed by anisotropic etching such as an RIE method with the gate electrode 117 and the sidewall insulating film 119 used as masks to form the gate insulating film 113 (see FIG. 9D). By the formation of the gate insulating film 113, the pair of regions 108a and 108b is partly exposed.

Figure 10A:
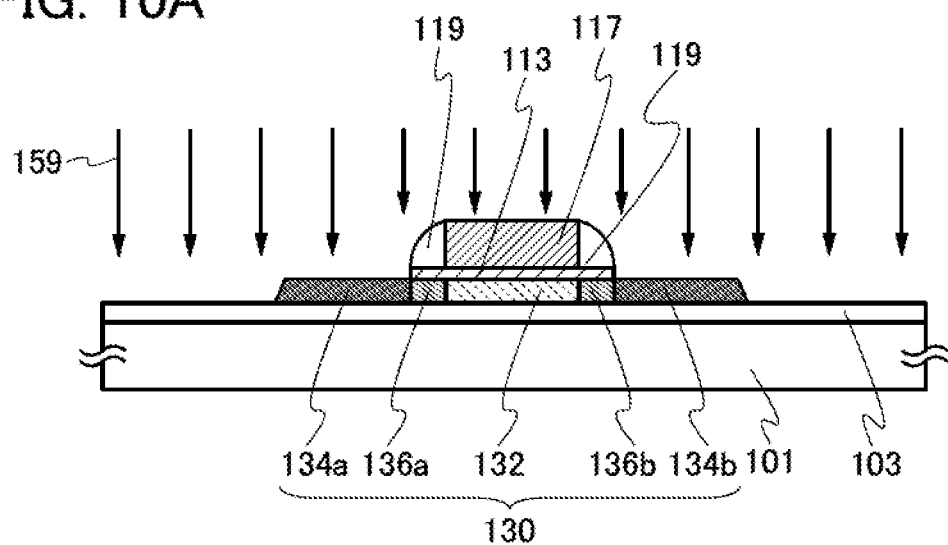
FIGS. 10A to 10C are cross-sectional views illustrating a method for manufacturing a transistor.

Next, the dopant 159 is injected into the oxide semiconductor film including the first region 132 and the pair of regions 108a and 108b with the gate electrode 117 and the sidewall insulating film 119 used as masks to form the pair of second regions 134a and 134b and the pair of third regions 136a and 136b (see FIG. 10A). A step of injecting the dopant 159 here can be performed in a manner similar to that described above.

Figure 10B:
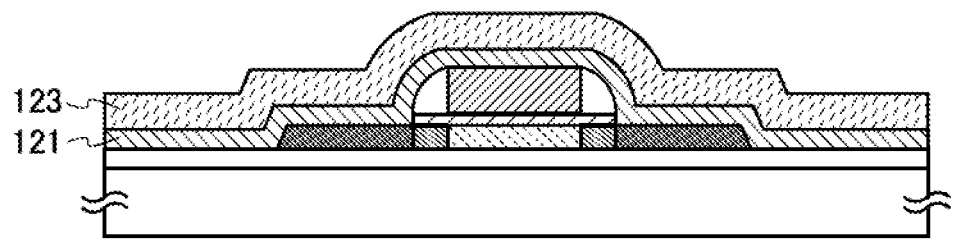

Next, the protective insulating film 121 is formed to cover the base insulating film 103, the oxide semiconductor film 130, the gate insulating film 113, the gate electrode 117, and the sidewall insulating film 119, and the interlayer insulating film 123 is formed over the protective insulating film 121 (see FIG. 10B).

The protective insulating film 121 and the interlayer insulating film 123 can be formed by a CVD method or a PVD method using an insulating film which can be used for the base insulating film 103.

Figure 10C:
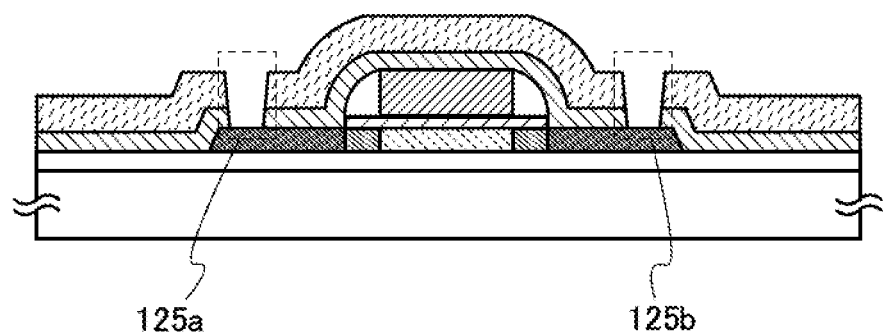

Next, the openings 125a and 125b reaching the oxide semiconductor film 130 are formed in the protective insulating film 121 and the interlayer insulating film 123 by a photolithography step and an etching step (see FIG. 10C). Then, a conductive film is formed in the openings 125a and 125b, and a photolithography step and an etching step are performed, whereby the source electrode 127a and the drain electrode 127b are formed (see FIG. 8B). The source electrode 127a and the drain electrode 127b also serve as a source wiring and a drain wiring, respectively. The conductive film may be formed in a manner similar to that of the conductive film 157 to be processed into the gate electrode 117.

In the process of manufacturing the transistor 200, heat treatment is preferably performed at least after the protective insulating film 121 is formed. The conditions of the heat treatment are similar to those in Embodiment 1.

As described above, when one or both of the gate insulating film and the sidewall insulating film in the transistor including an oxide semiconductor are formed by a plasma CVD method using a microwave at a temperature lower than a temperature at which oxygen contained in the oxide semiconductor film is eliminated, generation of oxygen vacancies due to elimination of oxygen contained in the oxide semiconductor film in the step of forming the gate insulating film or/and the step of forming the sidewall insulating film can be inhibited. Thus, a transistor in which at least the shift of a threshold voltage in the negative direction is inhibited and normally-on characteristics are thus improved can be manufactured.

Note that the structures, methods, and the like described in this embodiment can be used as appropriate in combination with any of the structures, methods, and the like described in the other embodiments and examples.

(Embodiment 3)

In this embodiment, a semiconductor device having a structure which is partly different from the structure of any of the semiconductor devices described in Embodiments 1 and 2, and a method for manufacturing the semiconductor device are described. Also in this embodiment, a transistor is employed as the semiconductor device.

Figure 11A:
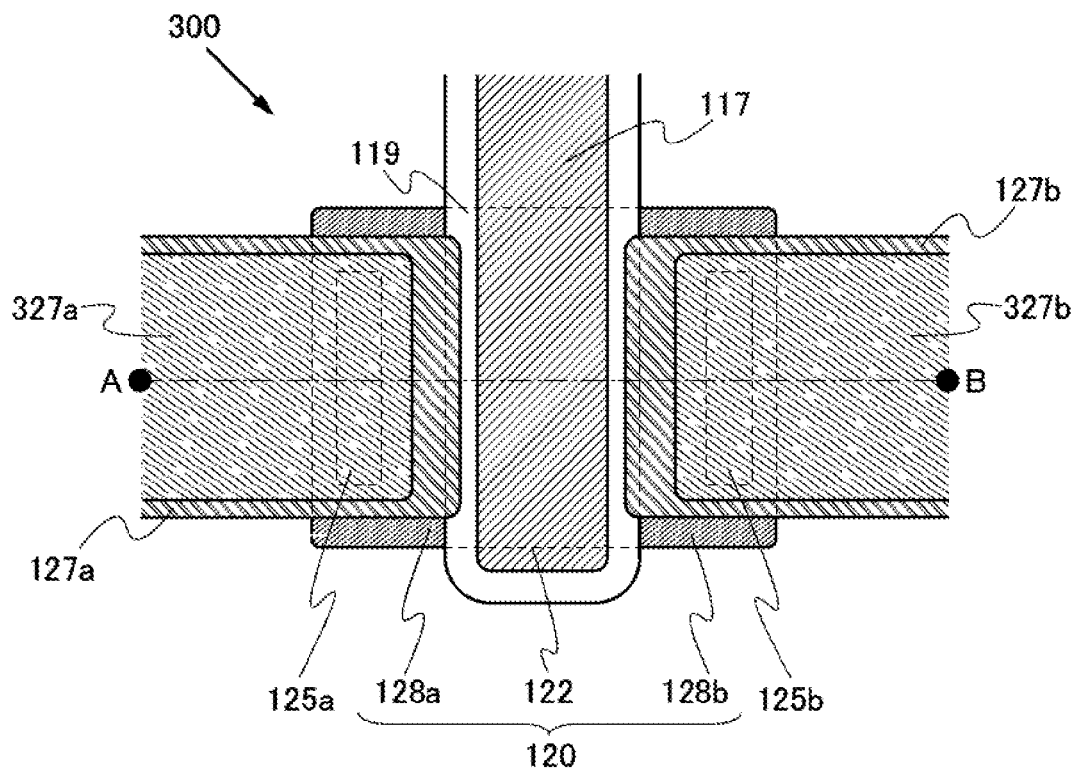
FIGS. 11A and 11B are a top view and a cross-sectional view which illustrate an example of a transistor.
Figure 11B:
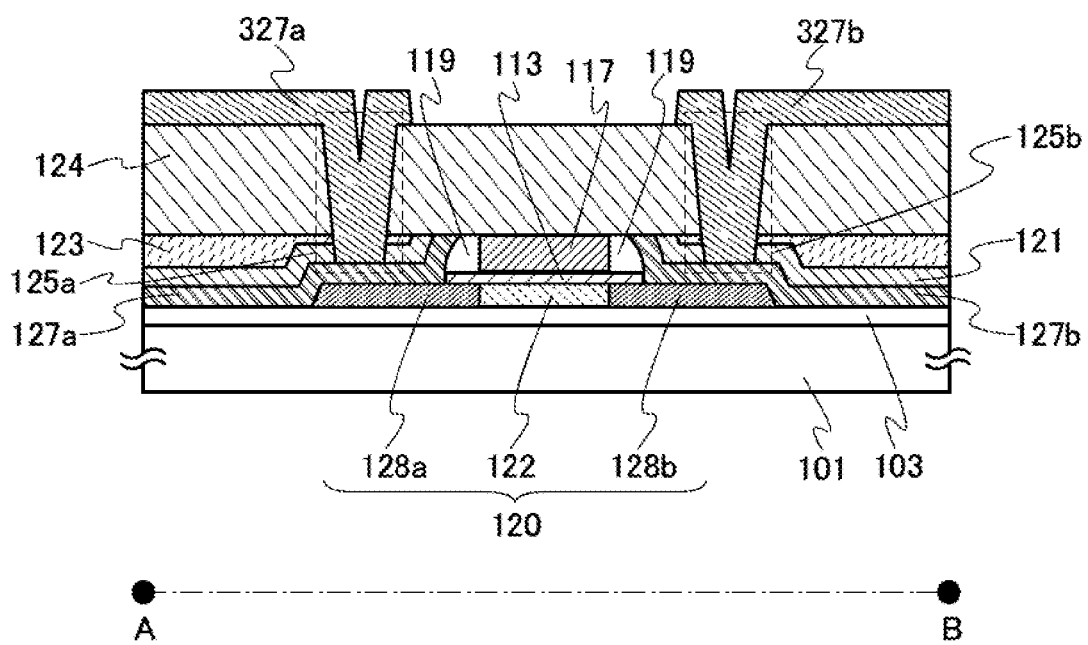

FIGS. 11A and 11B are a top view and a cross-sectional view of a transistor 300. FIG. 11A is a top view of the transistor 300, and FIG. 11B is a cross-sectional view taken along dashed-dotted line A-B in FIG. 11A. Note that in FIG. 11A, some of components of the transistor 300 (e.g., the substrate 101, the base insulating film 103, the gate insulating film 113, and the like) are omitted for simplicity.

As shown in FIGS. 11A and 11B, in the transistor 300, the base insulating film 103 is provided over the substrate 101; an oxide semiconductor film 120 is provided over the base insulating film 103; the gate insulating film 113 is provided over the oxide semiconductor film 120; the gate electrode 117 is provided in a region over the gate insulating film 113 which overlaps with the oxide semiconductor film 120; the sidewall insulating film 119 which is in contact with the gate insulating film 113 and the gate electrode 117 is provided; the source electrode 127a and the drain electrode 127b which are in contact with the base insulating film 103, a part of the oxide semiconductor film 120, the gate insulating film 113, and the sidewall insulating film 119 are provided; the protective insulating film 121 is provided over the source electrode 127a and the drain electrode 127b; the interlayer insulating film 123 and an interlayer insulating film 124 are provided over the protective insulating film 121; and a source wiring 327a and a drain wiring 327b which are in contact with the source electrode 127a and the drain electrode 127b are provided in the openings 125a and 125b formed in the protective insulating film 121, the interlayer insulating film 123, and the interlayer insulating film 124. Note that the base insulating film 103 and the interlayer insulating film 124 are not necessarily provided.

The transistor 300 is a top-gate transistor in which the gate electrode 117 is provided over the oxide semiconductor film 120.

In the transistor 300, the oxide semiconductor film 120 includes the first region 122 and the second regions 128a and 128b which face each other with the first region 122 interposed therebetween.

In the oxide semiconductor film 120, the first region 122 is a region including no dopant, and the pair of second regions 128a and 128b is regions including a dopant. Further, the resistance of each of the pair of second regions 128a and 128b is lower than the resistance of the first region 122. Therefore, the first region 122 overlapping with the gate electrode 117 serves as a channel formation region, and the pair of second regions 128a and 128b serves as a source region and a drain region.

The oxide semiconductor film 120 includes the pair of second regions 128a and 128b. That is, the resistances of regions in the oxide semiconductor film which are in contact with the source electrode and the drain electrode are reduced. Therefore, the contact resistance with the source electrode 127a and the drain electrode 127b is reduced, leading to improvement in field-effect mobility and on-state current of the transistor 300. Hence, the transistor 300 is a transistor having high on-state current characteristics and high field-effect mobility.

In a manner similar to those in Embodiment 1 and Embodiment 2, also in the transistor 300, the insulating film to be processed into the gate insulating film 113 is formed in such a manner that oxygen contained in the oxide semiconductor film is not eliminated. Further, the insulating film is formed at a temperature lower than a temperature at which oxygen contained in the oxide semiconductor film is eliminated. For example, also in the transistor 300, the insulating film can be formed by a plasma CVD method using a microwave, and the insulating film can be processed to form the gate insulating film 113. Thus, generation of oxygen vacancies in the step of forming the gate insulating film 113 can be inhibited. Further, the insulating film formed by a plasma CVD method using a microwave is a dense film, and therefore, the gate insulating film 113 is also a dense film. Owing to this, oxygen contained in the oxide semiconductor film 120 (the first region 122 in particular) can be inhibited from being released to the outside through the gate insulating film 113 (generation of oxygen vacancies can be inhibited) after the gate insulating film 113 is formed in a process of manufacturing the transistor 300. Thus, the transistor 300 has favorable electrical characteristics.

The thickness of the gate insulating film 113 is similar to that of the transistor 100 described in Embodiment 1.

Further, even when the gate insulating film 113 is formed thin (e.g., to a thickness of 20 nm or less) in order to miniaturize the transistor or to improve on-state current characteristics of the transistor, since the gate insulating film 113 is dense, oxygen contained in the oxide semiconductor film 120 can be inhibited from being eliminated and released to the outside through the gate insulating film 113 (generation of oxygen vacancies can be inhibited). Thus, the transistor 300 has favorable electrical characteristics.

A method for manufacturing the transistor 300 is described with reference to the drawings.

Figure 12A:
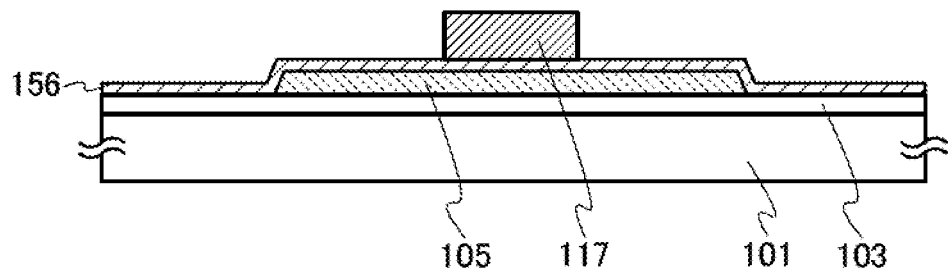
FIGS. 12A to 12D are cross-sectional views illustrating a method for manufacturing a transistor.

The base insulating film 103, the oxide semiconductor film 105, the insulating film 156, and the gate electrode 117 are formed over the substrate 101 (see FIG. 12A).

Steps of forming the base insulating film 103, forming the oxide semiconductor film 105, forming the insulating film 156, and forming the conductive film 157 to be processed into the gate electrode 117 are similar to those in Embodiment 1 (see FIG. 2 and FIGS. 5A to 5C). In particular, the detail of the step of forming the insulating film 156 is similar to that in Embodiment 1. For example, in forming the insulating film 156, it is preferable to employ a plasma CVD method using a microwave while the substrate 101 is kept at 200° C. to 400° C. inclusive, more preferably 300° C. to 350° C. inclusive, by heating. The insulating film 156 is formed in this manner in order that oxygen is not eliminated from the oxide semiconductor film 105.

Further, in a manner similar to that in Embodiment 1, the conductive film 157 can be subjected to a photolithography step and an etching step to form the gate electrode 117.

Figure 12B:
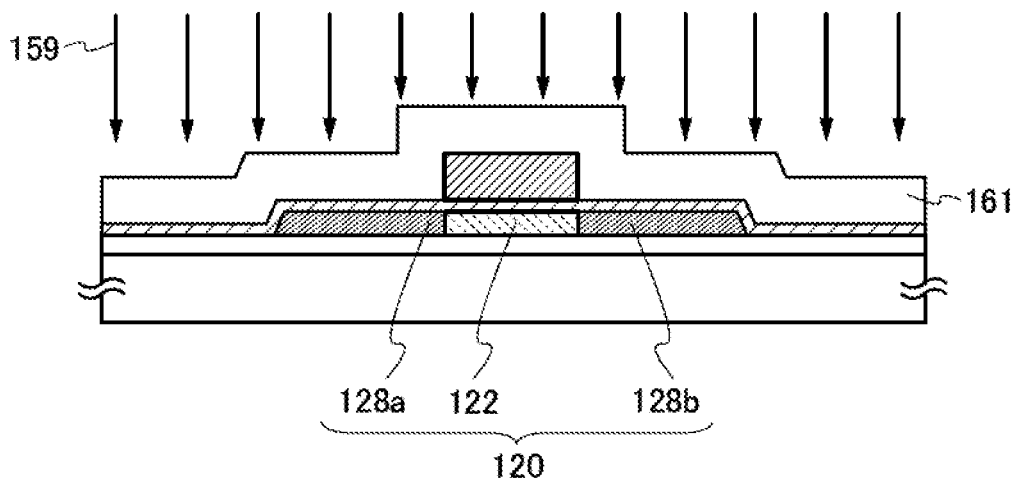

Next, the insulating film 161 to be processed into the sidewall insulating film 119 is formed over the insulating film 156 and the gate electrode 117, and the dopant 159 is injected into the oxide semiconductor film 105 with the gate electrode 117 used as a mask to form the oxide semiconductor film 120 including the first region 122 and the pair of second regions 128a and 128b (see FIG. 12B).

In a manner similar to that in Embodiment 1, the insulating film 161 is formed so that oxygen is not eliminated from the oxide semiconductor film 105. The detail of a step of forming the insulating film 161 is similar to that in Embodiment 1. In a manner similar to that in Embodiment 2, the insulating film 161 can be formed so that oxygen contained in the oxide semiconductor film including the first region 132 and the pair of regions 108a and 108b is not eliminated, preferably so that oxygen contained in the oxide semiconductor film is not eliminated. This can be implemented by forming the insulating film 161 at a temperature at which oxygen is inhibited from being eliminated from the oxide semiconductor film (in particular, the first region 132 serving as the channel formation region), preferably at a temperature lower than a temperature at which oxygen contained in the oxide semiconductor film is eliminated.

Specifically, a plasma CVD method using high frequency can be used for the formation; in particular, a plasma CVD method using a microwave may be used for the formation. For example, in forming the insulating film 161, it is preferable to employ a plasma CVD method using a microwave while the substrate 101 is kept at 200° C. to 400° C. inclusive, more preferably 300° C. to 350° C. inclusive by heating.

A step of injecting the dopant 159 is also similar to that in Embodiment 2. Note that, instead of performing an ion implantation method or an ion doping method to inject the dopant 159, plasma treatment or heat treatment may be performed in an atmosphere containing a dopant that reduces the resistance of the oxide semiconductor film to inject the dopant into the oxide semiconductor film.

Further, heat treatment may be performed after the dopant 159 is injected. The heat treatment is preferably performed at a temperature higher than or equal to 300° C. and lower than or equal to 700° C. (more preferably higher than or equal to 300° C. and lower than or equal to 450° C.) under an oxygen atmosphere, under a nitrogen atmosphere, under reduced pressure, or under the air (ultra dry air) for about 1 hour. The step of injecting the dopant by plasma treatment or heat treatment and the heat treatment performed after the dopant injection are also applicable to any of the transistors described in other embodiments.

The step of injecting the dopant 159 is not necessarily performed after the formation of the insulating film 161; the step of injecting the dopant 159 may be performed before the formation of the insulating film 161 which follows the formation of the gate electrode 117. Further, in a manner similar to that in Embodiment 2, the step of injecting the dopant 159 may be performed twice, so that regions containing the dopant may have a difference in resistance.

Figure 12C:
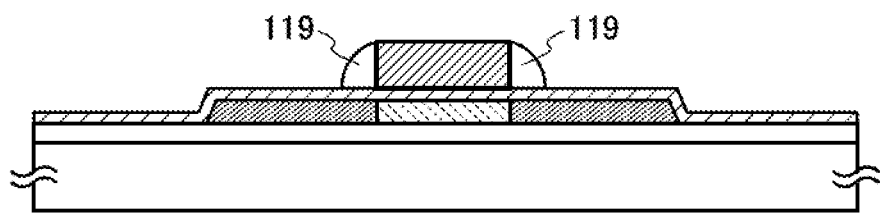

Next, the insulating film 161 is processed by anisotropic etching (etched anisotropically) such as an RIE method to form the sidewall insulating film 119 in contact with a side surface of the gate electrode 117 (see FIG. 12C).

Figure 12D:
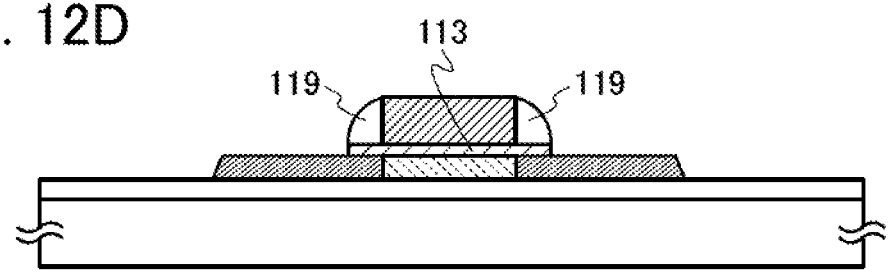

Next, the insulating film 156 is processed by anisotropic etching such as an RIE method with the gate electrode 117 and the sidewall insulating film 119 used as masks to form the gate insulating film 113 (see FIG. 12D). By the formation of the gate insulating film 113, the pair of second regions 128a and 128b is partly exposed.

Figure 13A:
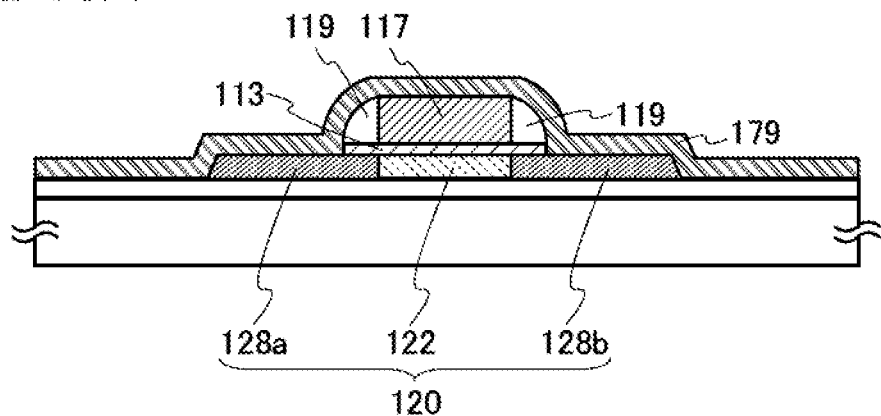
FIGS. 13A to 13C are cross-sectional views illustrating a method for manufacturing a transistor.

Next, a conductive film 179 to be processed into the source electrode 127a and the drain electrode 127b is formed over the base insulating film 103, the pair of second regions 128a and 128b, the gate insulating film 113, the gate electrode 117, and the sidewall insulating film 119 (see FIG. 13A). The conductive film 179 can be formed in a manner similar to that of the conductive film 157 to be processed into the gate electrode 117.

Figure 13B:
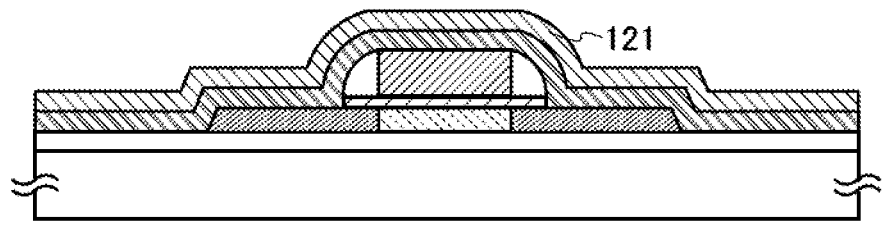
Figure 13C:
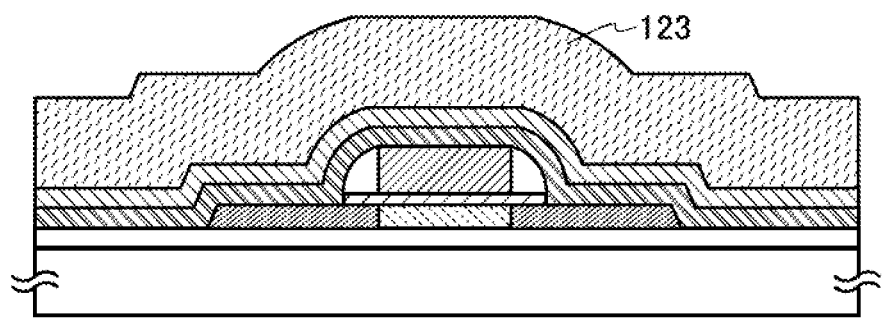

Next, the protective insulating film 121 is formed over the conductive film 179 (see FIG. 13B), and the interlayer insulating film 123 is formed over the protective insulating film 121 (see FIG. 13C).

The protective insulating film 121 and the interlayer insulating film 123 can be formed by a CVD method or a PVD method using an insulating film which can be used for the base insulating film 103. The protective insulating film 121 and the interlayer insulating film 123 may be formed by a formation method which is applicable to the gate insulating film 113. In detail, in a manner similar to that of the insulating film 156, the protective insulating film 121 and the interlayer insulating film 123 can be formed so that oxygen is not eliminated from the oxide semiconductor film or formed at a temperature lower than a temperature at which oxygen is eliminated from the oxide semiconductor film. The insulating film 161 can be formed by a plasma CVD method using high frequency or by a plasma CVD method using a microwave.

Note that also in any of the transistors described in other embodiments, the method for forming the gate insulating film 113 is applicable to the protective insulating film 121 and the interlayer insulating film 123; specifically, the protective insulating film 121 and the interlayer insulating film 123 can be formed in a manner similar to that of the insulating film 156.

Figure 14A:
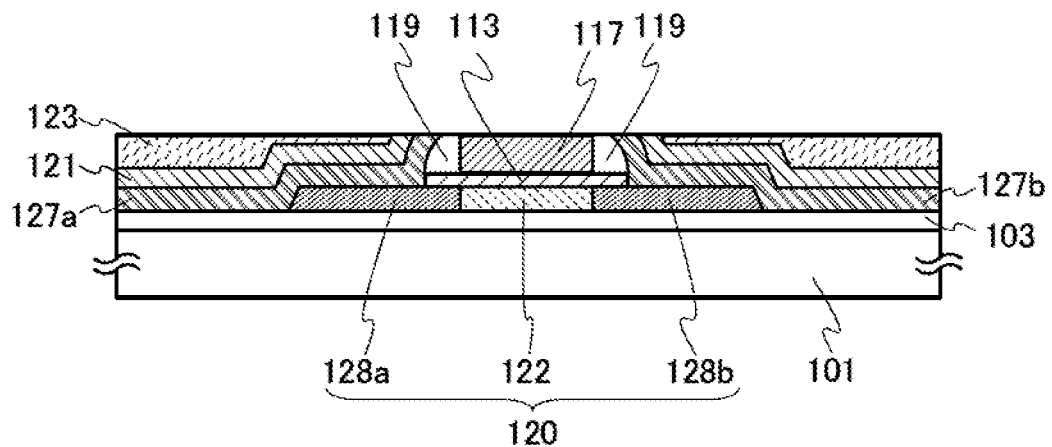
FIGS. 14A to 14C are cross-sectional views illustrating a method for manufacturing a transistor.

Next, at least the conductive film 179, the protective insulating film 121, and the interlayer insulating film 123 are subjected to polishing treatment such as a CMP method or etch-back treatment by dry etching, so that the gate electrode 117 is exposed (see FIG. 14A). By this treatment, the conductive film 179 can be processed into the source electrode 127a and the drain electrode 127b, and the protective insulating film 121 and the interlayer insulating film 123 are planarized. It is preferable that, in addition to the conductive film 179, the protective insulating film 121, and the interlayer insulating film 123, the gate electrode 117 and the sidewall insulating film 119 be partly removed so that the source electrode 127a and the drain electrode 127b are electrically insulated from each other. Note that the condition of the polishing treatment or the condition of the etch-back treatment is selected as appropriate in consideration of a material and a thickness of each of the conductive film 179, the protective insulating film 121, and the interlayer insulating film 123, and the like.

Figure 14B:
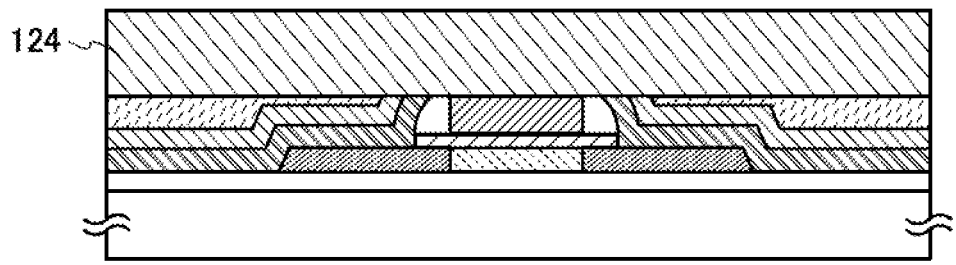

Next, the interlayer insulating film 124 is formed over the planarized protective insulating film 121, the planarized interlayer insulating film 123, the sidewall insulating film 119, and the gate electrode 117 (see FIG. 14B). Note that the interlayer insulating film 124 can be formed in a manner similar to that of the interlayer insulating film 123.

Figure 14C:
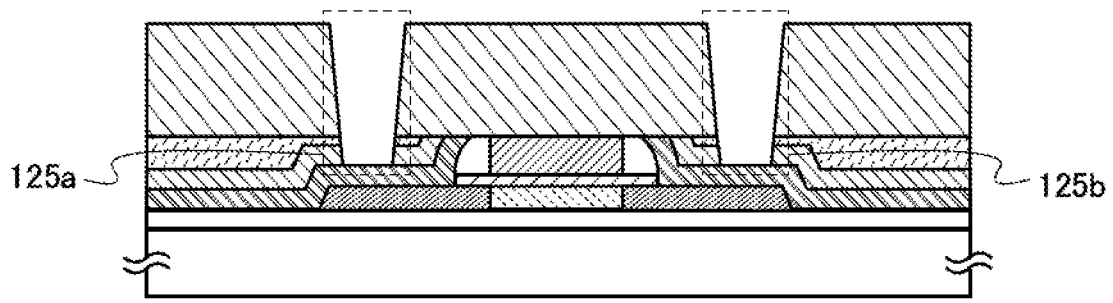

The openings 125a and 125b reaching the source electrode 127a and the drain electrode 127b are formed in the planarized protective insulating film 121, the planarized interlayer insulating film 123, and the interlayer insulating film 124 (see FIG. 14C). The source wiring 327a and the drain wiring 327b are formed in the opening 125a and the opening 125b, respectively. Thus, the transistor 300 can be manufactured (see FIG. 11B). Note that the source wiring 327a and the drain wiring 327b can be formed as follows: a conductive film is formed in a manner similar to that of the conductive film 157 to be processed into the gate electrode 117, and a photolithography step and an etching step are performed.

In the process of manufacturing the transistor 300, heat treatment is preferably performed at least after the protective insulating film 121 is formed. The condition of the heat treatment is similar to those in Embodiment 1.

As described above, when one or both of the gate insulating film and the sidewall insulating film in the transistor including an oxide semiconductor are formed by a plasma CVD method using a microwave at a temperature lower than a temperature at which oxygen contained in the oxide semiconductor film is eliminated, generation of oxygen vacancies due to elimination of oxygen contained in the oxide semiconductor film in the step of forming the gate insulating film or/and the step of forming the sidewall insulating film can be inhibited. Thus, a transistor in which at least the shift of a threshold voltage in the negative direction is inhibited and normally-on characteristics are thus improved can be manufactured.

Note that the structures, methods, and the like described in this embodiment can be used as appropriate in combination with any of the structures, methods, and the like described in the other embodiments and examples.

(Embodiment 4)

In this embodiment, a semiconductor device having a structure which is partly different from the structure of any of the semiconductor devices described in Embodiments 1 to 3, and a method for manufacturing the semiconductor device are described. Also in this embodiment, a transistor is employed as the semiconductor device.

Figure 15A:
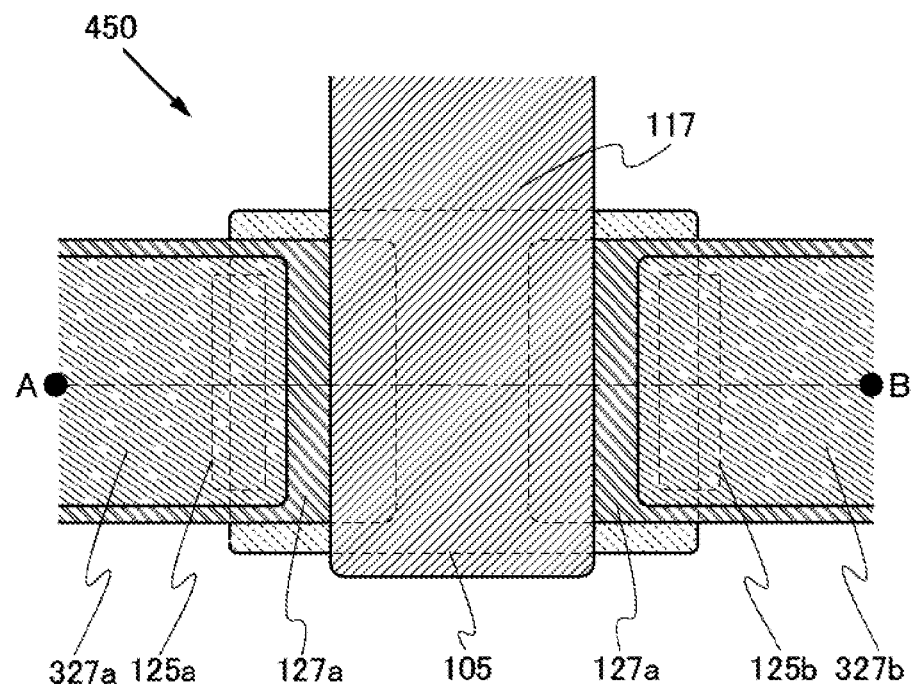
FIGS. 15A and 15B are a top view and a cross-sectional view which illustrate an example of a transistor.
Figure 15B:
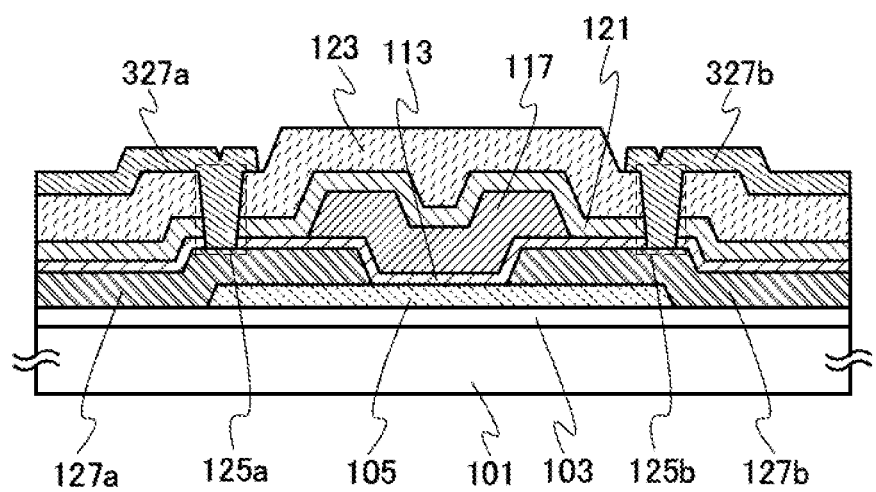

FIGS. 15A and 15B are a top view and a cross-sectional view of a transistor 450. FIG. 15A is a top view of the transistor 450, and FIG. 15B is a cross-sectional view taken along dashed-dotted line A-B in FIG. 15A. Note that in FIG. 15A, some of components of the transistor 450 (e.g., the substrate 101, the base insulating film 103, the gate insulating film 113, and the like) are omitted for simplicity.

As shown in FIGS. 15A and 15B, in the transistor 450, the base insulating film 103 is provided over the substrate 101; the oxide semiconductor film 105 is provided over the base insulating film 103; the source electrode 127a and the drain electrode 127b are provided in contact with the oxide semiconductor film 105; the gate insulating film 113 is provided over the oxide semiconductor film 105, the source electrode 127a, and the drain electrode 127b; the gate electrode 117 is provided over the gate insulating film 113 to overlap with a part of the oxide semiconductor film 105, a part of the source electrode 127a, and a part of the drain electrode 127b; the protective insulating film 121 is provided over the gate insulating film 113 and the gate electrode 117; the interlayer insulating film 123 is provided over the protective insulating film 121; and the source wiring 327a and the drain wiring 327b which are in contact with the source electrode 127a and the drain electrode 127b are provided in the openings 125a and 125b formed in the gate insulating film 113, the protective insulating film 121, and the interlayer insulating film 123. Note that the base insulating film 103 and the interlayer insulating film 124 are not necessarily provided.

The transistor 450 is a top-gate transistor in which the gate electrode 117 is provided over the oxide semiconductor film 105.

The oxide semiconductor film 105 includes a channel formation region, a source region, and a drain region.

In the transistor 450, the gate insulating film 113 is formed in such a manner that oxygen contained in the oxide semiconductor film 105 is not eliminated. Further, the gate insulating film 113 is formed at a temperature lower than a temperature at which oxygen contained in the oxide semiconductor film 105 is eliminated. For example, the gate insulating film 113 can be formed by a plasma CVD method using a microwave. Thus, generation of oxygen vacancies in the step of forming the gate insulating film 113 can be inhibited. Further, the insulating film formed by a plasma CVD method using a microwave is a dense film, and therefore, the gate insulating film 113 is also a dense film. Owing to this, oxygen contained in the oxide semiconductor film 105 can be inhibited from being released to the outside through the gate insulating film 113 (generation of oxygen vacancies can be inhibited) after the gate insulating film 113 is formed in a process of manufacturing the transistor 450. Thus, the transistor 450 has favorable electrical characteristics.

The thickness of the gate insulating film 113 is similar to that of the transistor 100 described in Embodiment 1.

Further, even when the gate insulating film 113 is formed thin (e.g., to a thickness of 20 nm or less) in order to miniaturize the transistor or to improve on-state current characteristics of the transistor, since the gate insulating film 113 is dense, oxygen contained in the oxide semiconductor film 105 can be inhibited from being eliminated and released to the outside through the gate insulating film 113 (generation of oxygen vacancies can be inhibited). Thus, the transistor 450 has favorable electrical characteristics.

A method for manufacturing the transistor 450 is described. The transistor 450 can be manufactured by appropriately changing the order of steps in the method for manufacturing the transistor described in any of Embodiments 1 to 3. Here, the order of steps of manufacturing the transistor 450 is described. Note that for the detail of each step, the description in other embodiments can be referred to.

In a manner similar to that in any of Embodiments 1 to 3, the base insulating film 103 and the oxide semiconductor film 154 are formed over the substrate 101 (see FIG. 5A). Next, the oxide semiconductor film 105 is formed (see FIG. 5B). Next, the conductive film 157 is formed over the base insulating film 103 and the oxide semiconductor film 105, and the conductive film 157 is processed to form the source electrode 127a and the drain electrode 127b (not shown). Next, the gate insulating film 113 is formed so that oxygen contained in the oxide semiconductor film 105 is not eliminated (not shown). Next, a conductive film is formed over the gate insulating film 113 and processed to form the gate electrode 117 (not shown). Next, the protective insulating film 121 is formed over the gate insulating film 113 and the gate electrode 117 (not shown). Next, the interlayer insulating film 123 is formed over the protective insulating film 121 (not shown). Next, the openings 125a and 125b reaching the source electrode 127a and the drain electrode 127b are formed in the gate insulating film 113, the protective insulating film 121, and the interlayer insulating film 123, and a conductive film is formed in the openings 125a and 125b and processed to form the source wiring 327a and the drain wiring 327b (see FIG. 15B).

Note that in a manner similar to that in any of Embodiments 1 to 3, heat treatment is preferably performed at least after the protective insulating film 121 is formed. The condition of the heat treatment is similar to that in any of Embodiments 1 to 3.

Here, a transistor 500 in which the gate electrode 117 overlaps with only the oxide semiconductor film and a dopant is injected into a part of the oxide semiconductor film in the transistor 450 is described.

Figure 16A:
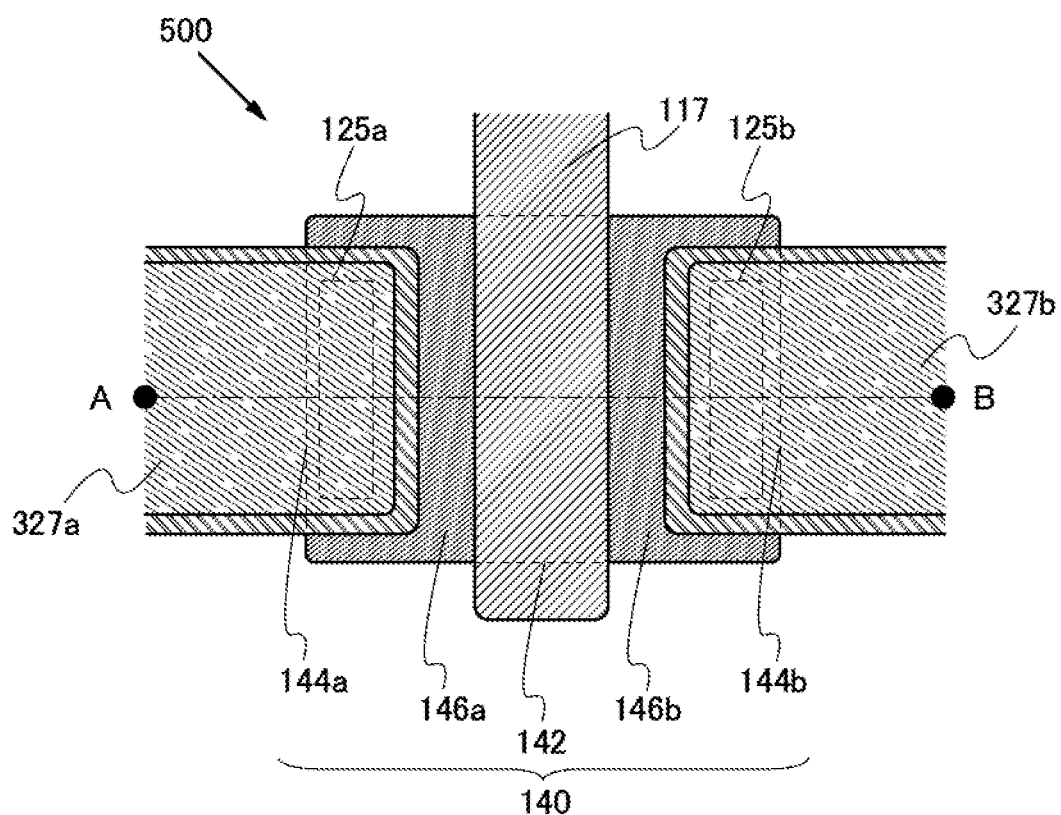
FIGS. 16A and 16B are a top view and a cross-sectional view which illustrate an example of a transistor.
Figure 16B:
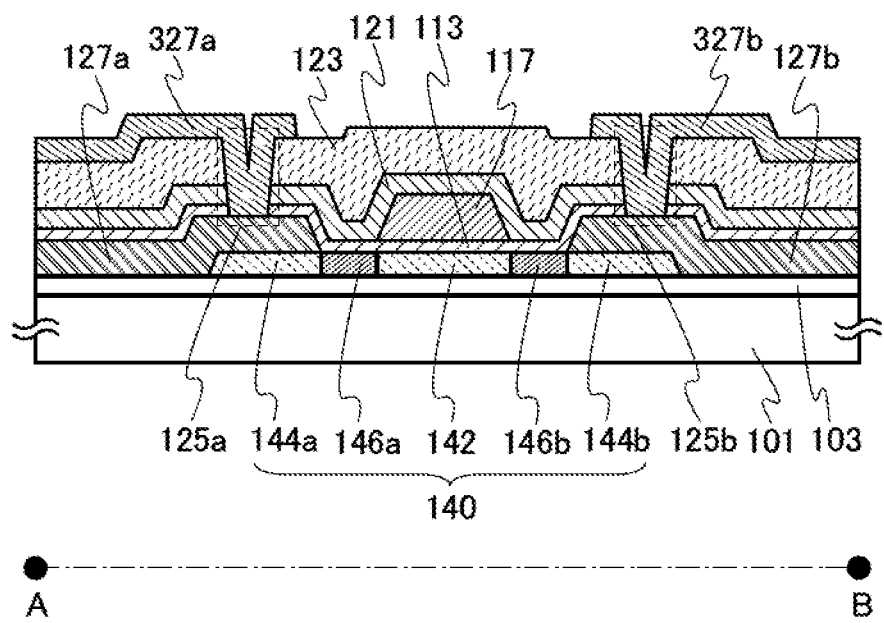

FIGS. 16A and 16B are a top view and a cross-sectional view of the transistor 500. FIG. 16A is a top view of the transistor 500, and FIG. 16B is a cross-sectional view taken along dashed-dotted line A-B in FIG. 16A. Note that in FIG. 16A, some of components of the transistor 500 (e.g., the substrate 101, the base insulating film 103, the gate insulating film 113, and the like) are omitted for simplicity.

The transistor 500 has a structure such that the oxide semiconductor film 105 in the transistor 450 is replaced with an oxide semiconductor film 140 (see FIGS. 15A and 15B and FIGS. 16A and 16B).

The transistor 500 is a top-gate transistor in which the gate electrode 117 is provided over the oxide semiconductor film 140.

The oxide semiconductor film 140 includes a first region 142, a pair of second regions 144a and 144b, and a pair of third regions 146a and 146b. The pair of second regions 144a and 144b face each other with the first region 142 interposed therebetween. The pair of third regions 146a and 146b faces each other. The third region 146a is interposed between the first region 142 and the second region 144a, and the third region 146b is interposed between the first region 142 and the second region 144b.

The first region 142 and the pair of second regions 144a and 144b are regions including no dopant. The pair of third regions 146a and 146b includes a dopant. The first region 142 serves as a channel formation region, and the pair of second regions 144a and 144b are in contact with the source electrode 127a and the drain electrode 127b. Thus, the resistance of a region in the vicinity of the interface between the second region 144a and the source electrode 127a and the resistance of a region in the vicinity of the interface between the second region 144b and the drain electrode 127b are probably reduced. Therefore, the pair of second regions 144a and 144b serves as a source region and a drain region.

The transistor 500 includes low-resistant regions into which a dopant is injected, such as the pair of third regions 146a and 146b. That is, the resistance of a part of a region in the oxide semiconductor film is reduced, leading to improvement in field-effect mobility and on-state current of the transistor 500. Hence, the transistor 500 is a transistor having high on-state current characteristics and high field-effect mobility.

In the transistor 500, the gate insulating film 113 can be formed in a manner similar to that of the transistor 450. Thus, generation of oxygen vacancies in the step of forming the gate insulating film 113 can be inhibited. Further, oxygen contained in the oxide semiconductor film can be inhibited from being released to the outside through the gate insulating film 113 (generation of oxygen vacancies can be inhibited) after the gate insulating film 113 is formed in a process of manufacturing the transistor 500. Thus, the transistor 500 has favorable electrical characteristics.

A method for manufacturing the transistor 500 is described. The transistor 500 can be manufactured by appropriately changing the order of steps in the method for manufacturing the transistor described in any of Embodiments 1 to 3. Here, the order of steps of manufacturing the transistor 500 is described. Note that for the detail of each step, the description in other embodiments can be referred to.

In a manner similar to that in any of Embodiments 1 to 3, the base insulating film 103 and the oxide semiconductor film 154 are formed over the substrate 101 (see FIG. 5A). Next, the oxide semiconductor film 105 is formed (see FIG. 5B). Next, the conductive film 157 is formed over the base insulating film 103 and the oxide semiconductor film 105, and the conductive film 157 is processed to form the source electrode 127a and the drain electrode 127b (not shown). Next, the gate insulating film 113 is formed so that oxygen contained in the oxide semiconductor film 105 is not eliminated (not shown). Next, a conductive film is formed over the gate insulating film 113 and processed to form the gate electrode 117 (not shown). Next, the dopant is injected into the oxide semiconductor film 105 with the gate electrode 117, the source electrode 127a, and the drain electrode 127b used as masks to form the oxide semiconductor film 140 (not shown). After that, steps are performed in a manner similar to those in the process of manufacturing the transistor 450 shown in FIGS. 15A and 15B; thus, the transistor 500 can be manufactured (see FIG. 16B).

Note that in a manner similar to that in any of Embodiments 1 to 3, heat treatment is preferably performed at least after the protective insulating film 121 is formed. The condition of the heat treatment is similar to that in any of Embodiments 1 to 3.

As described above, by formation of the gate insulating film in the transistor including an oxide semiconductor by a plasma CVD method using a microwave at a temperature lower than a temperature at which oxygen contained in the oxide semiconductor film is eliminated, it is possible to inhibit generation of oxygen vacancies due to elimination of oxygen contained in the oxide semiconductor film in the step of forming the gate insulating film. Thus, a transistor in which at least the shift of a threshold voltage in the negative direction is inhibited and normally-on characteristics are thus improved can be manufactured.

Note that the structures, methods, and the like described in this embodiment can be used as appropriate in combination with any of the structures, methods, and the like described in the other embodiments and examples.

(Embodiment 5)

In this embodiment, a semiconductor device having a structure which is partly different from the structure of any of the semiconductor devices described in Embodiments 1 to 4, and a method for manufacturing the semiconductor device are described. Also in this embodiment, a transistor is employed as the semiconductor device. Here, although this embodiment is described using a transistor having the same structure as the transistor 300 described in Embodiment 3, this embodiment is applicable to any of the other embodiments as appropriate.

Figure 17A:
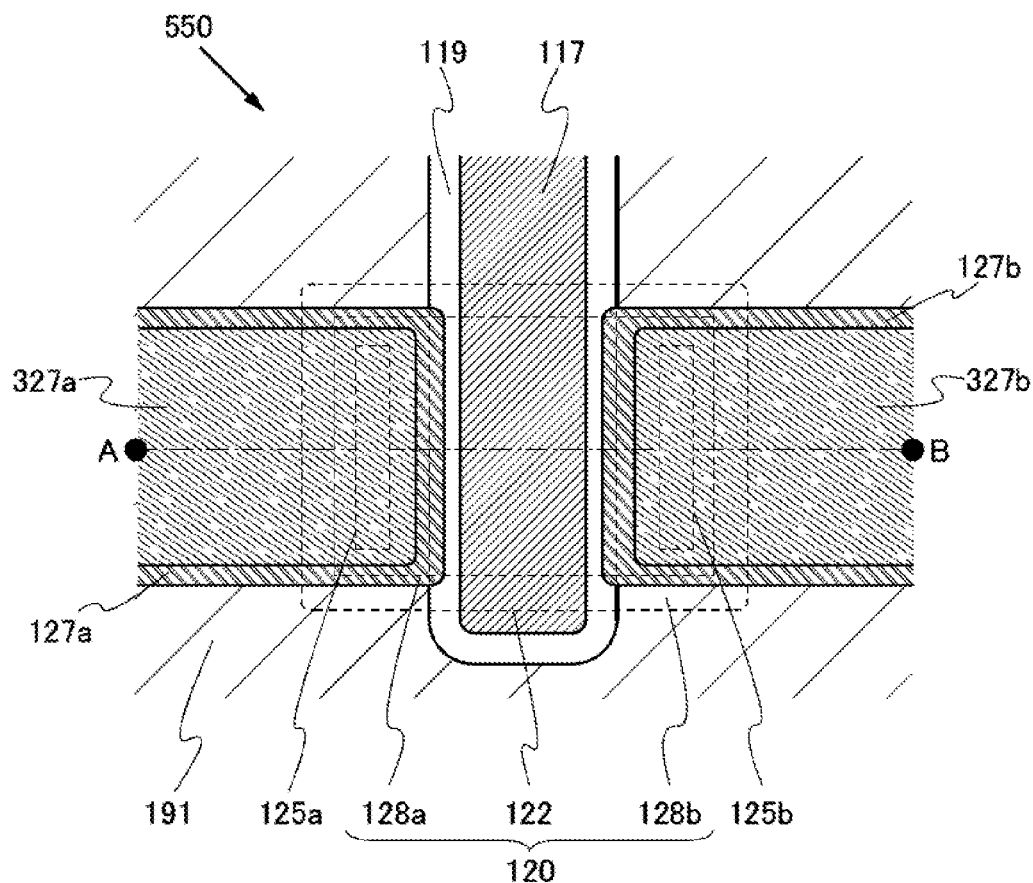
FIGS. 17A and 17B are a top view and a cross-sectional view which illustrate an example of a transistor.
Figure 17B:
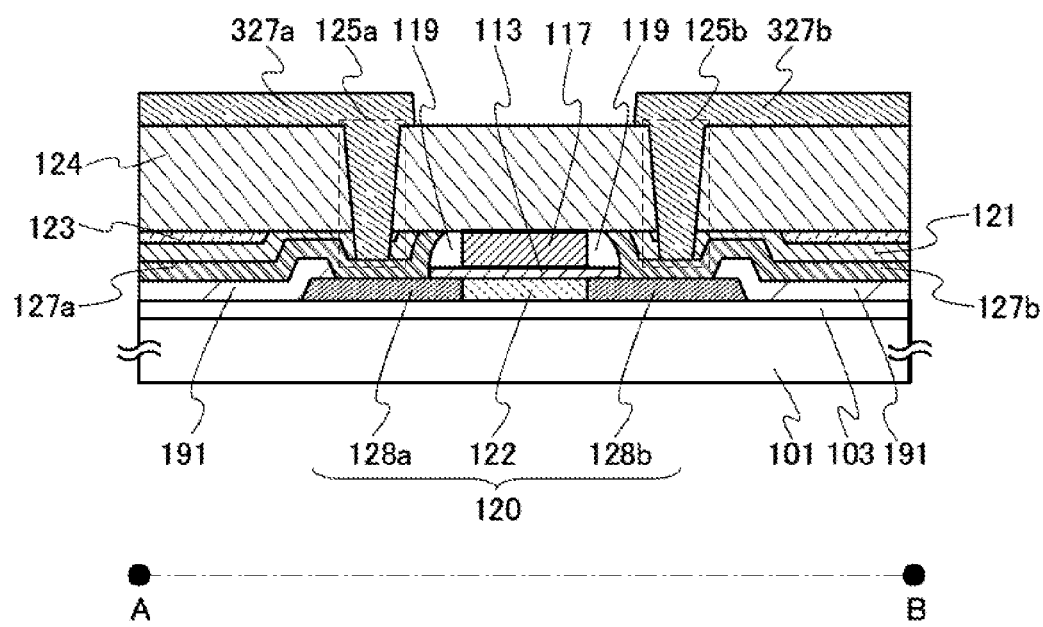

FIGS. 17A and 17B are a top view and a cross-sectional view of a transistor 550. FIG. 17A is a top view of the transistor 550, and FIG. 17B is a cross-sectional view taken along dashed-dotted line A-B in FIG. 17A. Note that in FIG. 17A, some of components of the transistor 550 (e.g., the substrate 101, the base insulating film 103, the gate insulating film 113, the protective insulating film 121, the interlayer insulating film 123, and the like) are omitted for simplicity.

The transistor 550 shown in FIGS. 17A and 17B is different from any of the transistors described in Embodiments 1 to 4 in that the oxide semiconductor film 120 is provided over the base insulating film 103 and a protective insulating film 191 covering the edge portion of the oxide semiconductor film 120 is provided. For the other components of the transistor, the components of the transistors described in any of Embodiment 1 to 4 can be used as appropriate.

In the transistor 550, one or both of the gate insulating film 113 and the sidewall insulating film 119 are formed so that oxygen contained in the oxide semiconductor film 105 is not eliminated. Further, one or both of the gate insulating film 113 and the sidewall insulating film 119 are formed at a temperature lower than a temperature at which oxygen contained in the oxide semiconductor film 105 is eliminated. The gate insulating film 113 can be formed by a plasma CVD method using a microwave. Thus, generation of oxygen vacancies in the oxide semiconductor film 105 in the step of forming the gate insulating film 113 or/and the step of forming the sidewall insulating film 119 can be inhibited. Further, the insulating film formed by a plasma CVD method using a microwave is a dense film, and therefore, one or both of the gate insulating film 113 and the sidewall insulating film 119 are dense. Owing to this, oxygen contained in the oxide semiconductor film 105 can be inhibited from being released to the outside through the gate insulating film 113 (generation of oxygen vacancies can be inhibited) after one or both of the gate insulating film 113 and the sidewall insulating film 119 are formed in a process of manufacturing the transistor 550. Thus, the transistor 550 has favorable electrical characteristics.

The protective insulating film 191 is formed using an insulating film which can be used for the base insulating film 103 of the transistor 100 described in Embodiment 1.

The protective insulating film 191 relieves an electric field applied to the edge portion of the oxide semiconductor film 120. For this reason, the thickness of the protective insulating film 191 is preferably five times as large as the thickness of the gate insulating film 113 and is typically 25 nm to 1000 nm inclusive, preferably 100 nm to 1000 nm inclusive. In order to maintain the insulating property between the oxide semiconductor film 120, and the source and the drain electrodes 127a and 127b, the protective insulating film 191 preferably covers at least the side surface of the oxide semiconductor film 120, and further, the protective insulating film 191 covers the side surface and the parts of the top surfaces of the oxide semiconductor film 120. At this time, the protective insulating films 191 cover regions of the top surface of the oxide semiconductor film 120 in a range of 10 nm or more and 500 nm or less from the side surface, preferably 20 nm or more and 300 nm or less from the side surface, further preferably 50 nm or more and 200 nm or less from the side surface. As a result, the electric field applied to the edge portion of the oxide semiconductor film 120 owing to the gate electrode 117 can be relieved, and in addition, the insulating property between the oxide semiconductor film 120, and the source and the drain electrodes 127a and 127b can be maintained.

Since the protective insulating film 191 covers the edge portion of the oxide semiconductor film 120, the side surface of the oxide semiconductor film 120 does not contact the source electrode 127a and the drain electrode 127b; thus, generation of leakage current which flows through the side surface of the oxide semiconductor film 120 can be inhibited.

Next, a method for manufacturing the transistor 550 shown in FIGS. 17A and 17B is described. The transistor shown in FIGS. 17A and 17B is manufactured as follows. After the steps of FIGS. 5A and 5B in Embodiment 1 are performed, an insulating film to be processed into the protective insulating films 191 later is formed by a CVD method, a PVD method, or the like over the base insulating film 103 and the oxide semiconductor film 105. Then, the insulating film is subjected to a photolithography step and an etching step to form the protective insulating film 191.

Note that the protective insulating film 191 can be formed by a lift-off method in which, before the insulating film to be the protective insulating film 191 is formed, a mask is formed over the oxide semiconductor film 105, and after the insulating film to be the protective insulating film 191 is formed, the mask is removed.

After that, the protective insulating film 191 and the oxide semiconductor film 105 are exposed to oxygen plasma, whereby the corner of the protective insulating film 191 can be selectively etched, oxygen can be added to the oxide semiconductor film 105 and the protective insulating film 191, and the edge portion of the protective insulating film 191 can be curved. The edge portions of the protective insulating film 191 are preferably curved because the coverage with the gate insulating film 113 to be formed later can be improved and therefore breaking of the gate insulating film 113 can be reduced.

Steps after the above are performed in a manner similar to those in Embodiment 3. Thus, the transistor 550 shown in FIGS. 17A and 17B can be formed.

As described above, when one or both of the gate insulating film and the sidewall insulating film in the transistor including an oxide semiconductor are formed by a plasma CVD method using a microwave at a temperature lower than a temperature at which oxygen contained in the oxide semiconductor film is eliminated, generation of oxygen vacancies due to elimination of oxygen contained in the oxide semiconductor film in the step of forming the gate insulating film or/and the step of forming the sidewall insulating film can be inhibited. Thus, a transistor in which at least the shift of a threshold voltage in the negative direction is inhibited and normally-on characteristics are thus improved can be manufactured.

(Embodiment 6)

In this embodiment, the oxide semiconductor film which can be used for any of the transistors described in Embodiments 1 to 5 (see FIGS. 1A and 1B, FIGS. 7A and 7B, FIGS. 8A and 8B, FIGS. 11A and 11B, FIGS. 15A and 15B, FIGS. 16A and 16B, and FIGS. 17A and 17B), and a method for manufacturing the oxide semiconductor film are described.

In any of the transistors described in Embodiments 1 to 5, a material for the oxide semiconductor film may be an In-M-Zn-based oxide, for example. Here, a metal element M is an element whose bond energy with oxygen is higher than that of In and that of Zn. Alternatively, the metal element M is an element which has a function of suppressing elimination of oxygen from the In-M-Zn-based oxide. Owing to the effect of the metal element M, generation of oxygen vacancies in the oxide semiconductor film is inhibited. Note that oxygen vacancies in the oxide semiconductor film generate carriers in some cases. Therefore, the effect of the metal element M inhibits an increase in off-state current due to an increase in the carrier density of the oxide semiconductor film. Therefore, change in electrical characteristics of the transistor, which is caused by oxygen vacancies, can be reduced; thus, a highly reliable transistor can be obtained.

The metal element M can be, specifically, Al, Sc, Ti, V, Cr, Mn, Fe, Co, Ni, Ga, Ge, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. For the metal element M, one or more elements may be selected from the above elements. Further, Si may be used instead of the metal element M.

For example, as the In-M-Zn-based oxide, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

With the use of any of the above materials, the oxide semiconductor film 154 (see FIG. 5A) can be formed. The thickness of the oxide semiconductor film 154 can be 1 nm to 200 nm inclusive, preferably 5 nm to 40 nm inclusive.

The oxide semiconductor film 154 can be formed by a sputtering method; alternatively, the oxide semiconductor film 154 can be formed by a molecular beam epitaxy (MBE) method or a pulse laser deposition (PLD) method. The oxide semiconductor film 154 may be formed with a sputtering apparatus which performs deposition in the state where top surfaces of a plurality of substrates are substantially perpendicular to a top surface of a sputtering target.

It is preferable that a high-purity gas from which an impurity such as hydrogen, water, a hydroxyl group, or hydride is removed be used as a sputtering gas for the formation of the oxide semiconductor film 154.

In forming the oxide semiconductor film 154 by a sputtering method, the substrate 101 is held in a deposition chamber which is maintained under reduced pressure. Then, a sputtering gas from which hydrogen and moisture are removed is introduced into the deposition chamber while moisture remaining therein is removed, and the oxide semiconductor film 154 is formed over the substrate 101 with the use of the above target. In order to remove moisture remaining in the deposition chamber, an entrapment vacuum pump such as a cryopump, an ion pump, or a titanium sublimation pump is preferably used. As an exhaust unit, a turbo molecular pump to which a cold trap is added may be used. A hydrogen atom, a compound containing a hydrogen atom, such as water ($H_2O$) (and also preferably a compound containing a carbon atom), or the like is removed from the deposition chamber while reduced pressure is maintained with the cryopump, thereby reducing the concentration of impurities contained in the oxide semiconductor film 154 formed in the deposition chamber.

The base insulating film 103 and the oxide semiconductor film 154 are preferably formed in succession without exposure to the air. By the successive formation of the base insulating film 103 and the oxide semiconductor film 154 without exposure to the air, impurities such as hydrogen and moisture can be prevented from being adsorbed onto a surface of the base insulating film 103.

In any of the transistors described in Embodiments 1 to 5, oxygen vacancies and hydrogen in the oxide semiconductor film lead to poor electrical characteristics of the transistor.

In the process of manufacturing the transistor described in any of Embodiments 1 to 5, in addition to the heat treatment performed after the formation of the protective insulating film 121, heat treatment may be further performed as appropriate. For example, heat treatment can be performed after the formation of the oxide semiconductor film 154, after the processing into the oxide semiconductor film 105, or before the formation of the conductive film 157 which follows the formation of the insulating film 156. By the heat treatment performed in this manner in the process of manufacturing the transistor, hydrogen contained in the oxide semiconductor film can be removed. The condition of the heat treatment is higher than or equal to 300° C. and lower than or equal to 700° C., or lower than the strain point of the substrate. The period of time for the heat treatment can be set as appropriate, and the heat treatment can be performed under reduced pressure, under a nitrogen atmosphere, under an oxygen atmosphere, under a rare gas atmosphere, or the like.

By the heat treatment, impurities such as hydrogen can be removed from the oxide semiconductor film (channel formation region in particular) contained in the transistor, whereby the oxide semiconductor film can be highly purified. Specifically, the concentration of hydrogen in the oxide semiconductor film (channel formation region in particular) can be lower than $5 \times 10^{18}$ atoms/cm$^3$, preferably lower than or equal to $5 \times 10^{17}$ atoms/cm$^3$. Note that the hydrogen concentration is measured by SIMS.

In any of the transistors described in Embodiments 1 to 5, the oxide semiconductor film can be an oxide semiconductor film having crystallinity, such as single crystal or polycrystal, or an amorphous oxide semiconductor film. The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in carrier mobility, due to the grain boundary, is suppressed.

In each of the crystal parts included in the CAAC-OS film, the c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°. Nitrogen may be substituted for part of constituent oxygen of the oxide semiconductor.

In the CAAC-OS film, distribution of crystal parts is not necessarily uniform. For example, in the formation process of the CAAC-OS film, in the case where crystal growth occurs from a surface side of the oxide semiconductor film, the proportion of crystal portions on the surface of the oxide semiconductor film is sometimes higher than that on the surface where the oxide semiconductor film is formed. Further, when an impurity is added to the CAAC-OS film, the crystal part in a region to which the impurity is added becomes amorphous in some cases.

Since the c-axes of the crystalline portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystalline portion is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

The oxide semiconductor film has a wider band gap than a silicon film by approximately 1 eV to 2 eV. For that reason, in the transistor including an oxide semiconductor, impact ionization is unlikely to occur and avalanche breakdown is unlikely to occur. That is, it can be said that, in the transistor, hot-carrier degradation is unlikely to occur.

As described above, carriers are unlikely to be generated in the oxide semiconductor film; accordingly, the channel region can be completely depleted by an electric field of the gate electrode even in the case where the oxide semiconductor film has a large thickness (for example, 15 nm or more). Therefore, in the transistor including an oxide semiconductor, an increase in off-state current and a change in threshold voltage due to a punch-through phenomenon are not caused. When the channel length is, for example, 3 μm, the off-state current can be lower than $1 \times 10^{-21}$ A or lower than $1 \times 10^{-24}$ A per micrometer of channel width at room temperature.

The oxygen vacancies in the oxide semiconductor film which are a factor of generating carriers can be measured by electron spin resonance (ESR). That is, an oxide semiconductor film with few oxygen vacancies can be referred to as an oxide semiconductor film which does not have a signal due to oxygen vacancies evaluated by ESR. Specifically, the spin density attributed to oxygen vacancies in the oxide semiconductor film is lower than or equal to $1.5 \times 10^{18}$ spins/cm$^3$, preferably lower than or equal to $1 \times 10^{17}$ spins/cm$^3$, or the spin density in the oxide semiconductor film is lower than or equal to the lower limit of detection. When the oxide semiconductor film has oxygen vacancies, a signal having symmetry is found at a g value of around 1.93 in ESR.

Further, in order to improve the electrical characteristics of the transistor, it is preferable to use the oxide semiconductor film having oxygen with a higher proportion than a proportion of oxygen in the stoichiometric composition; after the oxide semiconductor film is formed, oxygen ions are preferably injected into the oxide semiconductor film by an ion implantation method or an ion doping method. This is because, by injection of oxygen ions, oxygen vacancies in the oxide semiconductor film can be filled, and interface state density between the oxide semiconductor film and the insulating film can be reduced.

There are two methods for obtaining the CAAC-OS film. In the first method, the temperature of an object on which the oxide semiconductor film is to be formed is kept at a temperature higher than or equal to 200° C. and lower than or equal to 500° C. by heating to form the oxide semiconductor film. In the second method, a thin oxide semiconductor film is formed and then heat treatment is performed at a temperature higher than or equal to 200° C. and lower than or equal to 700° C. In the second method, after the thin oxide semiconductor film is formed, the heat treatment is performed at a temperature higher than or equal to 200° C. and lower than or equal to 700° C., and an oxide semiconductor film is formed thereover to form a CAAC-OS film.

From the above, by using the oxide semiconductor film described in this embodiment for any of the transistors described in Embodiments 1 to 5, a transistor having favorable electrical characteristics can be manufactured.

Note that the structures, methods, and the like described in this embodiment can be used as appropriate in combination with any of the structures, methods, and the like described in the other embodiments and examples.

(Embodiment 7)

In this embodiment, the insulating film which can be used for any of the transistors described in Embodiments 1 to 5, and a method for manufacturing the insulating film are described. The insulating film is specifically any of the base insulating film 103, the gate insulating film 113, the protective insulating film 121, the protective insulating film 191, the interlayer insulating film 123, the interlayer insulating film 124, and the like.

In the process of manufacturing the transistor described in any of Embodiments 1 to 5, oxygen contained in the oxide semiconductor film might be eliminated by heating the oxide semiconductor film, whereby oxygen vacancies are generated in some cases. Further, the base insulating film, the gate insulating film, and the protective insulating film are in contact with the oxide semiconductor film. Thus, an insulating film having an effect of filling the oxygen vacancies is preferably used for one or more of the base insulating film, the gate insulating film, the protective insulating film, and the interlayer insulating film.

The insulating film having an effect of filling the oxygen vacancies is preferably an insulating film containing oxygen and an insulating film which releases part of oxygen by heating. Specifically, the insulating film is preferably an insulating film such that the amount of released oxygen which is converted into oxygen atoms is greater than or equal to $1.0 \times 10^{18}$ cm$^{-3}$, more preferably greater than or equal to $3.0 \times 10^{20}$ cm$^{-3}$, in thermal desorption spectroscopy (TDS) analysis.

A method for quantifying the amount of released oxygen which is converted into oxygen atoms, with the use of TDS analysis is described below.

The amount of released gas in TDS analysis is proportional to the time integral value of a spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to Formula I with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2} = \frac{N_{H2}}{S_{H2}} \times S_{O2} \times \alpha \qquad \text{[Formula 1]}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient affecting the intensity of the spectrum in the TDS analysis. Japanese Published Patent Application No. H6-275697 can be referred to for details of Formula I. Note that the above value of the amount of released oxygen is obtained by measurement with a thermal desorption spectrometer produced by ESCO Ltd., EMD-WA1000S/W using a silicon wafer containing hydrogen atoms at $1 \times 10^{16}$ cm$^{-2}$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen when converted into oxygen atoms is twice the number of the released oxygen molecules.

As described above, the insulating film which releases part of oxygen by heating and the insulating film such that the amount of released oxygen which is converted into oxygen atoms in TDS analysis is in the above-described range are given. Examples of such an insulating film include an insulating film having oxygen with a higher proportion than in the stoichiometric composition, such as a silicon oxynitride film containing oxygen excessively or a silicon oxide (SiO$_x$ (x>2)) film containing oxygen excessively. The silicon oxide (SiO$_x$ (x>2)) film containing oxygen excessively is a film of which the number of oxygen atoms per unit volume is more than twice the number of silicon atoms per unit volume. The number of silicon atoms and the number of oxygen atoms per unit volume are measured by Rutherford backscattering spectrometry.

The insulating film having oxygen with a higher proportion than a proportion of oxygen in the stoichiometric composition can be formed in such a manner that, for example, an ion implantation method or an ion doping method is used to inject oxygen ions to an insulating film (silicon oxide, silicon oxynitride, or the like) formed by a plasma CVD method. Instead of an ion implantation method or an ion doping method, plasma treatment may be performed under an oxygen atmosphere to inject oxygen ions to the insulating film.

Note that the insulating film to which oxygen ions are injected may be formed by a plasma CVD method using a microwave which is described in Embodiment 1, whereby a dense insulating film can be formed, and an interface between the insulating film and the oxide semiconductor film can have favorable characteristics (for example, interface state density is reduced). Therefore, a transistor which has favorable electrical characteristics can be manufactured.

From the above, by using the insulating film having an effect of filling the oxygen vacancies in the oxide semiconductor film for one or more of the base insulating film, the gate insulating film, and the interlayer insulating film, the oxygen vacancies generated during the process of manufacturing the transistor can be filled by heat treatment or the like and thus a transistor which has favorable electrical characteristics can be manufactured.

Note that by employing a plasma CVD method using a microwave which is described in Embodiment 1, an insulating film with a higher proportion than a proportion of oxygen in the stoichiometric composition can be formed. In that case, oxygen ions are not necessarily injected by any of the above methods. Therefore, yield can be improved, transistors can be manufactured with higher productivity, and the manufacturing cost of transistors can be reduced. Note that when the insulating film formed by a plasma CVD method using a microwave is made to further have oxygen with a higher proportion than a proportion of oxygen in the stoichiometric composition, oxygen ions can be injected by any of the above methods.

Further, hydrogen contained in the base insulating film, the gate insulating film, the protective insulating film, and the interlayer insulating film might be diffused into the oxide semiconductor film (channel formation region in particular) in the process of manufacturing the transistor, which might reduce the resistance of the oxide semiconductor film and lead to poor electrical characteristics of the transistor. Therefore, hydrogen is preferably reduced as much as possible in the base insulating film, the gate insulating film, and the interlayer insulating film. In order that hydrogen is reduced as mush as possible, the insulating film formed is subjected to heat treatment or alternatively, hydrogen is contained as little as possible in the formation process. The condition of the heat treatment is higher than or equal to 300° C. and lower than or equal to 700° C., or lower than the strain point of the substrate. The period of time for the heat treatment can be set as appropriate, and the heat treatment can be performed under reduced pressure, under a nitrogen atmosphere, under an oxygen atmosphere, under a rare gate atmosphere, or the like.

In the case of using the oxide semiconductor film having crystallinity such as single crystal or polycrystal or the CAAC-OS film in any of the transistors described in Embodiments 1 to 5, the surface flatness of the oxide semiconductor film is enhanced, whereby the transistor having higher field-effect mobility than that using an amorphous oxide semiconductor film can be manufactured. To enhance the surface flatness of the oxide semiconductor film, the oxide semiconductor film is preferably formed over a flat surface (the substrate or the base insulating film). Specifically, the oxide semiconductor film is preferably formed over a surface with an average surface roughness ($R_a$) less than or equal to 0.15 nm, preferably less than or equal to 0.1 nm.

Note that, $R_a$ is obtained by expanding arithmetic mean surface roughness, which is defined by JIS B 0601: 2001 (ISO4287: 1997), into three dimensions so as to be applied to a curved surface. In addition, $R_a$ can be expressed as "an average value of the absolute values of deviations from a reference surface to a specific surface" and is defined by the formula below.

$$R_a = \frac{1}{S_0} \int_{y_1}^{y_2} \int_{x_1}^{x_2} |f(x, y) - Z_0| dx dy \qquad \text{[Formula 2]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Further, $S_0$ represents the area of a rectangle which is obtained by projecting the specific surface on the x-y plane, and $Z_0$ represents the height of the reference surface (the average height of the specific surface). $R_a$ can be measured using an atomic force microscope (AFM).

In order that the surface where the oxide semiconductor film is to be formed have an average surface roughness in the above-described range, planarization treatment may be performed on the surface; for example, polishing treatment such as a CMP method, dry etching treatment, or plasma treatment may be performed.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate or the surface of the base insulating film.

As the planarization treatment, polishing treatment, dry etching treatment, or plasma treatment may be performed plural times, or these treatments may be performed in combination. In the case where the treatments are combined, there is no particular limitation on the order of steps and the order may be set as appropriate depending on the roughness of the surface where the oxide semiconductor film is to be formed.

In any of the transistors described in Embodiments 1 to 5, the protective insulating film (the protective insulating film 121) is preferably formed using an insulating film which can be used for the base insulating film, more preferably formed using a dense inorganic insulating film. As the dense inorganic insulating film, gallium oxide, hafnium oxide, yttrium oxide, aluminum oxide, or aluminum oxynitride is given. For example, a dense (film density is 3.2 g/cm$^3$ or more, preferably 3.6 g/cm$^3$ or more) aluminum oxide film is used, thereby obtaining an effect of inhibiting impurities such as moisture in the outside air from entering the oxide semiconductor film, and further, obtaining an effect of preventing oxygen contained in the components of the transistor from being released to the outside of the transistor. Thus, the protective insulating film serves as a barrier film which prevents moisture from being mixed into the oxide semiconductor film (the channel formation region in particular) or the like, and further, serves as a barrier film which prevents release of oxygen which is a main component material of the oxide semiconductor film, in the process of manufacturing the transistor and after the manufacture. Therefore, with the use of the protective insulating film, a transistor having favorable electrical characteristics can be manufactured. Note that the film density can be measured by Rutherford backscattering spectrometry (RBS) or X-ray reflection (XRR).

Note that the interlayer insulating film can be formed using a material which can be used for the base insulating film, an organic material such as polyimide, an acrylic resin, or a benzocyclobutene-based resin, or even a low-dielectric constant material (low-k material) or the like. In the case where the organic material is used, the interlayer insulating film can be formed by a wet process such as a spin coating method or a printing method.

From the above, by using the insulating film described in this embodiment for any of the transistors described in Embodiments 1 to 5, a transistor having favorable electrical characteristics can be manufactured.

Note that the structures, methods, and the like described in this embodiment can be used as appropriate in combination with any of the structures, methods, and the like described in the other embodiments and examples.

Embodiment 8)

In this embodiment, the gate electrode, the source electrode (the source wiring), and the drain electrode (the drain wiring) which can be used for any of the transistors described in Embodiments 1 to 5 are described.

In any of the transistors described in Embodiments 1 to 5, the gate electrode (or the conductive film to be processed into the gate electrode) can be formed using a metal material such as molybdenum, titanium, tantalum, tungsten, aluminum, copper, neodymium, scandium or chromium, or an alloy material including any of these materials. Alternatively, the gate electrode may be formed using a conductive metal oxide material. As the conductive metal oxide, indium oxide ($In_2O_3$), tin oxide ($SnO_2$), zinc oxide (ZnO), indium tin oxide ($In_2O_3$—$SnO_2$), indium zinc oxide ($In_2O_3$—ZnO), or any of these metal oxide materials in which silicon or a silicon oxide is included can be used. Further, the gate electrode may be formed using a conductive metal nitride material which is a nitride of any of the above metal materials or the alloy material.

The gate electrode may be formed with a single-layer structure or a stacked structure using any of the above materials. Examples thereof include the following: a two-layer structure in which a titanium film is stacked over an aluminum film; a two-layer structure in which a titanium film is stacked over a tungsten film; a two-layer structure in which a copper film is stacked over a copper-magnesium-aluminum alloy film; a two-layer structure in which a tungsten film is stacked over a tantalum nitride film; a two-layer structure in which a tungsten film is stacked over a tungsten nitride film; and a three-layer structure in which a titanium film is formed, an aluminum film is stacked over the titanium film to overlap with the titanium film, and further, a titanium film is stacked thereover. Note that a transparent conductive material containing indium oxide, tin oxide, or zinc oxide may be used.

Note that the thickness of the gate electrode, the source electrode (the source wiring), and the drain electrode (the drain wiring) can be selected as appropriate in consideration of desired resistivity or the like without particular limitation.

Further, an In—Ga—Zn-based oxide film containing nitrogen, an In—Sn-based oxide film containing nitrogen, an In—Ga-based oxide film containing nitrogen, an In—Zn-based oxide film containing nitrogen, a tin oxide film containing nitrogen, an indium oxide film containing nitrogen, or a metal nitride film (an indium nitride film, a zinc nitride film, a tantalum nitride film, a tungsten nitride film, or the like) is preferably provided between the gate electrode and the gate insulating film. These films each have a work function of 5 eV or higher, preferably 5.5 eV or higher, and thus the threshold voltage of the transistor can be positively shifted; consequently, the transistor can be what is called a normally-off transistor. For example, in the case of using the In—Ga—Zn-based oxide film containing nitrogen, an In—Ga—Zn-based oxide film having a nitrogen concentration at least higher than that of the oxide semiconductor film 105 is used; specifically, an In—Ga—Zn-based oxide film in which the proportion of nitrogen atoms is higher than or equal to 7 at. % is used.

The source electrode (the source wiring) and the drain electrode (the drain wiring) can be formed in a manner similar to that of the gate electrode. Further, the source electrode (the source wiring) and the drain electrode (the drain wiring) may each have a stacked structure in which a metal material such as aluminum or copper is provided and a high-melting-point metal such as titanium, molybdenum, or tungsten, or a metal nitride material of any of these metals (titanium nitride, molybdenum nitride, or tungsten nitride) is provided on either or both the bottom surface and the top surface of the metal material.

From the above, by using the gate electrode, the source electrode (source wiring), and the drain electrode (drain wiring) which are described in this embodiment for any of the transistors described in Embodiments 1 to 5, a transistor having favorable electrical characteristics can be manufactured.

Note that the structures, methods, and the like described in this embodiment can be used as appropriate in combination with any of the structures, methods, and the like described in the other embodiments and examples.

(Embodiment 9)

In this embodiment, a semiconductor device which is one embodiment of the present invention will be described. Note that a memory element (memory cell) is described in this embodiment as an example of a semiconductor device, using the reference numerals used in the above embodiments as appropriate.

The semiconductor device includes a first transistor formed using a single crystal semiconductor substrate, a second transistor formed using a semiconductor film, and a capacitor. The second transistor and the capacitor are provided above the first transistor with an insulating film positioned therebetween.

Semiconductor materials and structures of the first transistor and the second transistor, which are stacked, may be the same as or different from each other. Described here is an example in which transistors with materials and structures suitable for a circuit of the semiconductor device are used as the first transistor and the second transistor.

Any of the transistors described in the above embodiments can be used as the second transistor. Note that the layered structure and connection relations of the first transistor and the capacitor are changed as appropriate depending on the structure of the transistor used as the second transistor. In this embodiment, an example in which the transistor 600 is used as the second transistor is described.

Figure 18A:
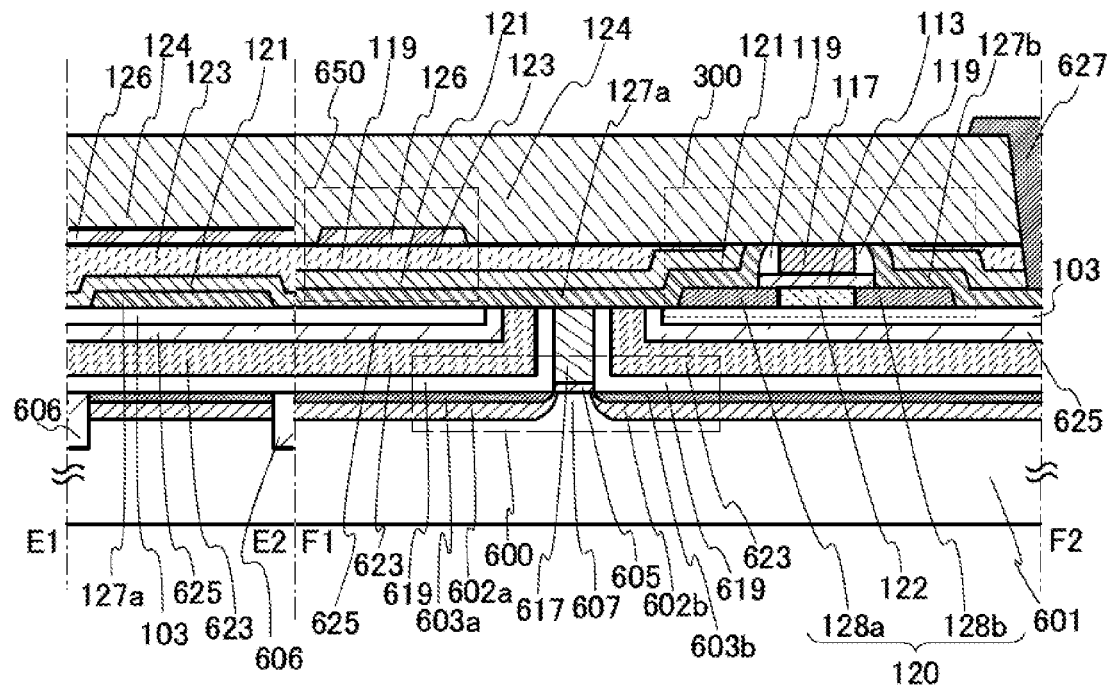
FIGS. 18A to 18C are a cross-sectional view, a top view, and a circuit diagram which illustrate an example of a semiconductor device.
Figure 18B:
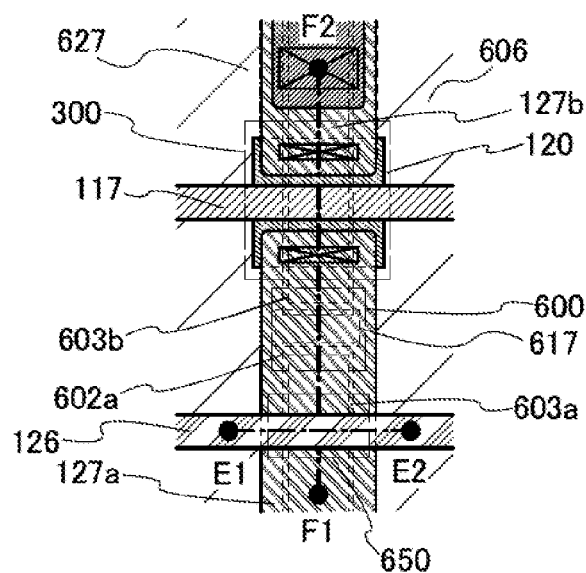
Figure 18C:
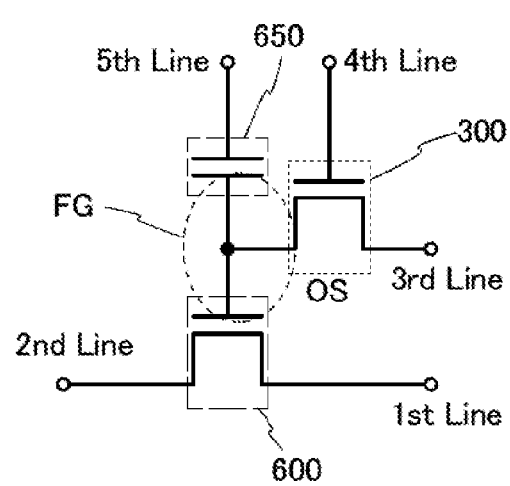

FIGS. 18A to 18C illustrate an example of the structure of the semiconductor device. FIG. 18A illustrates a cross section of the semiconductor device, and FIG. 18B illustrates a plan view of the semiconductor device. FIG. 18A corresponds to a cross section along line E1-E2 and line F1-F2 in FIG. 18B. Note that in FIG. 18B, some components of the semiconductor device (e.g., a substrate 601, an insulating film 619, an insulating film 623, an insulating film 625, the base insulating film 103, the gate insulating film 113, and the sidewall insulating film 119) are omitted for simplicity. "OS" in FIGS. 18A to 18C indicates that any of the transistors described in the above embodiments can be applied to the transistor using an oxide semiconductor film in the semiconductor device.

FIG. 18C illustrates an example of a circuit diagram of the semiconductor device. The semiconductor device illustrated in FIGS. 18A and 18B includes a transistor 600 including a first semiconductor material in a lower portion, and the transistor 300 including a second semiconductor material and a capacitor 650 in an upper portion. Such materials and structures are suitable for the semiconductor device. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material can operate at sufficiently high speed. Alternatively, an organic semiconductor material or the like may be used as the semiconductor material other than an oxide semiconductor. A transistor including an oxide semiconductor enables charge to be held for a long time owing to its characteristics.

A method for manufacturing the semiconductor device in FIGS. 18A to 18C is described with reference to FIGS. 18A to 18C.

The transistor 600 includes a channel formation region 607 provided in the substrate 601 containing a semiconductor material (e.g., silicon), impurity regions 602a and 602b provided so that the channel formation region 607 is provided therebetween, intermetallic compound regions 603a and 603b in contact with the impurity regions 602a and 602b, a gate insulating film 605 provided over the channel formation region 607, and a gate electrode 617 provided over the gate insulating film 605.

As the substrate 601 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate in which a semiconductor film is provided over an insulating substrate such as a glass substrate with an insulating film positioned therebetween.

As a method for forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor film is formed over an insulating surface by crystal growth; and the like.

For example, ions are added through one surface of a single crystal semiconductor substrate, an embrittlement layer is formed at a certain depth from the one surface of the single crystal semiconductor substrate, and an insulating film is formed on the one surface of the single crystal semiconductor substrate or over an element substrate. Heat treatment is performed in a state where the single crystal semiconductor substrate and the element substrate are bonded to each other with the insulating film interposed therebetween, so that a crack is generated in the embrittlement layer and the single crystal semiconductor substrate is separated along the embrittlement layer. Thus, a single crystal semiconductor film, which is separated from the single crystal semiconductor substrate, is formed as a semiconductor film over the element substrate. An SOI substrate formed by the above method can also be favorably used.

Over the substrate 601, an element isolation insulating film 606 is provided so as to surround the transistor 600 (see FIG. 18B). Note that for high integration, it is preferable that the transistor 600 not be provided with a sidewall insulating film. On the other hand, when the electric characteristics of the transistor 600 have priority, a sidewall insulating film may be formed on a side surface of the gate electrode 617 so that the impurity regions include regions having different impurity concentrations.

The transistor 600 including a single crystal semiconductor substrate can operate at high speed. Thus, when the transistor 600 is used as a reading transistor, data can be read at a high speed. A plurality of insulating films is formed so as to cover the transistor 600. As treatment prior to formation of the transistor 300 and the capacitor 650, CMP treatment is performed on the plurality of insulating films, whereby the insulating films 623 and 625 that are planarized are formed and, at the same time, the base insulating film 103 functioning as a base insulating film of the transistor 300 is formed and an upper surface of the gate electrode 617 is exposed.

As each of the insulating films 619, 623, and 625, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating films 623 and 625 can be formed by a plasma CVD method, a sputtering method, or the like.

Alternatively, an organic material such as polyimide, an acrylic resin, or a benzocyclobutene-based resin can be used for the insulating films 619, 623, and 625. Other than such organic materials, it is also possible to use a low-dielectric constant material (a low-k material) or the like. In the case of using an organic material, the insulating films 623 and 625 may be formed by a wet method such as a spin coating method or a printing method.

It is preferable that a silicon nitride film be used as the insulating film 625 and subjected to heat treatment at a temperature higher than or equal to 450° C. and lower than or equal to 650° C. in a nitrogen atmosphere. In this manner, hydrogen contained in the silicon nitride film can be supplied to the transistor 600 to hydrogenate the semiconductor material of the transistor 600. In addition, the silicon nitride film used as the insulating film 625 can prevent entry of hydrogen contained in the transistor 600 and the insulating film 623 in a manufacturing process of the transistor 300 and the capacitor 650.

In this embodiment, a 50 nm thick silicon oxynitride film is formed as the insulating film 619 by a CVD method, a 550 nm thick silicon oxide film is formed as the insulating film 623 by a sputtering method, and a 50 nm thick silicon nitride film is formed as the insulating film 625 by a CVD method.

The transistor 300 and the capacitor 650 are formed over the insulating film 625. The transistor 300 can be manufactured in accordance with the description in any of the above embodiments (see FIGS. 5A to 5C, FIGS. 6A to 6C, FIGS. 7A and 7B, and FIGS. 8A and 8B).

In the semiconductor device of this embodiment, the capacitor 650 is manufactured by partly utilizing the manufacturing process of the transistor 300. Accordingly, additional steps for manufacturing the capacitor 650 can be omitted, which leads to an improvement in productivity and a reduction in manufacturing cost of the semiconductor device.

In the capacitor 650, the source electrode 127*a* of the transistor 300 is used as one electrode, the protective insulating film 121 and the interlayer insulating film 123 of the transistor 300 is used as dielectrics, and an electrode 126 which is formed before the interlayer insulating film 124 of the transistor 300 is formed is used as the other electrode.

Note that in the case where the sidewall insulating film 119 of the transistor 300 is formed in a self-aligned manner, an insulating film similar to the sidewall insulating film 119 of the transistor 300 is formed on the other electrode of the capacitor 650.

With the oxide semiconductor film 130, which includes the pair of second regions 134*a* and 134*b* and the pair of third regions 136*a* and 136*b* having lower resistance than the first region 132 functioning as a channel formation region with the first region 132 provided in the channel length direction between those pair of regions, the on-state characteristics (e.g., on-state current and field-effect mobility) of the transistor 300 are increased, which enables high-speed operation and high-speed response of the transistor 300.

In addition, the electric field applied to the pair of second regions 128*a* and 128*b* and the first region 122 (the channel formation region) can be reduced.

The pair of second regions 128*a* and 128*b* functions as a source region and a drain region. The pair of second regions 128*a* and 128*b* has a low resistance because the dopant is injected; thus, the contact resistance with the source electrode 127*a* and the drain electrode 127*b* can be reduced. Accordingly, the transistor 300 can achieve excellent on-state characteristics (e.g., high on-state current and high field-effect mobility), high-speed operation, and high-speed response.

Further, the protective insulating film 121 is provided for the transistor 300 and the capacitor 650. The protective insulating film 121 prevents penetration of impurities such as hydrogen and moisture contained in the external air, and thus, the transistor 300 and the capacitor 650 have excellent reliability. Accordingly, the semiconductor device of this embodiment has excellent reliability.

A wiring 627 corresponds to the source wiring 327*a* and the drain wiring 327*b* of the transistor 300 and may be formed in a manner similar to those of the source wiring 327*a* and the drain wiring 327*b* of the transistor 300. For example, an opening reaching the drain electrode 127*b* is formed in the protective insulating film 121, the interlayer insulating film 123, and the interlayer insulating film 124, and the wiring 627 is formed in the opening in a manner similar to those of the source wiring 327*a* and the drain wiring 327*b* of the transistor 300.

Through the above process, the semiconductor device including the transistor 600, the transistor 300, and the capacitor 650 can be manufactured. The transistor 300 is a transistor including the oxide semiconductor film 120 which is highly purified and whose oxygen vacancies are filled. Thus, a change in the electric characteristics of the transistor 300 is suppressed.

In the capacitor 650, sufficient insulation is secured by the protective insulating film 121 and the interlayer insulating film 123.

In the case where the transistor 100, the transistor 200, the transistor 450, the transistor 500, or the transistor 550 is used instead of the transistor 300 in the semiconductor device of this embodiment, a structure of the capacitor 650 can be selected as appropriate depending on a structure of the transistor. For example, one electrode and the other electrode of the capacitor 650 can be formed using the gate electrode 117, the source electrode 127*a*, and the drain electrode 127*b*. Thus, the distance between the electrodes in the capacitor 650 can be shortened, and a capacitance can be increased. Further, since the capacitor 650 can be formed over the same plane as the transistor by the same manufacturing process as the transistor, the semiconductor device can be manufactured with high yield. In the case where a capacitor is not needed, a structure without the capacitor 650 can also be employed for the semiconductor device of this embodiment.

FIG. 18C is an example of a diagram of a circuit including the semiconductor device as a memory cell. In FIG. 18C, one of a source electrode and a drain electrode of the transistor 300, one electrode of the capacitor 650, and the gate electrode of the transistor 600 are electrically connected to one another. A first wiring (1st Line, also referred to as a source line) is electrically connected to a source electrode of the transistor 600. A second wiring (2nd Line, also referred to as a bit line) is electrically connected to a drain electrode of the transistor 600. A third wiring (3rd line, also referred to as a first signal line) is electrically connected to the other of the source electrode and the drain electrode of the transistor 300. A fourth wiring (4th line, also referred to as a second signal line) is electrically connected to the gate electrode of the transistor 300. A fifth wiring (5th Line, also referred to as a word line) is electrically connected to the other electrode of the capacitor 650.

The transistor 300 including an oxide semiconductor has an extremely low off-state current; therefore, when the transistor 300 is in an off state, the potential of a node (hereinafter, a node FG) where the one of the source electrode and the drain electrode of the transistor 300, the one electrode of the capacitor 650, and the gate electrode of the transistor 600 are electrically connected to one another can be held for an extremely long time. The capacitor 650 facilitates holding of charge given to the node FG and reading of the held data.

When data is stored in the semiconductor device (writing), first, the potential of the fourth wiring is set to a potential at which the transistor 300 is turned on, whereby the transistor 300 is turned on. Thus, the potential of the third wiring is supplied to the node FG and a predetermined amount of charge is accumulated in the node FG. Here, charge for supplying either of two different potential levels (hereinafter referred to as low-level charge and high-level charge) is given. After that, the potential of the fourth wiring is set to a potential at which the transistor 300 is turned off, whereby the transistor 300 is turned off. This makes the node FG floating and the predetermined amount of charge is held in the node FG. The predetermined amount of charge is thus accumulated and held in the node FC, whereby the memory cell can store data.

Since the off-state current of the transistor 300 is extremely small, the charge supplied to the node FG is held for a long time. This can remove the need of refresh operation or drastically reduce the frequency of the refresh operations, which leads to a sufficient reduction in power consumption. Moreover, stored data can be held for a long time even when power is not supplied.

When stored data is read out (reading), an appropriate potential (reading potential) is supplied to the fifth wiring while a predetermined potential (fixed potential) is supplied to the first wiring, whereby the transistor 600 changes its state depending on the amount of charge held in the node FG. This is because in general, when the transistor 600 is an n-channel transistor, an apparent threshold value $V_{th\_H}$ of the transistor 600 in the case where the high-level charge is held in the node FG is lower than an apparent threshold value $V_{th\_L}$ of the transistor 600 in the case where the low-level charge is held in the node FG. Here, an apparent threshold value refers to a potential of the fifth wiring, which is needed to turn on the transistor 600. Thus, by setting the potential of the fifth wiring to a potential $V_0$ which is between $V_{th\_H}$ and $V_{th\_L}$, charge held in the node FG can be determined. For example, in the case where the high-level charge is given in writing, when the potential of the fifth wiring is set to $V_0$ ($>V_{th\_H}$), the transistor 600 is turned on. In the case where the low-level charge is given in writing, even when the potential of the fifth wiring is set to $V_0$ ($<V_{th\_L}$), the transistor 600 remains in an off state. In such a manner, by controlling the potential of the fifth wiring and determining whether the transistor 600 is in an on state or off state (reading out the potential of the second wiring), stored data can be read out.

Further, in order to rewrite stored data, a new potential is supplied to the node FG that is holding the predetermined amount of charge given in the above writing, so that the charge for new data is held in the node FG. Specifically, the potential of the fourth wiring is set to a potential at which the transistor 300 is turned on, whereby the transistor 300 is turned on. Thus, the potential of the third wiring (potential for new data) is supplied to the node FG, and the predetermined amount of charge is accumulated in the node FG. After that, the potential of the fourth wiring is set to a potential at which the transistor 300 is turned off, whereby the transistor 300 is turned off. Thus, charge for the new data is held in the node FG. In other words, while the predetermined amount of charge given in the first writing is held in the node FG the same operation (second writing) as in the first writing is performed, whereby the stored data can be overwritten.

The off-state current of the transistor 300 described in this embodiment can be sufficiently reduced by using the oxide semiconductor film 120 which is highly purified and whose oxygen vacancies are reduced. Further, with the use of such a transistor, a semiconductor device in which stored data can be held for an extremely long time even when power is not supplied can be provided.

As described above, a high-performance semiconductor device can be provided by using any of the transistors described in the above embodiments.

Note that the structures, methods, and the like described in this embodiment can be used as appropriate in combination with any of the structures, methods, and the like described in the other embodiments or example.

(Embodiment 10)

In this embodiment, application examples of the semiconductor device described in Embodiment 9 will be described with reference to FIGS. 19A and 19B.

Figure 19A:
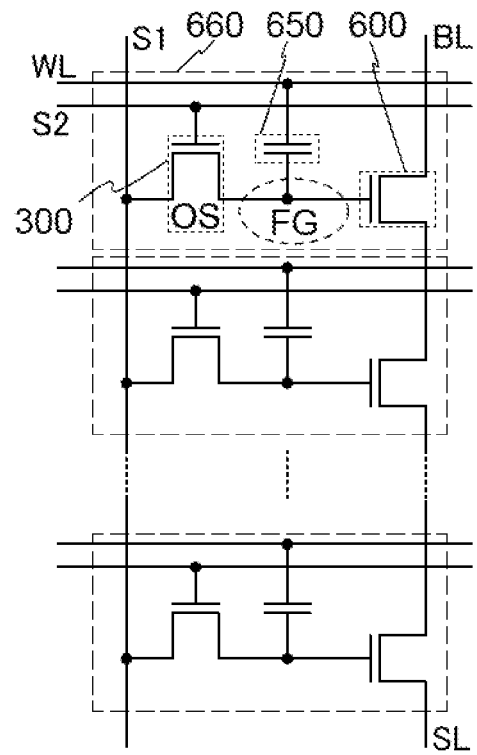
FIGS. 19A and 19B are circuit diagrams each illustrating an example of a semiconductor device.
Figure 19B:
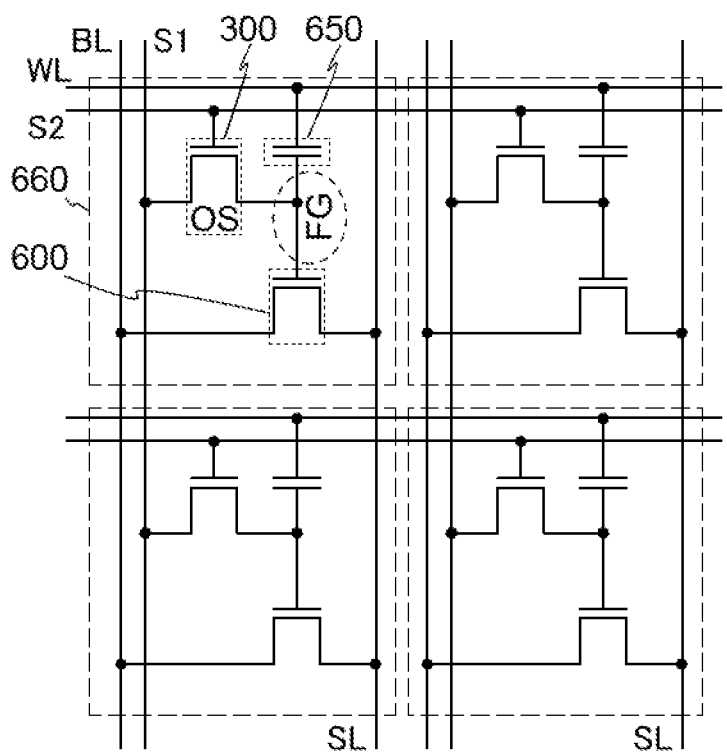

FIGS. 19A and 19B are circuit diagrams of semiconductor devices each including a plurality of memory elements (hereinafter also referred to as memory cells 660) illustrated in FIGS. 18A to 18C. FIG. 19A is a circuit diagram of a so-called NAND semiconductor device in which the memory cells 660 are connected in series, and FIG. 19B is a circuit diagram of what is called a NOR semiconductor device in which the memory cells 660 are connected in parallel.

The semiconductor device illustrated in FIG. 19A includes a source line SL, a bit line BL, a first signal line 51, a plurality of second signal lines S2, a plurality of word lines WL, and the plurality of memory cells 660. In FIG. 19A, one source line SL and one bit line BL are provided in the semiconductor device; however, one embodiment of the present invention is not limited to this structure. A plurality of source lines SL and a plurality of bit lines BL may be provided.

In each of the memory cells 660, the gate electrode of the transistor 600, one of a source electrode and a drain electrode of the transistor 300, and one electrode of the capacitor 650 are electrically connected to one another. The first signal line S1 and the other of the source electrode and the drain electrode of the transistor 300 are electrically connected to each other, and the second signal line S2 and the gate electrode of the transistor 300 are electrically connected to each other. The word line WL and the other electrode of the capacitor 650 are electrically connected to each other.

Further, the source electrode of the transistor 600 included in the memory cell 660 is electrically connected to the drain electrode of the transistor 600 in the adjacent memory cell 660. The drain electrode of the transistor 600 included in the memory cell 660 is electrically connected to the source electrode of the transistor 600 in the adjacent memory cell 660. Note that the drain electrode of the transistor 600 included in the memory cell 660 of the plurality of memory cells connected in series, which is provided at one end, is electrically connected to the bit line. In addition, the source electrode of the transistor 600 included in the memory cell 660 of the plurality of memory cells connected in series, which is provided at the other end, is electrically connected to the source line.

In the semiconductor device in FIG. 19A, writing operation and reading operation are performed for each row. The writing operation is performed as follows. A potential at which the transistor 300 is turned on is supplied to the second signal line S2 of a row where writing is to be performed, so that the transistor 300 of the row where writing is to be performed is turned on. Accordingly, the potential of the first signal line S1 is supplied to the gate electrode of the transistor 600 of the specified row, so that predetermined charge is given to the gate electrode. Thus, data can be written into the memory cell of the specified row.

Further, the reading operation is performed as follows. First, a potential at which the transistor 600 is turned on regardless of charge given to the gate electrode of the transistor 600 is supplied to the word lines WL of rows other than a row where reading is to be performed, so that the transistors 600 of the rows other than the row where reading is to be performed are turned on. Then, a potential (reading potential) at which an on state or an off state of the transistor 600 is determined depending on charge in the gate electrode of the transistor 600 is supplied to the word line WL of the row where reading is to be performed. After that, a constant potential is supplied to the source line SL, and a reading circuit (not illustrated) connected to the bit line BL is operated. Here, the plurality of transistors 600 between the source line SL and the bit line BL are in an on state except the transistor 600 of the row where reading is to be performed; therefore, conductance between the source line SL and the bit line BL is determined by the state (an on state or an off state) of the transistor 600 of the row where reading is to be performed. The conductance of the transistor 600 of the row where reading is to be performed depends on charge in the gate electrode thereof. Thus, the potential of the bit line BL varies accordingly. By reading the potential of the bit line with the reading circuit, data can be read out from the memory cell of the specified row.

The semiconductor device illustrated in FIG. 19B includes a plurality of source lines SL, a plurality of bit lines BL, a plurality of first signal lines S1, a plurality of second signal lines S2, a plurality of word lines WL, and the plurality of memory cells 660. The gate electrode of the transistor 600, one of a source electrode and a drain electrode of the transistor 300, and one electrode of the capacitor 650 are electrically connected to one another. The source line SL and the source electrode of the transistor 600 are electrically connected to each other. The bit line BL and the drain electrode of the transistor 600 are electrically connected to each other. The first signal line S1 and the other of the source electrode and the drain electrode of the transistor 300 are electrically connected to each other, and the second signal line S2 and the gate electrode of the transistor 300 are electrically connected to each other. The word line WL and the other electrode of the capacitor 650 are electrically connected to each other.

In the semiconductor device in FIG. 19B, writing operation and reading operation are performed for each row. The writing operation is performed in a manner similar to that of the semiconductor device in FIG. 19A. The reading operation is performed as follows. First, a potential at which the transistor 600 is turned off regardless of charge given to the gate electrode of the transistor 600 is supplied to the word lines WL of rows other than a row where reading is to be performed, so that the transistors 600 of the rows other than the row where reading is to be performed are turned off. Then, a potential (reading potential) at which an on state or an off state of the transistor 600 is determined depending on charge in the gate electrode of the transistor 600 is supplied to the word line WL of the row where reading is to be performed. After that, a constant potential is supplied to the source line SL, and a reading circuit (not illustrated) connected to the bit line BL is operated. Here, conductance between the source lines SL and the bit lines BL is determined by the state (an on state or an off state) of the transistors 600 of the row where reading is to be performed. That is, the potential of the bit lines BL varies depending on charge in the gate electrodes of the transistors 600 of the row where reading is to be performed. By reading the potential of the bit lines with the reading circuit, data can be read out from the memory cells of the specified row.

Although the amount of data which can be stored in each of the memory cells 660 is one bit in the above description, the structure of the memory device of this embodiment is not limited thereto. The amount of data which can be stored in each of the memory cells 660 may be increased by preparing three or more potentials to be supplied to the gate electrode of the transistor 600. For example, in the case where the number of potentials to be supplied to the gate electrode of the transistor 600 is four, data of two bits can be stored in each of the memory cells.

Note that the structures, methods, and the like described in this embodiment can be used as appropriate in combination with any of the structures, methods, and the like described in the other embodiments or examples.

(Embodiment 11)

In this embodiment, a semiconductor device to which the transistor described in any of the above embodiments is applied will be described with reference to FIGS. 20A and 20B. Note that a memory element (memory cell) is described as an example of a semiconductor device also in this embodiment. The memory element has a structure different from that in the above embodiment.

Figure 20A:
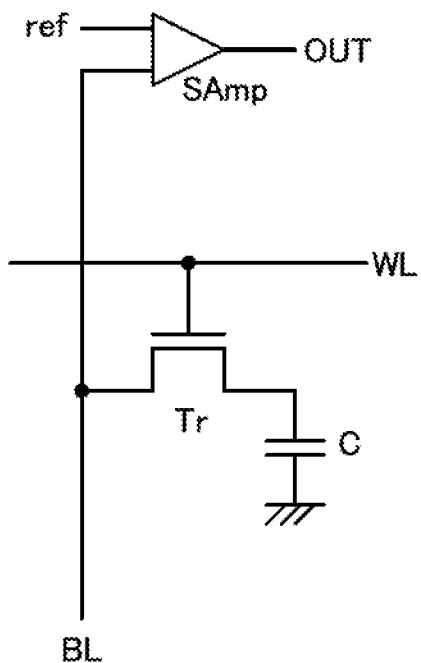
FIG. 20A is a circuit diagram illustrating an example of a semiconductor memory device.

FIG. 20A is a circuit diagram illustrating a memory element described in this embodiment.

The memory cell illustrated in FIG. 20A includes a bit line BL, a word line WL, a transistor Tr, and a capacitor C. A sense amplifier SAmp is electrically connected to the memory cell.

Figure 20B:
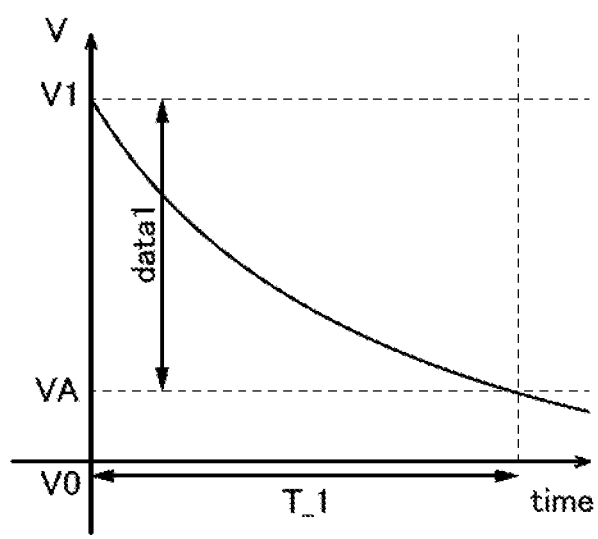
FIG. 20B is a graph showing electrical characteristics thereof.

Note that it is known that the voltage held in the capacitor C is gradually decreased with time as shown in FIG. 20B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

The transistor described in any of the above embodiments includes an oxide semiconductor which is highly purified and whose oxygen vacancies are filled, and thus has less change in electric characteristics and sufficiently reduced off-state current. Therefore, when the transistor described in any of the above embodiments is used as the transistor Tr, the holding period T_1 can be extended. That is, the intervals between refresh operations can be extended; thus, power consumption can be reduced. For example, in the case where the memory cell described in this embodiment is formed using a transistor that includes an oxide semiconductor and has an off-state current of $1\times10^{-21}$ A or lower, preferably $1\times10^{-24}$ A or lower, data can be held for several days to several decades without supply of power.

Furthermore, since the transistor described in any of the above embodiments has high on-state current and high field-effect mobility, a memory cell capable of high-speed operation and high-speed response can be manufactured.

As described above, a high-performance semiconductor device can be provided by using any of the transistors described in the above embodiments.

Note that the structures, methods, and the like described in this embodiment can be used as appropriate in combination with any of the structures, methods, and the like described in the other embodiments or examples.

(Embodiment 12)

In this embodiment, a semiconductor device to which the transistor described in any of the above embodiments is applied will be described with reference to FIGS. 21A and 21B.

Figure 21A:
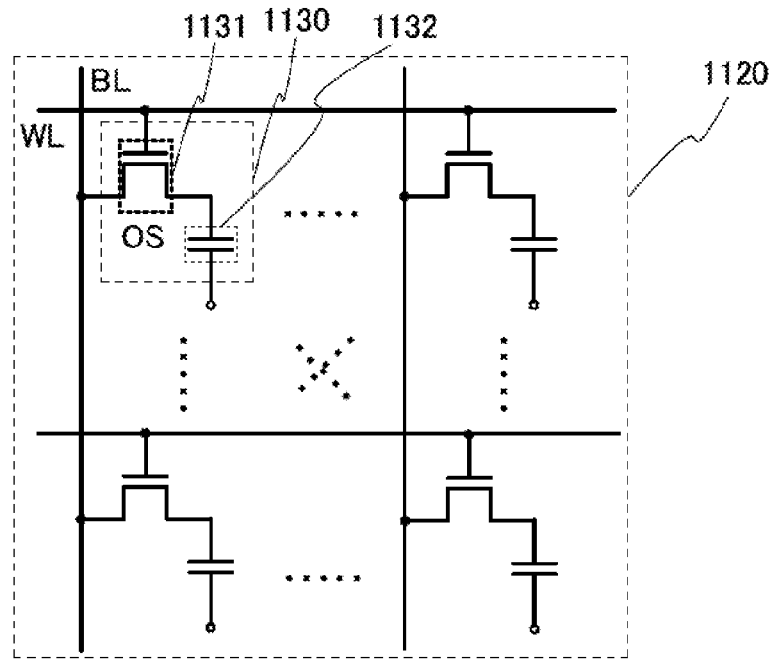
FIGS. 21A and 21B are circuit diagrams each illustrating an example of a semiconductor device.

FIG. 21A illustrates an example of a semiconductor device whose structure corresponds to that of a so-called dynamic random access memory (DRAM). A memory cell array 1120 illustrated in FIG. 21A has a structure in which a plurality of memory cells 1130 is arranged in a matrix. Further, the memory cell array 1120 includes m first wirings and n second wirings. Note that in this embodiment, the first wiring and the second wiring are referred to as a bit line BL and a word line WL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with predetermined potential. The transistor described in any of the above embodiments is applied to the transistor 1131.

The transistor described in any of the above embodiments includes an oxide semiconductor which is highly purified and whose oxygen vacancies are filled, and thus has less change in electric characteristics and sufficiently reduced off-state current. With the use of such a transistor, the semiconductor device in FIG. 21A, which is regarded as a so-called DRAM, can be used as a substantially nonvolatile memory.

Figure 21B:
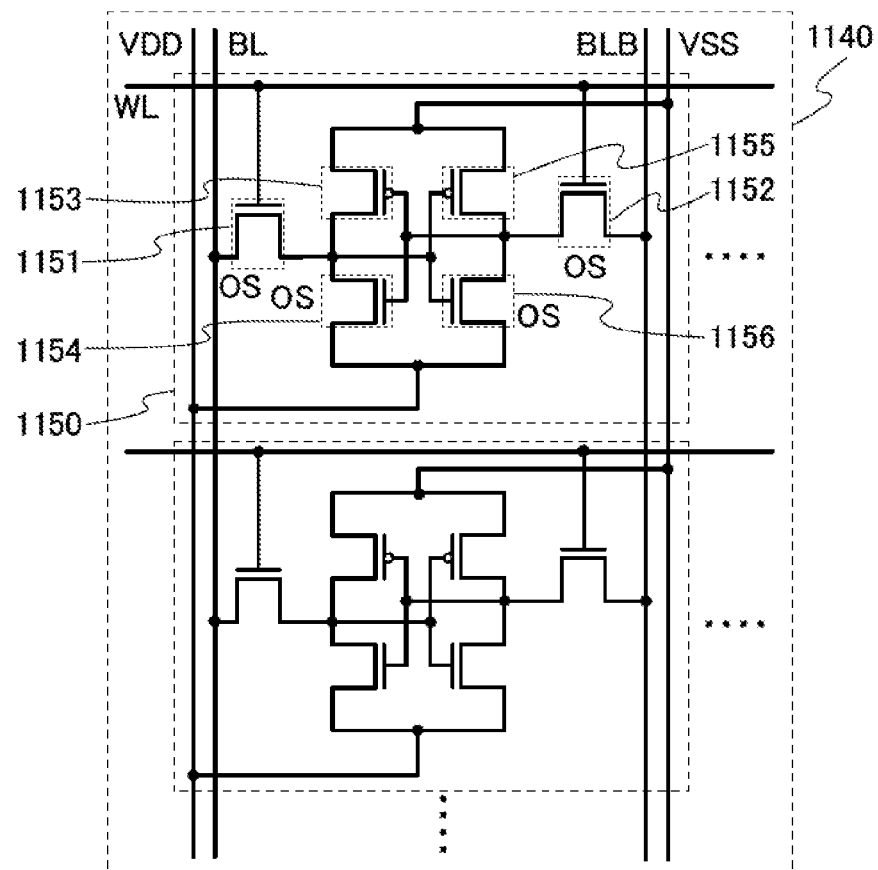

FIG. 21B illustrates an example of a semiconductor device whose structure corresponds to that of a so-called static random access memory (SRAM). A memory cell array 1140 illustrated in FIG. 21B can have a structure in which a plurality of memory cells 1150 is arranged in a matrix. Further, the memory cell array 1140 includes a first wiring (a word line WL), a second wiring (a bit line BL), a third wiring (an inverted bit line BLB), a power supply line VDD, and a ground potential line VSS.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

Since the transistor described in any of the above embodiments has high on-state current and high field-effect mobility, a semiconductor device capable of high-speed operation and high-speed response can be manufactured.

As described above, a high-performance semiconductor device can be provided by using any of the transistors described in the above embodiments.

The structures, methods, and the like described in this embodiment can be used as appropriate in combination with any of the structures, methods, and the like described in the other embodiments or examples.

(Embodiment 13)

A central processing unit (CPU) can be formed using the transistor described in any of the above embodiments for at least part of the CPU.

Figure 22A:
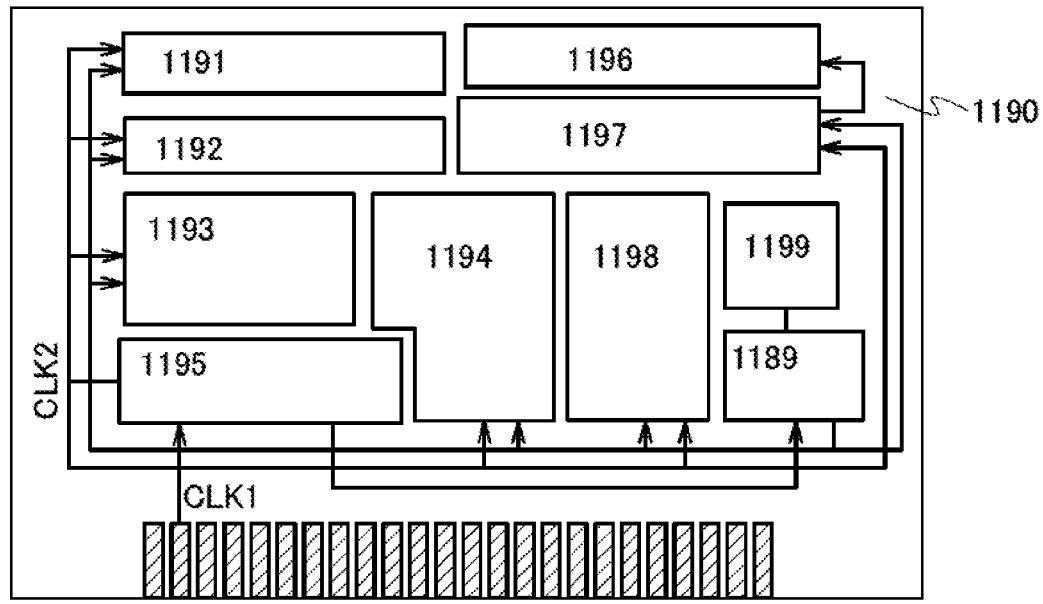
FIG. 22A is a block diagram illustrating a specific example of a CPU and FIGS. 22B and 22C are circuit diagrams each illustrating part of the CPU.

FIG. 22A is a block diagram illustrating a specific configuration of a CPU. The CPU illustrated in FIG. 22A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 22A is just an example in which the configuration has been simplified, and an actual CPU may have various configurations depending on the application.

An instruction that is input to the CPU through the Bus I/F 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 22A, a memory element is provided in the register 1196. Any of the memory elements described in the above embodiments can be used as the memory element provided in the register 1196.

In the CPU illustrated in FIG. 22A, the register controller 1197 selects operation of holding data in the register 1196 in accordance with an instruction from the ALU 1191. That is, the register controller 1197 selects whether data is held by a logic element which inverts a logic (logic level) or a capacitor in the memory element included in the register 1196. When data holding by the logic element which inverts a logic (logic level) is selected, power supply voltage is supplied to the memory element in the register 1196. When data holding by the capacitor is selected, the data is rewritten in the capacitor, and supply of power supply voltage to the memory element in the register 1196 can be stopped.

Figure 22B:
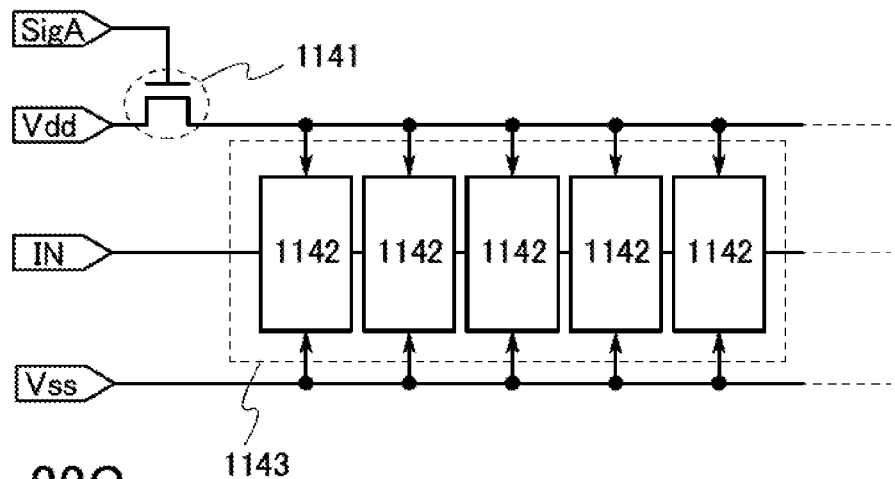
Figure 22C:
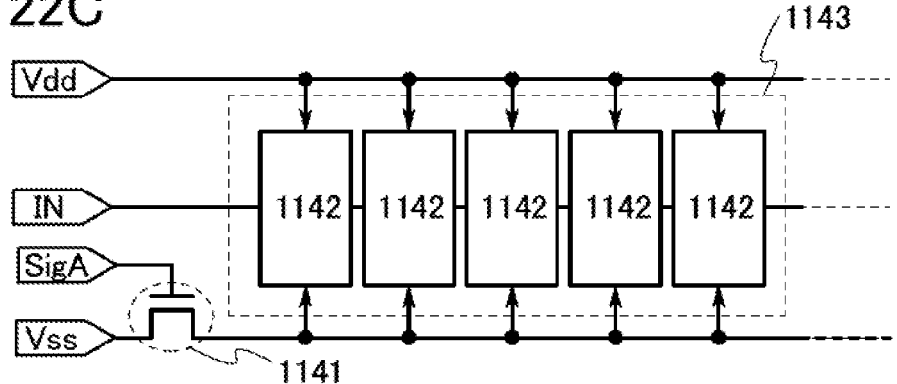

A switching element provided between a memory element group and a node to which a power supply potential Vdd or a power supply potential Vss is supplied, as illustrated in FIG. 22B or FIG. 22C, allows the power supply voltage to be stopped. Circuits illustrated in FIGS. 22B and 22C are described below.

FIGS. 22B and 22C each illustrate an example of a configuration of a memory circuit including a transistor in which a channel formation region is formed using an oxide semiconductor as a switching element for controlling supply of a power supply potential to a memory element.

The memory device illustrated in FIG. 22B includes a switching element 1141 and a memory element group 1143 including a plurality of memory elements 1142. Specifically, as each of the memory elements 1142, the memory element described in the above embodiment can be used. Each of the memory elements 1142 included in the memory element group 1143 is supplied with the high-level power supply potential Vdd through the switching element 1141. Further, each of the memory elements 1142 included in the memory element group 1143 is supplied with a potential of a signal IN and the low-level power supply potential Vss.

In FIG. 22B, a transistor in which a channel formation region is formed using an oxide semiconductor is used as the switching element 1141, and the switching of the transistor is controlled by a signal Sig A supplied to a gate electrode thereof.

Note that FIG. 22B illustrates the configuration in which the switching element 1141 includes only one transistor; however, one embodiment of the present invention is not limited thereto. The switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential Vdd to each of the memory elements 1142 included in the memory element group 1143 in FIG. 22B, the switching element 1141 may control the supply of the low-level power supply potential Vss.

In FIG. 22C, an example of a memory device in which each of the memory elements 1142 included in the memory element group 1143 is supplied with the low-level power supply potential Vss through the switching element 1141 is illustrated. The supply of the low-level power supply potential Vss to each of the memory elements 1142 included in the memory element group 1143 can be controlled by the switching element 1141.

When a switching element is provided between a memory element group and a node to which the power supply potential Vdd or the power supply potential Vss is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be used as appropriate in combination with any of the structures, methods, and the like described in the other embodiments and example.

(Embodiment 14)

In this embodiment, examples of an electronic device including at least one of the transistors, the semiconductor memory devices, and the CPU described in the above embodiments are described.

Figure 23A:
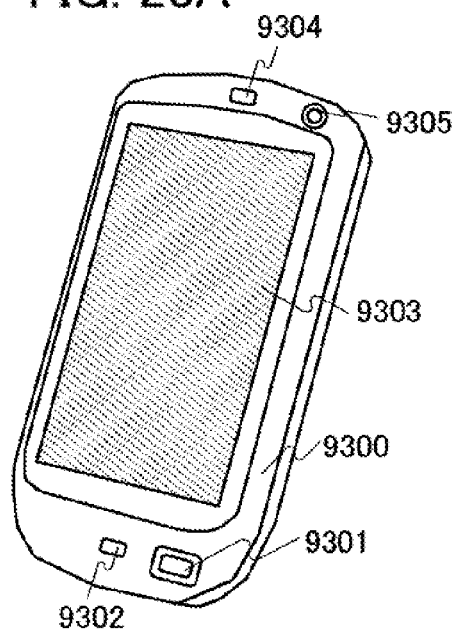
FIGS. 23A to 23D are external views of electronic devices.

FIG. 23A illustrates a portable information terminal. The portable information terminal illustrated in FIG. 23A includes a housing 9300, a button 9301, a microphone 9302, a display portion 9303, a speaker 9304, and a camera 9305, and has a function as a mobile phone.

Figure 23B:
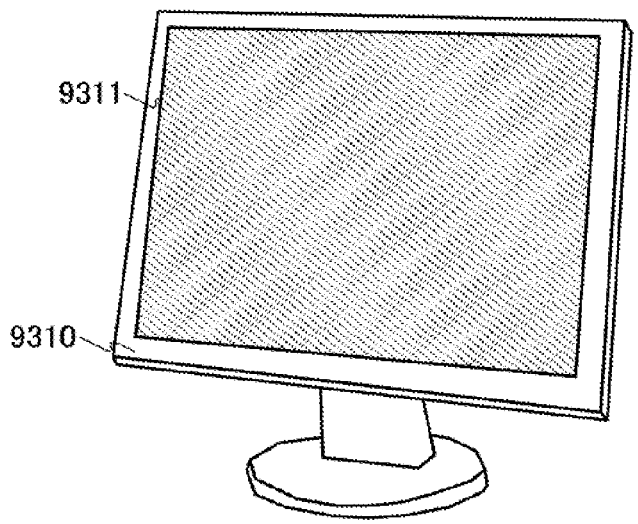

FIG. 23B illustrates a display. The display illustrated in FIG. 23B includes a housing 9310 and a display portion 9311.

Figure 23C:
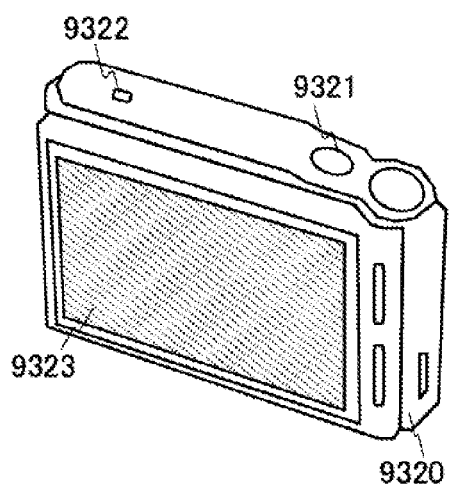

FIG. 23C illustrates a digital still camera. The digital still camera illustrated in FIG. 23C includes a housing 9320, a button 9321, a microphone 9322, and a display portion 9323.

Figure 23D:
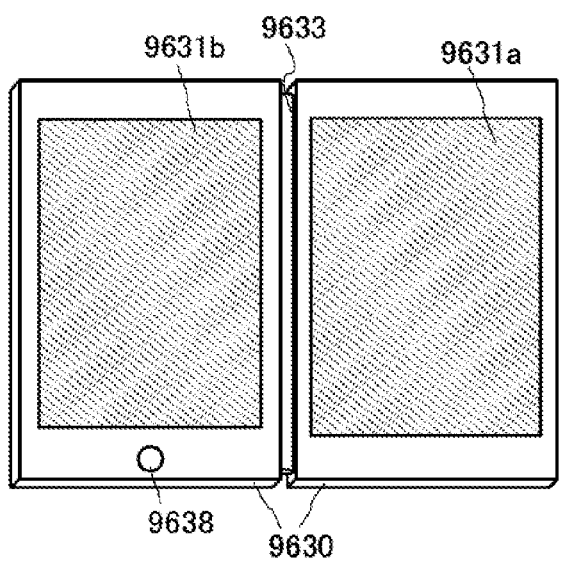

FIG. 23D illustrates a double-foldable portable information terminal. The double-foldable portable information terminal illustrated in FIG. 23D includes a housing 9630, a display portion 9631a, a display portion 9631b, a hinge 9633, and an operation switch 9638.

Part or whole of the display portion 9631a and/or the display portion 9631b can function as a touch panel. By touching an operation key displayed on the touch panel, a user can input data, for example.

By applying one embodiment of the present invention, the performance of an electronic device can be improved.

Note that the structures, methods, and the like described in this embodiment can be used as appropriate in combination with any of the structures, methods, and the like described in the other embodiments and examples.

EXAMPLE 1

In this example, the electrical characteristics of a transistor that is one embodiment of the present invention are described.

First, a method for manufacturing a transistor evaluated is described with reference to FIG. 2, FIGS. 5A to 5C, FIGS. 11A and 11B, FIGS. 12A to 12D, FIGS. 13A to 13C, and FIGS. 14A to 14C.

A base insulating film 103 was formed over a substrate 101 (not shown). As the substrate 101, a p-type silicon substrate (its plane is oriented along (100), and resistivity is 8 to 12 $\Omega$cm) which was manufactured by a Czochralski method and into which boron was injected was used. As the base insulating film 103, a silicon oxynitride film was formed to a thickness of 300 nm by a plasma CVD method. The condition of the plasma CVD method is as follows. As gases, $SiH_4$ and $N_2O$ were introduced at 4 sccm and at 800 sccm, respectively, into a treatment chamber of a plasma CVD apparatus having parallel plate electrodes. The temperature of an upper electrode was kept at 400° C. and the temperature of a lower electrode was kept at 465° C. so that the substrate 101 was kept at 400° C. The distance (gap) between the upper electrode and the lower electrode was 15 mm. The pressure in the treatment chamber was adjusted to 40 Pa. Electric power of 50 W was applied with the use of a 27 MHz RF power source.

Next, the base insulating film 103 formed was subjected to CMP treatment to planarize a surface thereof. In the CMP treatment, the target polishing amount was 20 nm. A condition thereof is as follows: a TR68FZ/8K6X/T13 (produced by Toray Industries, Inc.) was used as a polishing pad for CMP; NP8020 (produced by Nitta Haas Incorporated) in undiluted form (a grain size of silica: 60 nm to 80 nm) was used as a slurry; the polishing time was 2 minutes; the polishing pressure was 0.01 MPa; the number of spindle rotations on a side where the substrate 101 was fixed was 60 rpm; and the number of rotations of a table where a polishing cloth was fixed was 56 rpm. Note that the substrate 101 was washed with ozone water after the CMP treatment was performed.

Next, heat treatment was performed at 450° C. under a vacuum atmosphere for 1 hour, whereby hydrogen contained in the base insulating film 103 whose surface was planarized was removed.

Next, by an ion implantation method, oxygen ions were injected into the base insulating film 103 from which hydrogen was removed. The condition of the ion implantation method is as follows: the dose of the oxygen ions was $2.0 \times 10^{16}$ $cm^{-2}$; and the acceleration voltage was 60 kV. By performing this step, an insulating film having oxygen with a higher proportion than a proportion of oxygen in the stoichiometric composition was formed as the base insulating film 103 as described in Embodiment 7.

Over the base insulating film 103 into which the oxygen ions were injected, an oxide semiconductor film 154 was formed to a thickness of 20 nm by a sputtering method using an In—Ga—Zn-based oxide (see FIG. 5A). The condition of the sputtering method is as follows. A target of In:Ga:Zn=3:1:2 (atomic ratio) was used as a sputtering target. As sputtering gases, argon and oxygen were introduced at 30 sccm and at 15 sccm, respectively, into a treatment chamber of a sputtering apparatus. The substrate 101 was kept at 200° C. by heating. The distance between the sputtering target and the substrate was 60 mm. The pressure in the treatment chamber was adjusted to 0.4 Pa. Electric power of 0.5 kW was applied with the use of a DC power source.

Next, oxygen ions were injected into the oxide semiconductor film 154 by an ion implantation method. The condition of the ion implantation method is as follows: the dose of the oxygen ions was $1.0\times10^{16}$ cm$^{-2}$; and the acceleration voltage was 5 kV. By performing this step, an oxide semiconductor film having oxygen with a higher proportion than a proportion of oxygen in the stoichiometric composition was formed The oxide semiconductor film 154 into which the oxygen ions were injected was subjected to a photolithography step and an etching step; thus, an oxide semiconductor film 105 was formed (see FIG. 5B). The condition of the etching step is as follows. An inductively coupled plasma (ICP) apparatus was used. As etching gases, boron trichloride and chlorine were introduced into a treatment chamber of the ICP apparatus at 60 sccm and at 20 sccm, respectively. The pressure in the treatment chamber was adjusted to 1.9 Pa. The ICP power was 450 W, and the bias power was 100 W.

An insulating film 156 was formed over the oxide semiconductor film 105 (see FIG. 2). As the insulating film 156, a silicon oxynitride film was formed to a thickness of 10 nm by a plasma CVD method using a microwave. The condition of the plasma CVD method using a microwave is as follows. In order to stabilize plasma generated in a treatment chamber of a microwave plasma CVD apparatus, first, SiH$_4$, N$_2$O, and Ar were introduced into the treatment chamber at 10 sccm, at 300 sccm, and at 2500 sccm, respectively; the pressure in the treatment chamber was adjusted to 20 Pa; the distance between the substrate 101 and an electrode was 160 mm; the substrate 101 was kept at 325° C.; and electric power of 5 kW was applied with the use of a 2.45 GHz microwave power source. After the plasma generated was stabilized, the flow rates of SiH$_4$, N$_2$O, and Ar to be introduced into the treatment chamber were increased to 30 sccm, 1500 sccm, and 2500 sccm, respectively. Thus, a silicon oxynitride film was formed. Then, in order that defects contained in the silicon oxynitride film formed are terminated with oxygen, the introduction of SiH$_4$ was stopped, the flow rate of N$_2$O and the flow rate of Ar were changed into 1000 sccm and 2500 sccm, respectively, the pressure in the treatment chamber was adjusted to 20 Pa, the distance between the substrate 101 and the electrode was 160 mm, the substrate 101 was kept at 325° C., and electric power of 5 kW was applied with the use of the 2.45 GHz microwave power source; thus, plasma treatment was performed.

A conductive film 157 was formed over the insulating film 156 by a sputtering method (see FIG. 5C). Here, for the conductive film 157, a 200 nm thick tungsten film was formed over a 30 nm thick tantalum nitride film. The condition of the sputtering method is as follows. First, the condition for forming the tantalum nitride film is described. A tantalum sputtering target was used. As sputtering gases, argon and nitrogen were introduced into the treatment chamber of the sputtering apparatus at 50 sccm and at 10 sccm, respectively. The temperature of the substrate 101 was kept at a room temperature. The distance between the sputtering target and the substrate was 60 mm. The pressure in the treatment chamber was adjusted to 0.6 Pa. Electric power of 1 kW was applied with the use of a DC power source. Next, the condition for forming the tungsten film is described. A tungsten sputtering target was used. As a sputtering gas, argon was introduced into the treatment chamber of the sputtering apparatus at 100 sccm. The substrate 101 was kept at 200° C. The distance between the sputtering target and the substrate was 60 mm. The pressure in the treatment chamber was adjusted to 2.0 Pa. Electric power of 4 kW was applied with the use of a DC power source.

The conductive film 157 was subjected to a photolithography step and an etching step, whereby a gate electrode 117 was formed (see FIG. 12A). Here, a resist mask formed over the conductive film 157 to form the gate electrode 117 was subjected to slimming, and the conductive film 157 was processed using the resist mask subjected to the slimming. The conditions of the slimming and the etching step are as follows. The slimming was performed using the ICP apparatus. As an etching gas, oxygen was introduced into the treatment chamber of the ICP apparatus at 100 sccm. The pressure in the treatment chamber was adjusted to 3.0 Pa. The source power was 2000 W. The etching step for processing the conductive film 157 into the gate electrode 117 was performed using the ICP apparatus under two conditions. The first condition is as follows. As etching gases, chlorine, carbon tetrafluoride, and oxygen were introduced into the treatment chamber of the ICP apparatus at 45 sccm, at 55 sccm, and at 55 sccm, respectively. The temperature of the substrate 101 was kept at 40° C. The pressure in the treatment chamber was adjusted to 0.67 Pa. The source power was 3000 W, and the bias power was 110 W. The second condition is as follows. As an etching gas, chlorine was introduced into the treatment chamber of the ICP apparatus at 100 sccm. The temperature of the substrate 101 was kept at 40° C. The pressure in the treatment chamber was adjusted to 0.67 Pa. The ICP power was 2000 W, and the bias power was 50 W.

A first insulating film was formed over the insulating film 156 and the gate electrode 117. As the first insulating film, a silicon oxynitride film was formed to a thickness of 40 nm by a plasma CVD method using a microwave. The condition of the plasma CVD method using a microwave is as follows. In order to form the first insulating film, first, argon and N$_2$O were introduced at 3000 sccm and at 2500 sccm, respectively, into the treatment chamber of the microwave plasma CVD apparatus; the pressure in the treatment chamber was adjusted to 30 Pa; the distance between the substrate 101 and the electrode was 160 mm; the substrate 101 was kept at 325° C.; electric power of 5 kW was applied with the use of the 2.45 GHz microwave power source; and plasma was generated. Then, SiH$_4$, N$_2$O, and Ar were introduced into the treatment chamber at 250 sccm, at 2500 sccm, and at 2500 sccm, respectively; the pressure in the treatment chamber was adjusted to 30 Pa; the distance between the substrate 101 and the electrode was 160 mm; the substrate 101 was kept at 325° C.; and electric power of 5 kW was applied with the use of the 2.45 GHz microwave power source. Thus, the silicon oxynitride film was formed.

After the first insulating film was formed, phosphorus ions were injected into the oxide semiconductor film 105 through the first insulating film formed by the plasma CVD method using a microwave. The phosphorus ions were injected by an ion implantation method with the gate electrode 117 used as a mask. The condition of the ion implantation method is as follows. The dose of the phosphorus ions was $2.5\times10^{15}$ cm$^{-2}$; and the acceleration voltage was 60 kV. By performing the step, a first region 122 and a pair of second regions 128a and 128b were formed in a self-aligned manner.

A second insulating film was formed over the first insulating film formed by the plasma CVD method using a microwave. As the second insulating film, a silicon oxynitride film was formed to a thickness of 40 nm by a plasma CVD method. The condition of the plasma CVD method is as follows. As gases, SiH$_4$ and N$_2$O were introduced at 1 sccm and at 800 sccm, respectively, into the treatment chamber of the plasma CVD apparatus having parallel plate electrodes. The temperature of the upper electrode was kept at 400° C. and the temperature of the lower electrode was kept at 465° C. so that the substrate 101 was kept at 400° C. The distance (gap) between the upper electrode and the lower electrode was 28 mm. The pressure in the treatment chamber was adjusted to 40 Pa. Electric power of 150 W was applied with the use of a 60 MHz RF power source. Note that in this example, the first insulating film formed by the plasma CVD method using a microwave and the second insulating film formed by the plasma CVD method are collectively referred to as an insulating film 161 (see FIG. 12B).

The insulating film 161 was processed by anisotropic etching, whereby a sidewall insulating film 119 was formed (see FIG. 12C). The insulating film 156 was processed by anisotropic etching, whereby a gate insulating film 113 was formed (see FIG. 12D). The condition of the anisotropic etching is as follows. The anisotropic etching was performed using the ICP apparatus. As etching gases, methane trifluoride and helium were introduced at 30 sccm and at 120 sccm, respectively, into the treatment chamber of the ICP apparatus. The temperature of the substrate 101 was kept at −10° C. The pressure in the treatment chamber was adjusted to 2.0 Pa. The source power was 3000 W, and the bias power was 200 W. Note that the insulating film 161 and the insulating film 156 were processed under the same etching condition.

A conductive film 179 was formed by a sputtering method over the base insulating film 103, the pair of second regions 128a and 128b, the gate insulating film 113, the gate electrode 117, and the sidewall insulating film 119 (see FIG. 13A). Here, a 30 nm thick tungsten film was formed as the conductive film 179. The condition of the sputtering method is as follows. A tungsten sputtering target was used. As a sputtering gas, argon was introduced into the treatment chamber of the sputtering apparatus at 80 sccm. The substrate 101 was kept at a room temperature. The distance between the sputtering target and the substrate was 60 mm. The pressure in the treatment chamber was adjusted to 0.8 Pa. Electric power of 1 kW was applied with the use of the DC power source.

Note that in this example, the conductive film 179 was subjected to a photolithography step and an etching step to remove a part of the conductive film 179 by 30 nm. The condition of the etching step is as follows. The etching step was performed using the ICP apparatus. As etching gases, carbon tetrafluoride, chlorine, and oxygen were introduced at 55 sccm, at 45 sccm, and at 55 sccm, respectively, into the treatment chamber of the ICP apparatus. The temperature of the substrate 101 was kept at 40° C. The pressure in the treatment chamber was adjusted to 0.67 Pa. The source power was 3000 W, and the bias power was 110 W.

A protective insulating film 121 was formed over the conductive film 179 by a sputtering method (see FIG. 13B). As the protective insulating film 121, an aluminum oxide film was formed to a thickness of 70 nm. The condition of the sputtering method is as follows. An aluminum sputtering target was used. As sputtering gases, argon and oxygen were introduced at 25 sccm and at 25 sccm, respectively, into the treatment chamber of the sputtering apparatus. The substrate 101 was kept at 250° C. The distance between the sputtering target and the substrate was 60 mm. The pressure in the treatment chamber was adjusted to 0.4 Pa. Electric power of 2.5 kW was applied with the use of an RF power source.

An interlayer insulating film 123 was formed over the protective insulating film 121 by a plasma CVD method (see FIG. 13C). As the interlayer insulating film 123, a silicon oxynitride film was formed to a thickness of 460 nm. The condition of the plasma CVD method is as follows. As gases, SiH$_4$ and N$_2$O were introduced at 5 sccm and at 1000 sccm, respectively, into the treatment chamber of the plasma CVD apparatus having parallel plate electrodes. The substrate 101 was kept at 325° C. The distance (gap) between the upper electrode and the lower electrode was 20 mm. The pressure in the treatment chamber was adjusted to 133.3 Pa. Electric power of 35 W was applied with the use of a 13.56 MHz RF power source.

The conductive film 179, the protective insulating film 121, and the interlayer insulating film 123 were subjected to CMP treatment; thus, the source electrode 127a and the drain electrode 127b were formed and a surface of the protective insulating film 121 and a surface of the interlayer insulating film 123 were planarized (see FIG. 14A). The CMP treatment was performed under two conditions using the same polishing pad for CMP as the CMP treatment performed on the base insulating film 103. The first condition is as follows: NP8020 in undiluted form was used as a slurry; the polishing time was 1.5 minutes; the polishing pressure was 0.08 MPa, the number of spindle rotations on a side where the substrate 101 was fixed was 51 rpm; and the number of rotations of the table where the polishing cloth was fixed was 50 rpm. The second condition is as follows: a chemical solution obtained by adding 135 ml of an hydrogen peroxide solution to 1000 ml of SSW2000 (produced by Cabot Corporation) and diluting the resulting solution twofold with pure water was used as a slurry; the polishing time was 0.2 minutes; the polishing pressure was 0.01 MPa, the number of spindle rotations on a side where the substrate 101 was fixed was 39 rpm; and the number of rotations of the table where the polishing cloth was fixed was 35 rpm. After the CMP treatment was performed, the substrate 101 was washed with ozone water.

An interlayer insulating film 124 was formed by a plasma CVD method over the planarized protective insulating film 121, the planarized interlayer insulating film 123, the sidewall insulating film 119, and the gate electrode 117 (see FIG. 14B). As the interlayer insulating film 124, a silicon oxynitride film was formed to a thickness of 400 nm. The condition of the plasma CVD method is as follows. As gases, SiH$_4$ and N$_2$O were introduced at 5 sccm and at 1000 sccm, respectively, into the treatment chamber of the plasma CVD apparatus having parallel plate electrodes. The temperature of the substrate 101 was kept at 325° C. The distance (gap) between the upper electrode and the lower electrode was 20 mm. The pressure in the treatment chamber was adjusted to 133.3 Pa. Electric power of 35 W was applied with the use of the 13.56 MHz RF power source.

A structure obtained through steps up to the above was subjected to heat treatment at 400° C. under an oxygen atmosphere for 1 hour.

The interlayer insulating film 124 was subjected to a photolithography step and an etching step, whereby an opening 125a and an opening 125b reaching the source electrode 127a and the drain electrode 127b were formed (see FIG. 14C). The condition of the etching step is as follows. The etching step was performed using the ICP apparatus. Etching gases were introduced into the treatment chamber of the ICP apparatus under a condition that methane trifluoride and helium were introduced at 50 sccm and at 100 sccm, respectively, and under a condition that methane trifluoride and helium were introduced at 7.5 sccm and at 142.5 sccm, respectively. Note that in these two conditions, the pressure in the treatment chamber was fixed to 0.67 Pa, the ICP power was fixed to 475 W, and the bias power was fixed to 300 W.

A source wiring 327a and a drain wiring 327b were formed in the opening 125a and the opening 125b (see FIG. 11B). The source wiring 327a and the drain wiring 327b were formed in the following manner: a conductive film in which a 100 nm thick aluminum film was stacked over a 50 nm thick titanium film and a 50 nm thick titanium film was stacked over the aluminum film was formed by a sputtering method; and the conductive film was subjected to a photolithography step and an etching step.

In the conductive film, the aluminum film was formed in the following manner. Aluminum was used as a sputtering target. As a sputtering gas, argon was introduced into the treatment chamber of the sputtering apparatus at 20 sccm. The temperature of the substrate 101 was kept at a room temperature. The distance between the sputtering target and the substrate was 400 mm. The pressure in the treatment chamber was adjusted to 0.1 Pa. Electric power of 12 kW was applied with the use of the DC power source. The titanium films over and under the aluminum film were formed in the following manner. Titanium was used as a sputtering target. As a sputtering gas, argon was introduced into the treatment chamber of the sputtering apparatus at 50 sccm. The temperature of the substrate 101 was kept at a room temperature. The distance between the sputtering target and the substrate was 60 mm. The pressure in the treatment chamber was adjusted to 0.4 Pa. Electric power of 1 kW was applied with the use of the DC power source.

The condition of the etching step for forming the source wiring 327a and the drain wiring 327b is as follows. The etching step was performed using the ICP apparatus. As etching gases, boron trifluoride and chlorine were introduced into the treatment chamber of the ICP apparatus at 60 sccm and at 20 sccm, respectively. The pressure in the treatment chamber was adjusted to 1.9 Pa. The ICP power was 450 W, and the bias power was 100 W.

The transistor manufactured through the above-described process is referred to as Sample 1.

Further, a transistor obtained in the following manner is referred to as Sample 2: in the process of manufacturing Sample 1, the insulating film 161 was formed with a single-layer structure, instead of the stacked structure, using a 40 nm thick silicon oxynitride film formed by a plasma CVD method. Note that the silicon oxynitride film of Sample 2 is formed under the same condition as the plasma CVD method used for forming the insulating film 161 in the process of manufacturing Sample 1.

Furthermore, a transistor obtained in the following manner is referred to as Sample 3: in the process of manufacturing Sample 1, a step of injecting oxygen ions into the oxide semiconductor film 154 by an ion implantation method was omitted.

Still furthermore, as a comparison example of Samples 1 to 3, a transistor obtained in the following manner is referred to as Comparison sample 1: in the process of manufacturing Sample 1, the insulating film 156 and the insulating film 161 were each formed using a silicon oxynitride film formed by a plasma CVD method using a frequency in the VHF band.

The condition of the plasma CVD method for forming the insulating film 156 and the insulating film 161 in Comparison sample 1 is as follows. As the insulating film 156, a silicon oxynitride film having a thickness of 10 nm was formed. As gases, $SiH_4$ and $N_2O$ were introduced at 1 sccm and at 800 sccm, respectively, into the treatment chamber of the plasma CVD apparatus having parallel plate electrodes. The temperature of the upper electrode was kept at 400° C. and the temperature of the lower electrode was kept at 465° C. so that the temperature of the substrate 101 was kept at 400° C. The distance (gap) between the upper electrode and the lower electrode was 28 mm. The pressure in the treatment chamber was adjusted to 40 Pa. Electric power of 150 W was applied with the use of the 60 MHz RF power source. As the insulating film 161, a 40 nm thick silicon oxynitride film was formed under the same condition as the insulating film 156.

Figure 24A:
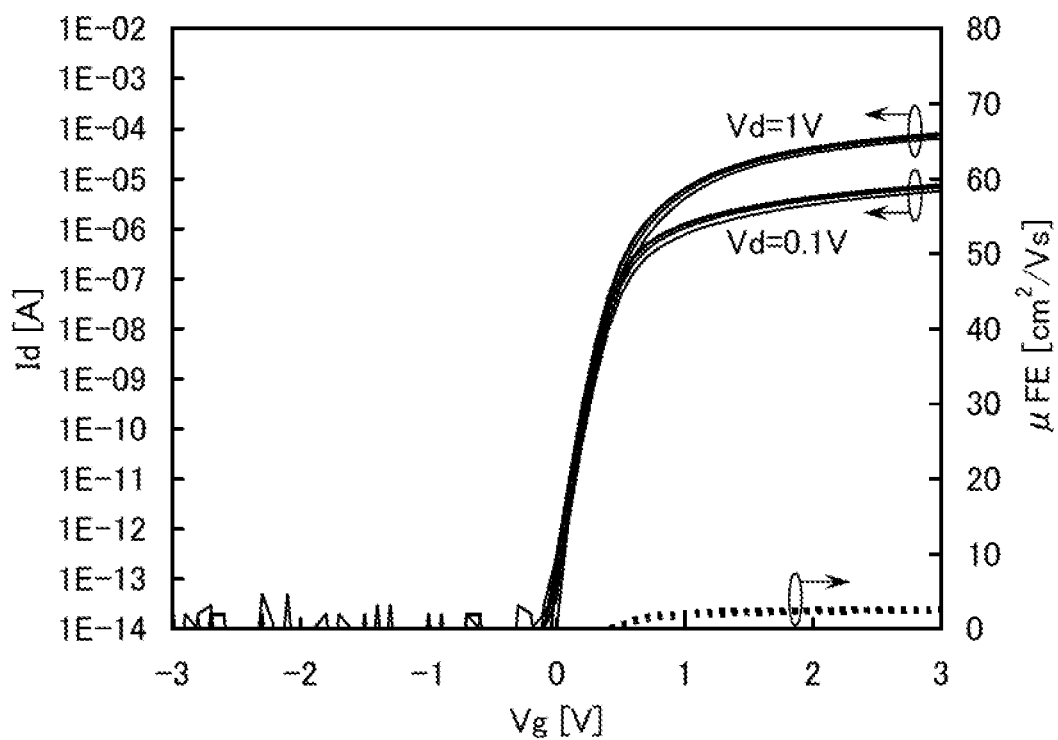
FIGS. 24A and 24B are graphs illustrating Id-Vg curves of transistors.
Figure 24B:
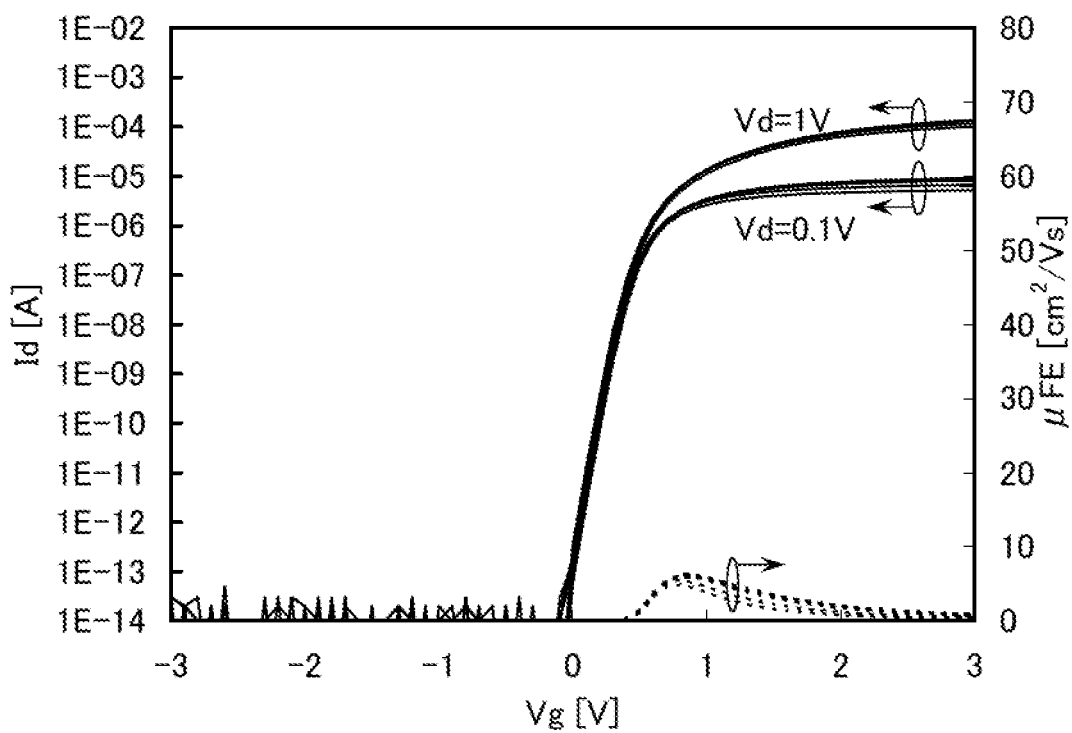
Figure 25:
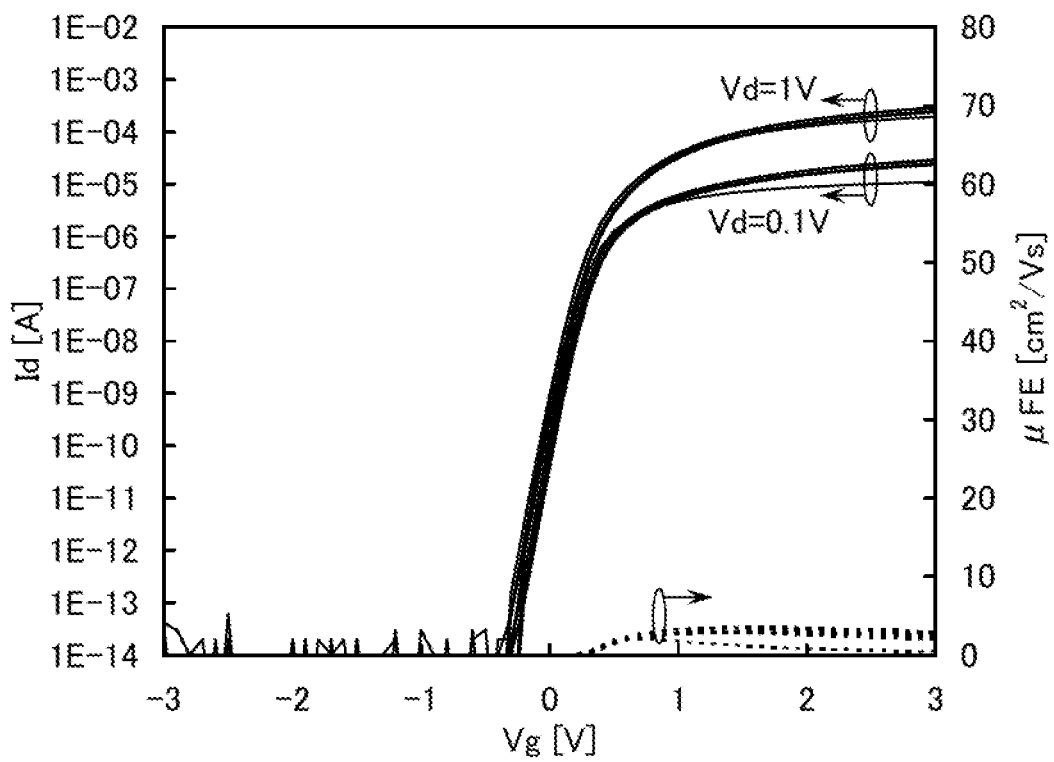
FIG. 25 is a graph illustrating Id-Vg curves of transistors.
Figure 26:
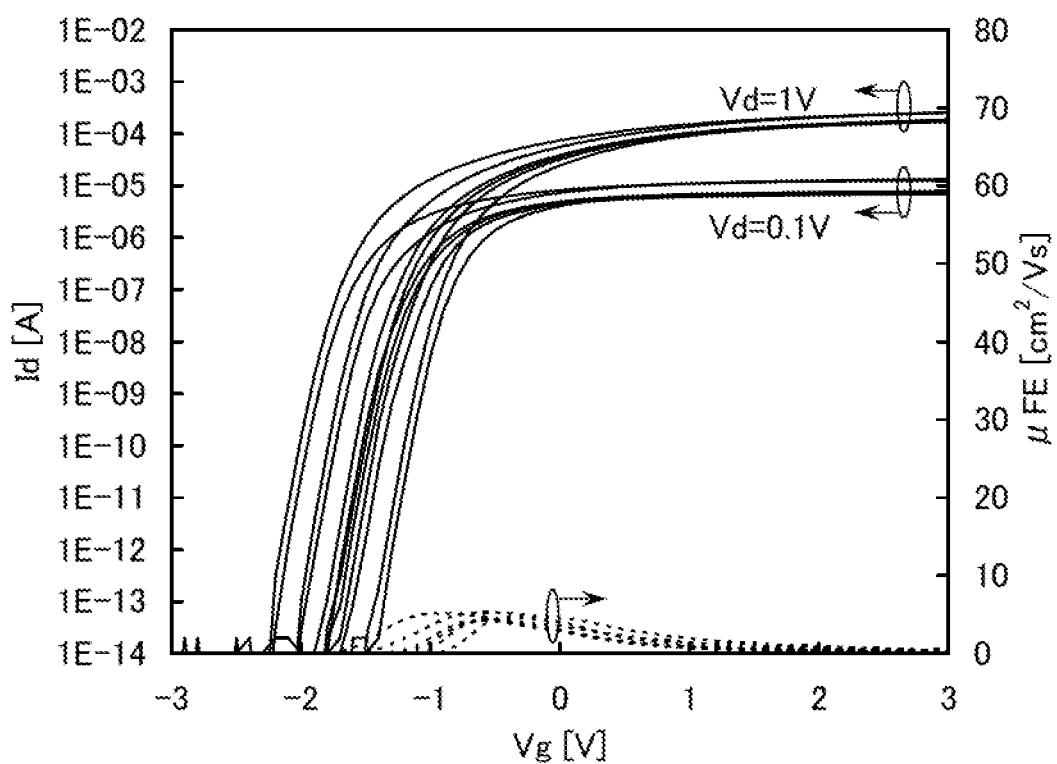
FIG. 26 is a graph illustrating Id-Vg curves of transistors.

FIGS. 24A and 24B, FIG. 25, and FIG. 26 show the results of measuring the electrical characteristics of the transistors of Samples 1 to 3 and Comparison sample 1 which were manufactured in this example. Note that, in each of Samples 1 to 3 and Comparison sample 1, six transistors were used for the measurement of the electrical characteristics. The horizontal axis represents gate voltage (Vg), the vertical axis on the left side represents drain current (Id), and the vertical axis on the right side represents field-effect mobility (µFE). The solid line indicates an Id-Vg curve when drain voltage (Vd) was 0.1 V and 1 V, and the dashed line indicates field-effect mobility when drain voltage (Vd) was 0.1 V. FIG. 24A shows the results of measuring the electrical characteristics of the transistors of Sample 1. FIG. 24B shows the results of measuring the electrical characteristics of the transistors of Sample 2. FIG. 25 shows the results of measuring the electrical characteristics of the transistors of Sample 3. FIG. 26 shows the results of measuring the electrical characteristics of the transistors of Comparison sample 1.

Here, in each of the transistors of Sample 1, Sample 2, and Comparison sample 1, the width of the gate electrode 117 (channel length) was 0.3 µm and the width of the facing portions of the source electrode 127a and the drain electrode 127b (channel width) was 10 µm. In each of the transistors of Sample 3, the width of the gate electrode 117 (channel length) was 0.1 µm and the width of the facing portions of the source electrode 127a and the drain electrode 127b (channel width) was 10 µm. In each of the transistors of Samples 1 to 3, the thickness of the gate insulating film 113 was 10 nm and the dielectric constant thereof was 4. In each of the transistors of Comparison sample 1, the thickness of the gate insulating film 113 was 10 nm and the dielectric constant thereof was 4.1. The field-effect mobility was calculated at Vd=0.1 V.

It is shown that the variation in the Id-Vg curves of the transistors of Sample 1 to 3 which are shown in FIGS. 24A and 24B and FIG. 25 is smaller than that in FIG. 26. In other words, the Id-Vg curves of the six transistors in FIGS. 24A and 24B and FIG. 25 overlap with each other as compared to those in FIG. 26. It is also shown that the threshold voltage shifts in the positive direction. It is also shown that the variation in the Id-Vg curves of the transistors which are shown in FIG. 24B is much smaller than that in FIG. 24A.

From the above, at least by forming the gate insulating film by a microwave plasma CVD method, the variation in transistors can be reduced, and the threshold voltage can be shifted in the positive direction.

EXAMPLE 2

In this example, the electrical characteristics of a transistor that is one embodiment of the present invention are described.

A method for manufacturing a transistor evaluated is described. The transistor manufactured in this example is a transistor obtained in the following manner: in the method for manufacturing Sample 1 which is described in Example 1, the insulating film 161 was formed using a silicon oxynitride film with a single-layer structure instead of the stacked structure; and the silicon oxynitride film was formed by a plasma CVD method using a microwave. The condition of the plasma CVD method using a microwave is as follows. In order to form the insulating film 161, first, argon and $N_2O$ were introduced into a treatment chamber of a microwave plasma CVD apparatus at 3000 sccm and at 2500 sccm, respectively; the pressure in the treatment chamber was adjusted to 30 Pa; a distance between the substrate 101 and the electrode was 160 mm; the substrate 101 was kept at 325° C.; and electric power of 5 kW was applied with the use of a 2.45 GHz microwave power source; and plasma was generated. After that, $SiH_4$, $N_2O$, and Ar were introduced into the treatment chamber at 250 sccm, at 2500 sccm, and at 2500 sccm, respectively; the pressure in the treatment chamber was adjusted to 30 Pa; the distance between the substrate 101 and the electrode was 160 mm; the substrate 101 was kept at 325° C., and electric power of 5 kW was applied with the use of the 2.45 GHz microwave power source. Thus, a silicon oxynitride film with a thickness of 40 nm was formed.

The transistor manufactured through the above-described process is referred to as Sample 4. A comparison example of Sample 4 is Comparison sample 1 described in Example 1.

Figure 27:
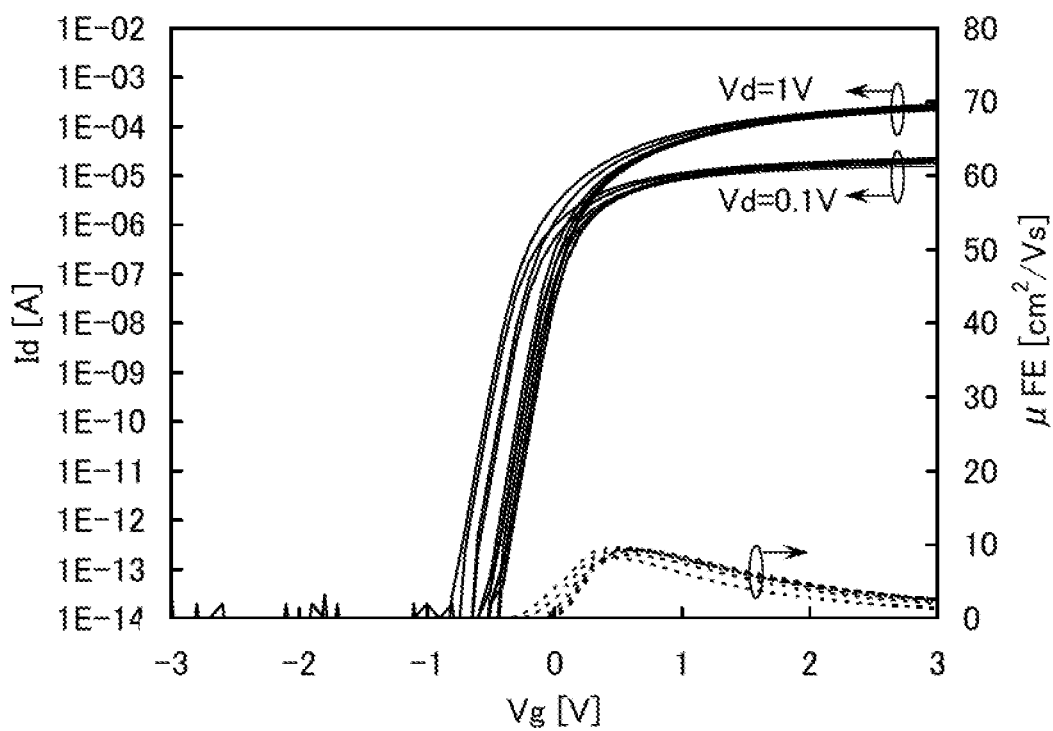
FIG. 27 is a graph illustrating Id-Vg curves of transistors.

FIG. 27 shows the results of measuring the electrical characteristics of the transistors of Sample 4 which were manufactured in this example. Note that, in Sample 4, six transistors were used for the measurement of the electrical characteristics. The horizontal axis represents gate voltage (Vg), the vertical axis on the left side represents drain current (Id), and the vertical axis on the right side represents field-effect mobility (μFE). The solid line indicates an Id-Vg curve when drain voltage (Vd) was 0.1 V and 1 V, and the dashed line indicates field-effect mobility when drain voltage (Vd) was 0.1 V. Note that the results of measuring the electrical characteristics of the transistors of Comparison sample 1 are shown in FIG. 26.

In this example, the width of the gate electrode (channel length), the width of the facing portions of the source electrode 127a and the drain electrode 127b (channel width), the thickness of the gate insulating film, and the dielectric constant are as described in Example 1.

It is shown that the variation in the Id-Vg curves of the transistors of Sample 4 which are shown in FIG. 27 is smaller than that in FIG. 26. It is also shown that the threshold voltage shifts in the positive direction.

From the above, at least by forming the sidewall insulating film by a microwave plasma CVD method, the variation in transistors can be reduced, and the threshold voltage can be shifted in the positive direction.

EXAMPLE 3

Next, a method for measuring off-state current of Sample 1 and the results thereof are described with reference to FIG. 28, FIGS. 29A and 29B, FIGS. 30A and 30B, and FIGS. 31A and 31B.

<Measurement System>

Figure 28:
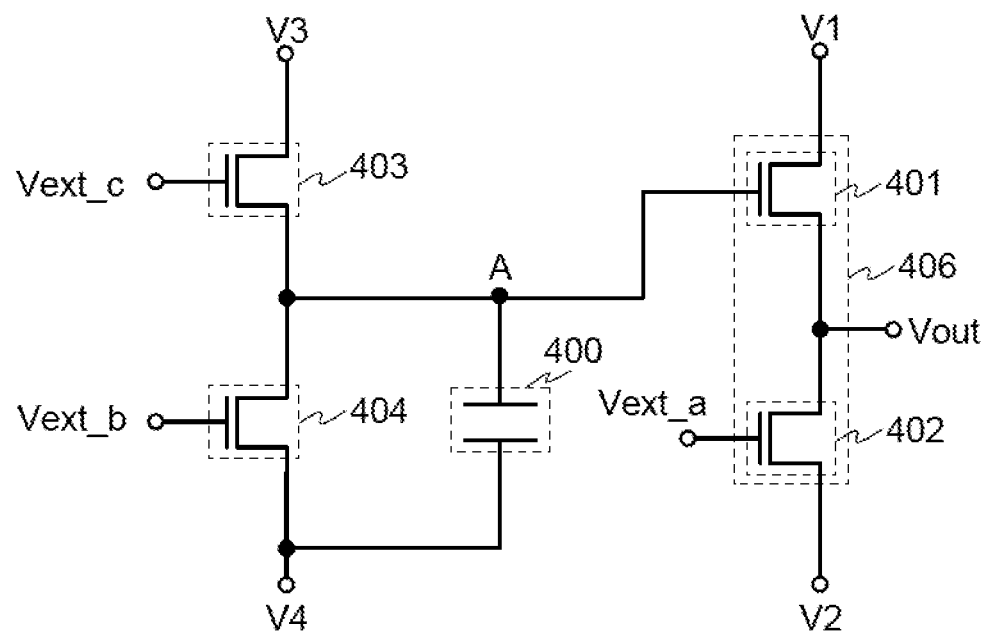
FIG. 28 is a circuit diagram showing an example of a measurement system.

A measurement system shown in FIG. 28 includes a capacitor 400, a transistor 401, a transistor 402, a transistor 403, and a transistor 404. Here, the transistor 403 is a transistor for injection of charge and the transistor 404 is a transistor for evaluation of leakage current. The transistor 401 and the transistor 402 formed an output circuit 406. A point where a source terminal (or drain terminal) of the transistor 403, a drain terminal (or source terminal) of the transistor 404, a first terminal of the capacitor 400, and a gate terminal of the transistor 401 were connected to each other is referred to as a node A.

When the transistor for injection of charge and the transistor for evaluation are separately provided, the transistor for evaluation can be always kept in an off state at the time of injection of charge. In the case where the transistor for injection of charge is not provided, the transistor for evaluation needs to be turned on once at the time of injection of charge; accordingly, it takes longer time for measurement when an element which takes time to be in a steady state of an off state from an on state is used. Further, the transistor for evaluation does not need to be turned on once, so that there is no influence of change in the potential of the node A, due to flow of part of charge in a channel formation region into the node A.

The channel width W of the transistor for evaluation is preferably larger than that of the transistor for injection of charge. When the channel width W of the transistor for evaluation is larger than that of the transistor for injection of charge, a leakage current other than leakage current of the transistor for evaluation can be relatively reduced. As a result, the leakage current of the transistor for evaluation can be measured with high accuracy.

In the measurement system shown in FIG. 28, the source terminal (or drain terminal) of the transistor 403, the drain terminal (or source terminal) of the transistor 404, and the first terminal of the capacitor 400 were connected to the gate terminal of the transistor 401. A second terminal of the capacitor 400 and a source terminal (or drain terminal) of the transistor 404 were connected to each other. A drain terminal (or source terminal) of the transistor 401 was connected to a power source, a source terminal (or drain terminal) of the transistor 402 was connected to a power source, and a drain terminal (or source terminal) of the transistor 403 was connected to a power source.

Further, in the measurement system shown in FIG. 28, a potential V3 was applied from the power source to the drain terminal (or source terminal) of the transistor 403, and a potential V4 was applied from the power source to the source terminal (or drain terminal) of the transistor 404. A potential V1 was applied from the power source to the drain terminal (or source terminal) of the transistor 401, and a potential V2 was applied from the power source to the source terminal (or drain terminal) of the transistor 402. An output potential Vout was output from a terminal corresponding to an output terminal of the output circuit 406 to which a source terminal (or drain terminal) of the transistor 401 and a drain terminal (or source terminal) of the transistor 402 were connected.

In the above structure, a potential Vext_a for adjusting the output circuit 406 was supplied to a gate terminal of the transistor 402, a potential Vext_c for controlling the on/off of the transistor 403 was supplied to a gate terminal of the transistor 403, a potential Vext_b for controlling a state of the transistor for evaluation was supplied to a gate terminal of the transistor 404.

Note that in FIG. 28, the capacitor 400 is not necessarily provided. In that case, the gate terminal of the transistor 401, the source terminal (or drain terminal) of the transistor 403, and the drain terminal (or source terminal) of the transistor 404 were connected to each other at the node A.

<Current Measurement Method>

Figure 29A:
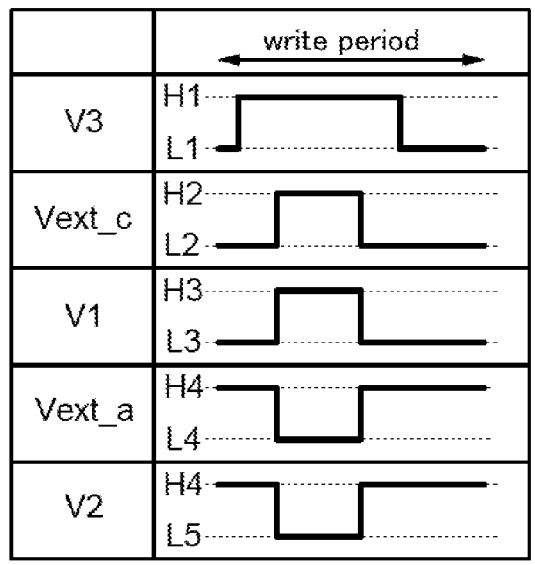
FIGS. 29A and 29B are diagrams (timing charts) showing potentials relating to operation of a measurement system.
Figure 29B:
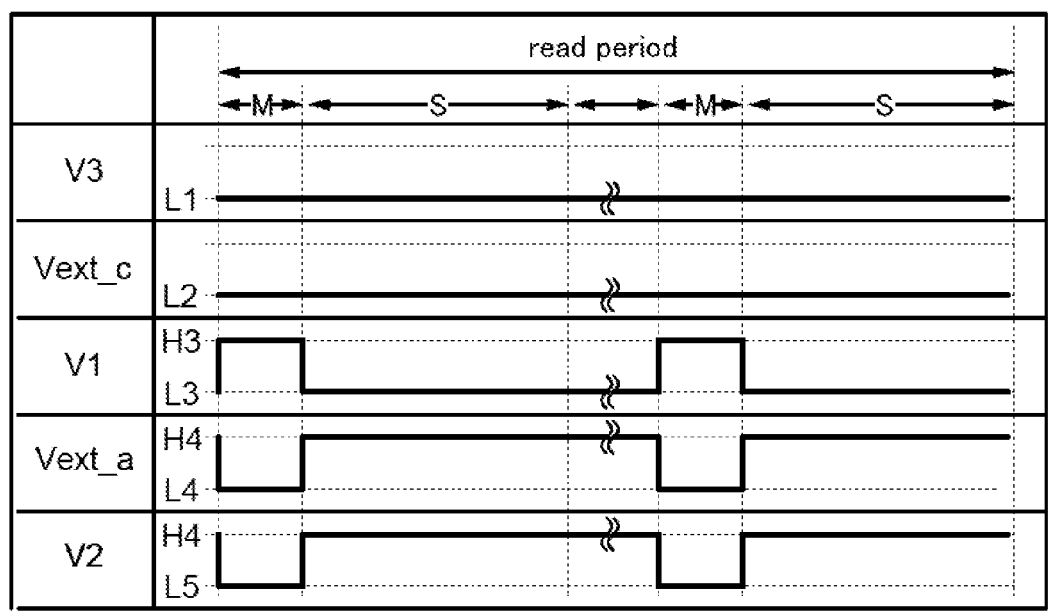

Next, an example of a current measurement method using the above-described measurement system is described with reference to FIGS. 29A and 29B.

First, a write period in which a potential difference is applied to measure the off-state current is briefly described with reference to FIG. 29A.

In the write period, the potential V3 was input to the drain terminal (or source terminal) of the transistor 403 and the potential Vext_c for turning on the transistor 403 was then input to the gate terminal of the transistor 403, so that the potential V3 was applied to the node A connected to the drain terminal (or source terminal) of the transistor 404. The potential Vext_a for turning on the transistor 402 was input, so that the transistor 402 was turned on. The potential Vext_b for turning off the transistor 404 was input, so that the transistor 404 was turned off.

Here, the potential V3 was set to a high potential (H1) and the potential Vext_c was set to a high potential (H2). The potential V1 was set to a high potential (H3). The potential Vext_a was set to a low potential (L4), the potential V2 was set to a low potential (L5), the potential Vext_b was set to a low potential (L2), and the potential V4 was set to Vss.

Then, the potential Vext_a for turning off the transistor 402 was input, so that the transistor 402 was turned off. Further, the potential V2 was set to a high potential (H4) and the potential V1 was set to a low potential (L3). Here, the potential V2 was the same potential as the potential V1. Next, the potential V3 was set to a low potential (L). The potential Vext_c for turning on the transistor 403 was input to the gate terminal of the transistor 403, so that the transistor 403 was turned off.

Here, the potential Vext_c was set to a low potential (L2), the potential Vext_a was set to a high potential (H4), the potential V3 was set to a low potential (L1), the potential V1 was set to a low potential (L3), and the potential V2 was set to a high potential (H4). The potential Vext_b was set to a low potential (L2) and the potential V4 was set to Vss.

Thus, the write period was finished. In a state where the write period was finished, the transistor 404 was off but a potential difference was generated between the node A and the source terminal (drain terminal) of the transistor 404. Therefore, current slightly flows in the transistor 404. That is, the off-state current (i.e., leakage current) flows.

Next, a read period was started. In the read period, the amount of change in the potential of the node A, due to change in the amount of electric charge held in the node A, was measured. The operation in the reading period is described with reference to FIG. 29B.

When the read period was started, the amount of electric charge held in the capacitor connected to the node A changed over time, and the potential of the node A thus changed. This means that the potential of the input terminal of the output circuit 406 changed. Consequently, the potential of the output terminal of the output circuit 406 also changed over time.

Note that in the read period, it is preferable that a measurement period M for measuring the amount of change in the potential of the node A and a storage period S for storing electric charge in the node A be performed repeatedly. When the measurement of the amount of change in the potential of the node A and the storage of electric charge of the node A were performed repeatedly, it can be confirmed that the measured value of voltage was a value in a steady state. In other words, it is possible to remove a transient (a current decreasing with time after the start of the measurement) from $I_A$ flowing in the node A. As a result, the leakage current can be measured with greater accuracy.

When the relation between a potential $V_A$ denoting the potential at the node A, and the output potential Vout has been already determined, the potential $V_A$ can be determined from the output potential Vout. In general, the potential $V_A$ denoting the potential of the node A can be measured as a function of the output potential Vout and expressed by the following formula.

$$V_A = F(Vout) \quad \text{[Formula 3]}$$

Electric charge $Q_A$ denoting the electric charge in the capacitor connected to the node A can be expressed by the following formula using the potential $V_A$, $C_A$ denoting the capacitance of the capacitor connected to the node A, and a constant (const). Here, the capacitance $C_A$ of the capacitor connected to the node A is the sum of the capacitance of the capacitor 400 and other capacitance (e.g., the input capacitance of the output circuit 406).

$$Q_A = C_A V_A + \text{const} \quad \text{[Formula 4]}$$

$I_A$ denoting current flowing through the node A is the time derivatives of electric charge flowing to the node A (or electric charge flowing from the node A), so that the current $I_A$ is expressed by the following formula.

$$I_A \equiv \frac{\Delta Q_A}{\Delta t} = \frac{C_A \cdot \Delta F(Vout)}{\Delta t} \quad \text{[Formula 5]}$$

As described above, $I_A$ denoting current flowing through the node A can be determined from the capacitance $C_A$ connected to the node A, the output potential Vout of the output circuit 406, and change over time $\Delta t$.

Note that the current $I_A$ is the sum of $I_{dev}$ denoting a current flowing in the transistor 404, and $I_{leak}$ denoting a current other than the current $I_{dev}$, so that in order to determine the current $I_{dev}$ with high accuracy, the measurement is preferably carried out with a system of measurement in which the current $I_{leak}$ is sufficiently smaller than the current $I_{dev}$. Alternatively, the accuracy in determining the current $I_{dev}$ may be increased by estimating the current $I_{leak}$ and then subtracting it from the current $I_A$.

Here, in the measurement period M, the potential V2 was set to a low potential (L5) and the potential Vext_a was set to a low potential (L4), so that the transistor 402 was turned on. Note that in order to turn on the transistor 402, the low potential (L4) of the potential Vext_a was higher than the low potential (L5) of the potential V2. The potential V1 was set to a high potential (H3). The potential Vext_c was set to a low potential (L2) and the potential V3 was set to a low potential (L1). The potential Vext_b was set to a low potential (L2) and the potential V4 was set to Vss.

In the storage period S, the potential V2 was set to a high potential (H4) and the potential Vext_a was set to a high potential (H4), so that the transistor 402 was turned off. The potential V1 was set to a low potential (L3). Note that the potential V1, the potential V2, and the potential Vext_a were the same potentials. The potential Vext_c was set to a low potential (L2) and the potential V3 was set to a low potential (L1). The potential Vext_b was set to a low potential (L2) and the potential V4 was set to Vss.

A minute current flowing in the transistor 404 can be measured by the above-described method.

In this example, the transistors 401 and 402 each had a channel length L of 3 μm and a channel width W of 100 μm, the transistor 403 had a channel length L of 10 μm and a channel width W of 10 μm, and the transistor 404 had a channel length L of 0.35 μm and a channel width W of 10000 μm. Note that each transistor was manufactured under the same condition as Sample 1.

First, a cycle in which a measurement temperature was 125° C., Δt used in calculation of current I flowing in the transistor was 1 hour, and the write period was provided per Δt was repeated 10 times. Next, a cycle in which the measurement temperature was 85° C., Δt was 6 hours, and the write period was provided per Δt was repeated 8 times.

Note that in this example, in the write period, the high potential (H1) of the potential V3 was set to 2 V and the low potential (L1) of the potential V3 was set to 1 V. The high potential (H2) of the potential Vext_c was set to 5 V, and the low potential (L2) thereof was set to −3 V. The high potential (H3) of the potential V1 was set to 3 V, and the low potential (L3) thereof was set to 1.5 V. The high potential (H4) of the potential Vext_a was set to 1.5 V, and the low potential (L4) thereof was set to −1 V. The high potential (H4) of the potential V2 was set to 1.5 V, and the low potential (L5) thereof was set to −2 V. The potential Vext_b was set to −3 V, and the transistor 404 was thus turned off, and the potential V4 was set to 1 V. Here, a voltage of 2 V was applied to the node A.

In the read period, a measurement period M for 10 seconds and a storage period S for 290 seconds were collectively regarded as one set. When the measurement temperature was 125° C., 12 sets of reading operation were performed, and when the measurement temperature was 85° C., 72 sets of reading operation were performed. Thus, the output potential Vout was measured.

In this example, in the read period, the high potential (H1) of the potential V1 was 5 V, and the low potential (L1) thereof was 1.5 V. The high potential (H4) of the potential Vext_a was 1.5 V, and the low potential (L4) thereof was −1 V. The high potential (H4) of the potential V2 was 1.5 V, and the low potential (L5) thereof was −2 V. The low potential (L2) of the potential V3 was 1 V. The low potential (L2) of the potential Vext_c was −3 V. The potential Vext_b was −3 V and the transistor 404 was thus turned off, and the potential V4 was 1 V.

Figure 30A:
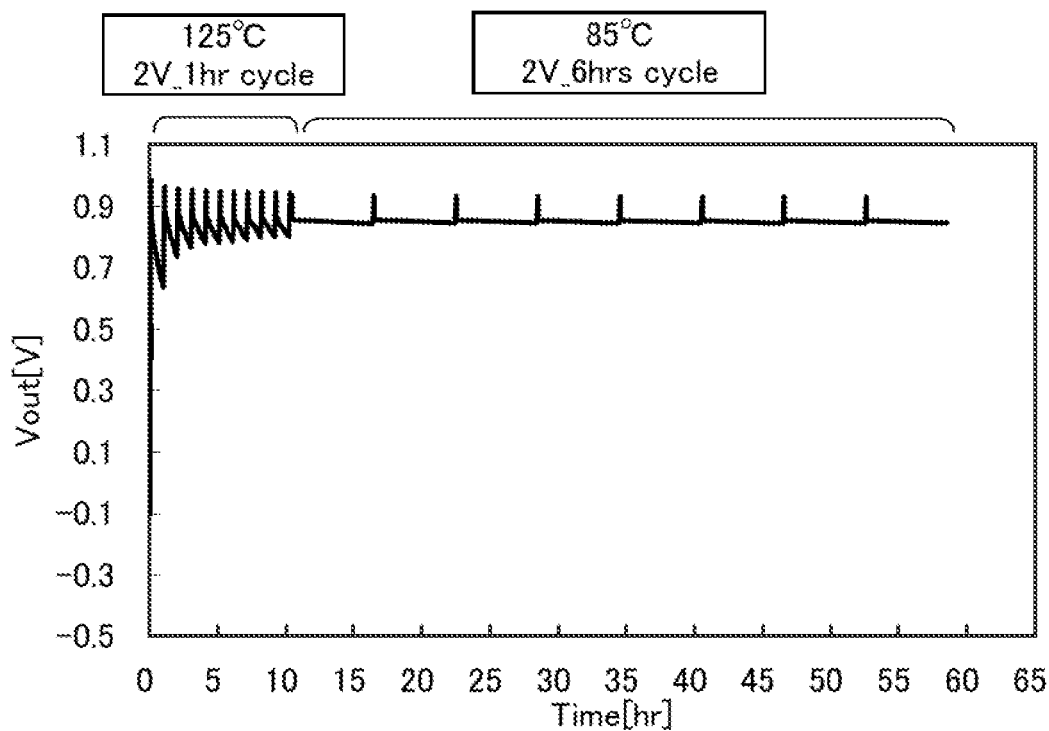
FIGS. 30A and 30B are graphs illustrating the results of measuring off-state current.

FIG. 30A shows the relation between the elapsed time and the output potential Vout of the output circuit 406. According to FIG. 30A, the potential varies as time passes.

Figure 30B:
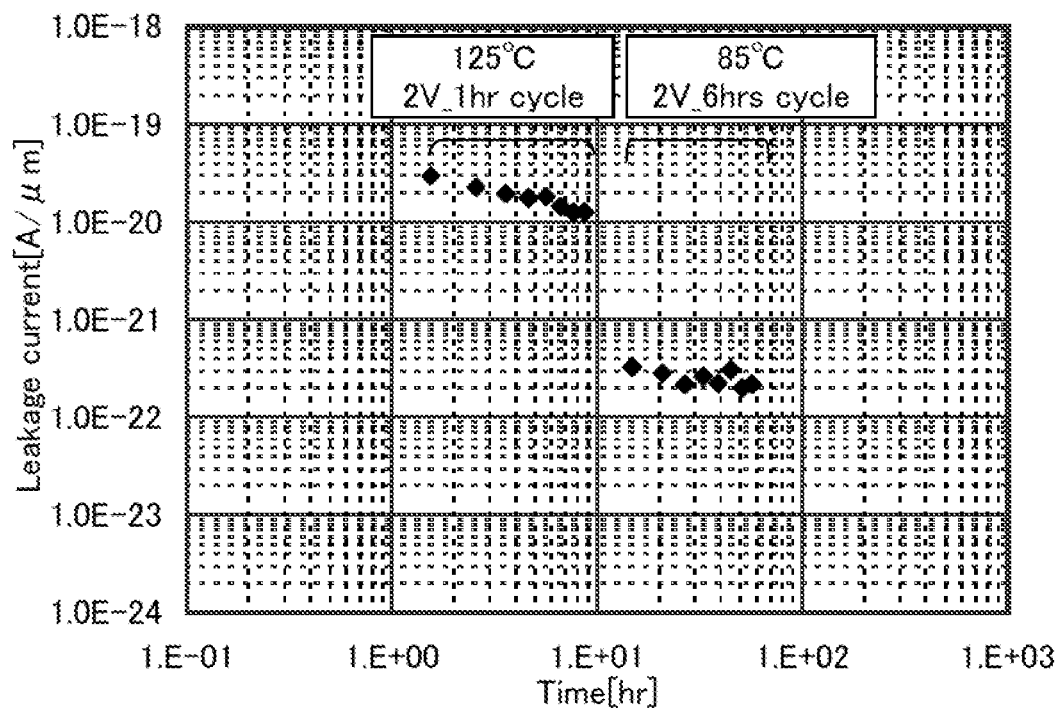

FIG. 30B shows leakage current calculated by the above-described output potential Vout measurement. Note that FIG. 30B is a graph showing the relation between the elapsed time and the leakage current flowing between a source electrode and a drain electrode. According to FIG. 30B, the leakage current is lower than $2 \times 10^{-20}$ A/μm (20 zA/μm (1 zA (zepto-ampere) is $10^{-21}$ A)) when the measurement temperature is 125° C., and the leakage current is lower than $3 \times 10^{-22}$ A/μm (300 yA/μm (1 yA (yoctoampere) is $10^{-24}$ A)) when the measurement temperature is 85° C.

As described above, it is confirmed from this example that the off-state current is sufficiently small in a transistor including a highly purified oxide semiconductor whose oxygen vacancies are reduced.

Figure 31A:
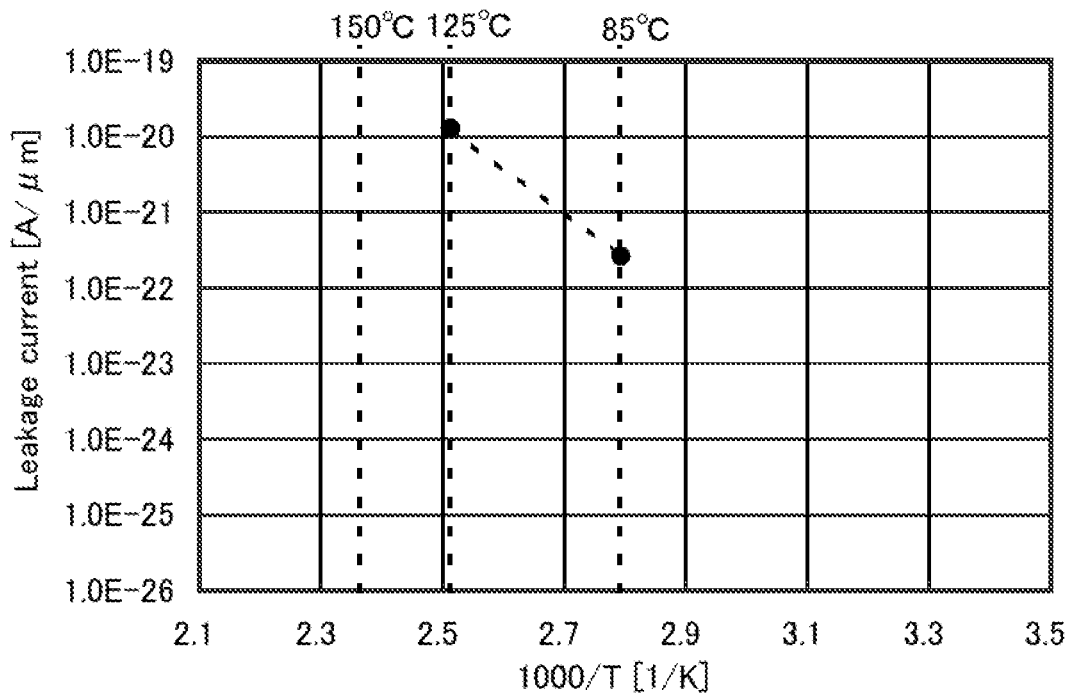
FIGS. 31A and 31B are Arrhenius plots for illustrating off-state current.
Figure 31B:
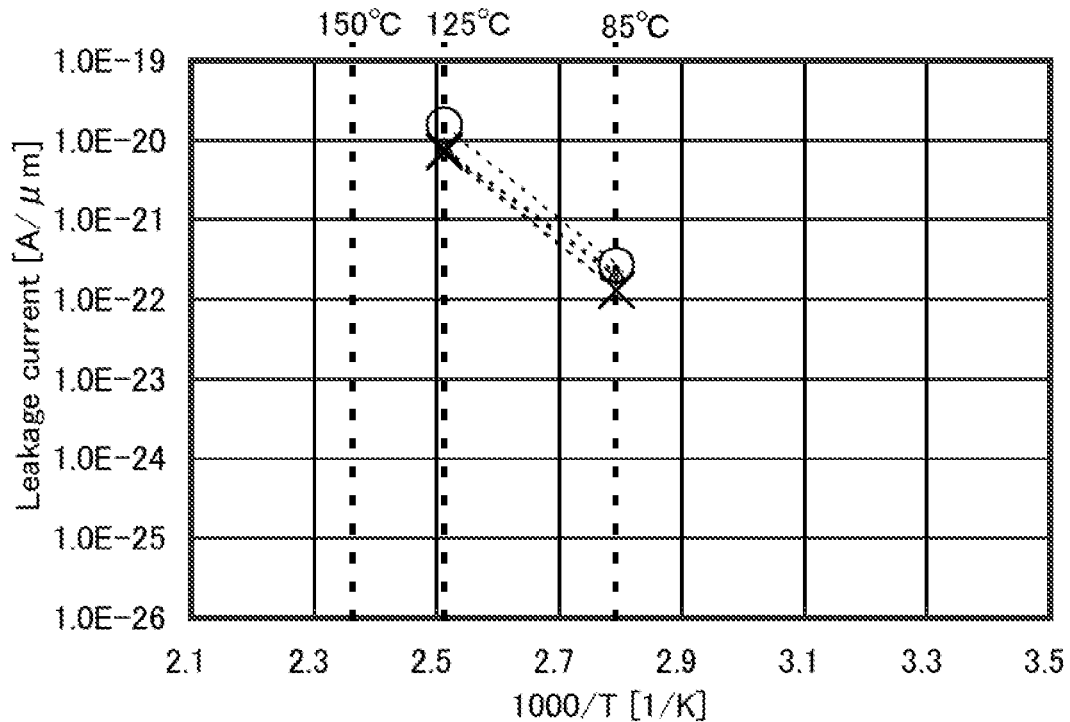

FIG. 31A shows an Arrhenius plot of the leakage current shown in FIG. 30B. Note that in FIG. 31A, a gate insulating film of a transistor is a 10 nm thick silicon oxynitride film formed by a microwave CVD method. FIG. 31B shows an Arrhenius plot of a transistor including a 20 nm thick gate insulating film (a silicon oxynitride film) formed by a CVD method using a frequency of 13.56 MHz. The vertical axis represents leakage current and the horizontal axis represents an inverse number of an absolute temperature measured.

The leakage current of the transistor manufactured under the same condition as Sample 1, which is shown in FIG. 31A, is equivalent to the leakage current of the transistor which is shown in FIG. 31B. That is, since the gate insulating film formed by microwave CVD is dense, the leakage current is not increased even when its film thickness is decreased.

This application is based on Japanese Patent Application serial no. 2012-057969 filed with Japan Patent Office on Mar. 14, 2012 and Japanese Patent Application serial no. 2012-057970 filed with Japan Patent Office on Mar. 14, 2012, the entire contents of which are hereby incorporated by reference.

What is claimed is:

1. A method for manufacturing a semiconductor device comprising the steps of:
    forming an oxide semiconductor film over a substrate having an insulating surface;
    forming an insulating film over the oxide semiconductor film so that the insulating film covers an edge portion of the oxide semiconductor film;
    exposing the insulating film and the oxide semiconductor film to plasma generated under an atmosphere containing oxygen;
    forming a gate insulating film over the oxide semiconductor film at a temperature lower than a temperature at which oxygen contained in the oxide semiconductor film is eliminated after the step of exposing the insulating film and the oxide semiconductor film to plasma;
    forming a gate electrode overlapping with the oxide semiconductor film with the gate insulating film interposed therebetween; and
    forming a source wiring and a drain wiring electrically connected the oxide semiconductor film,
    wherein the edge portion of the insulating film is curved, and
    wherein the gate insulating film is formed by using plasma generated by a microwave.

2. The method for manufacturing a semiconductor device according to claim 1, wherein, when the gate insulating film is formed, the substrate is heated at 200° C. to 400° C.

3. The method for manufacturing a semiconductor device according to claim 1, wherein, after the gate insulating film is formed, the gate insulating film is exposed by plasma generated under an atmosphere containing one or both of oxygen and nitrogen.

4. The method for manufacturing a semiconductor device according to claim 1, wherein the gate insulating film is an oxide insulating film.

5. The method for manufacturing a semiconductor device according to claim 1, wherein a dopant is introduced into the oxide semiconductor film with the gate electrode used as a mask.

6. The method for manufacturing a semiconductor device according to claim 5, wherein the dopant is one or more elements selected from a group consisting of boron, nitrogen, fluorine, aluminum, phosphorus, arsenic, indium, tin, antimony, and a rare gas element.

7. A method for manufacturing a semiconductor device comprising the steps of:
    forming an oxide semiconductor film over a substrate having an insulating surface;
    forming a first insulating film over the oxide semiconductor film so that the first insulating film covers an edge portion of the oxide semiconductor film;
    exposing the first insulating film and the oxide semiconductor film to plasma generated under an atmosphere containing oxygen;
    forming a gate insulating film over the oxide semiconductor film after the step of exposing the first insulating film and the oxide semiconductor film to plasma;
    forming a gate electrode overlapping with the oxide semiconductor film with the gate insulating film interposed therebetween;
    forming a second insulating film covering the gate electrode at a temperature lower than a temperature at which oxygen contained in the oxide semiconductor film is eliminated;
    forming a side wall insulating film in contact with a side surface of the gate electrode by etching the second insulating film; and
    forming a source wiring and a drain wiring electrically connected the oxide semiconductor film,
    wherein the edge portion of the first insulating film is curved, and
    wherein the second insulating film is formed by using plasma generated by a microwave.

8. The method for manufacturing a semiconductor device according to claim 7, wherein the gate insulating film is formed at a temperature lower than a temperature at which oxygen contained in the oxide semiconductor film is eliminated.

9. The method for manufacturing a semiconductor device according to claim 7, wherein, when the second insulating film is formed, the substrate is heated at 200° C. to 400° C.

10. The method for manufacturing a semiconductor device according to claim 7, wherein, after the second insulating film is formed, the substrate is exposed by plasma generated under an atmosphere containing one or both of oxygen and nitrogen.

11. The method for manufacturing a semiconductor device according to claim 7, wherein the second insulating film is an oxide insulating film.

12. The method for manufacturing a semiconductor device according to claim 7, wherein a dopant is introduced into the oxide semiconductor film with the gate electrode used as a mask.

13. The method for manufacturing a semiconductor device according to claim 12, wherein the dopant is one or more elements selected from a group consisting of boron, nitrogen, fluorine, aluminum, phosphorus, arsenic, indium, tin, antimony, and a rare gas element.

14. The method for manufacturing a semiconductor device according to claim 1, wherein the curved edge portion of the insulating film is formed by the step of exposing the insulating film and the oxide semiconductor film to plasma.

15. The method for manufacturing a semiconductor device according to claim 7, wherein the curved edge portion of the first insulating film is formed by the step of exposing the first insulating film and the oxide semiconductor film to plasma.

* * * * *